(12) United States Patent
Hwang et al.

(10) Patent No.: US 9,000,376 B2
(45) Date of Patent: Apr. 7, 2015

(54) DETECTION OF ELECTROMAGNETIC RADIATION USING NONLINEAR MATERIALS

(71) Applicants: Harold Y. Hwang, Cambridge, MA (US); Mengkun Liu, Boston, MA (US); Richard D. Averitt, Newton, MA (US); Keith A. Nelson, Newton, MA (US); Aaron Sternbach, Larchmont, NY (US); Kebin Fan, Watertown, MA (US)

(72) Inventors: Harold Y. Hwang, Cambridge, MA (US); Mengkun Liu, Boston, MA (US); Richard D. Averitt, Newton, MA (US); Keith A. Nelson, Newton, MA (US); Aaron Sternbach, Larchmont, NY (US); Kebin Fan, Watertown, MA (US)

(73) Assignees: Massachusettes Institute of Technology, Cambridge, MA (US); Trustees of Boston University, Boston, MA (US)

(*) Notice: Subject to any disclaimer, the term of this patent is extended or adjusted under 35 U.S.C. 154(b) by 0 days.

(21) Appl. No.: 13/933,557

(22) Filed: Jul. 2, 2013

(65) Prior Publication Data
US 2014/0061469 A1 Mar. 6, 2014

Related U.S. Application Data

(60) Provisional application No. 61/667,673, filed on Jul. 3, 2012.

(51) Int. Cl.
*G01J 5/02* (2006.01)
*G01J 5/28* (2006.01)
*G01J 5/20* (2006.01)
*H01L 31/09* (2006.01)

(52) U.S. Cl.
CPC ..... *G01J 5/28* (2013.01); *G01J 5/20* (2013.01); *H01L 31/09* (2013.01)

(58) Field of Classification Search
CPC .... G01J 5/20; G01J 5/0837; G02F 2001/0151; G02F 2202/12; G02F 2202/30; G02F 2203/15
USPC ............................................. 250/338.1–338.5
See application file for complete search history.

(56) References Cited

U.S. PATENT DOCUMENTS

| 4,264,881 A | 4/1981 | De Ronde |
| 4,600,906 A | 7/1986 | Blight |
| 5,780,916 A * | 7/1998 | Berger et al. ................. 257/471 |

(Continued)

OTHER PUBLICATIONS

Cai et al., "A Novel Terahertz Sensing Device Comprising of a Parabolic Reflective Surface and a Bi-Conical Structure." PIER 97, pp. 61-73, dated Dec. 2009.

(Continued)

*Primary Examiner* — Kiho Kim
(74) *Attorney, Agent, or Firm* — Cooley LLP

(57) ABSTRACT

An apparatus for detecting electromagnetic radiation within a target frequency range is provided. The apparatus includes a substrate and one or more resonator structures disposed on the substrate. The substrate can be a dielectric or semiconductor material. Each of the one or more resonator structures has at least one dimension that is less than the wavelength of target electromagnetic radiation within the target frequency range, and each of the resonator structures includes at least two conductive structures separated by a spacing. Charge carriers are induced in the substrate near the spacing when the resonator structures are exposed to the target electromagnetic radiation. A measure of the change in conductivity of the substrate due to the induced charge carriers provides an indication of the presence of the target electromagnetic radiation.

21 Claims, 21 Drawing Sheets

(56) References Cited

U.S. PATENT DOCUMENTS

| | | | |
|---|---|---|---|
| 7,095,027 B1* | 8/2006 | Boreman et al. | 250/338.4 |
| 7,291,839 B1* | 11/2007 | Demers et al. | 250/341.1 |
| 7,423,254 B2* | 9/2008 | Arend et al. | 250/214.1 |
| 7,681,434 B2* | 3/2010 | Ouchi | 73/31.06 |
| 7,826,504 B2* | 11/2010 | Chen et al. | 372/43.01 |
| 8,058,618 B2* | 11/2011 | Ouyang | 250/341.1 |
| 8,507,860 B2* | 8/2013 | Schubert et al. | 250/336.1 |
| 2004/0155665 A1* | 8/2004 | Arnone et al. | 324/644 |
| 2005/0093023 A1 | 5/2005 | Raspopin et al. | |
| 2006/0273255 A1* | 12/2006 | Volkov et al. | 250/336.1 |
| 2007/0222693 A1 | 9/2007 | Popa-Simil | |
| 2009/0262766 A1* | 10/2009 | Chen et al. | 372/26 |
| 2010/0079217 A1 | 4/2010 | Morton et al. | |
| 2010/0276597 A1 | 11/2010 | Ouvrier-Buffet | |
| 2012/0091342 A1 | 4/2012 | Berger et al. | |

OTHER PUBLICATIONS

International Search Report dated May 27, 2014 issued in connection with International Application No. PCT/ 13/49020.

Written Opinion issued May 27, 2014 issued in connection with International Application No. PCT/ 13/49020.

* cited by examiner

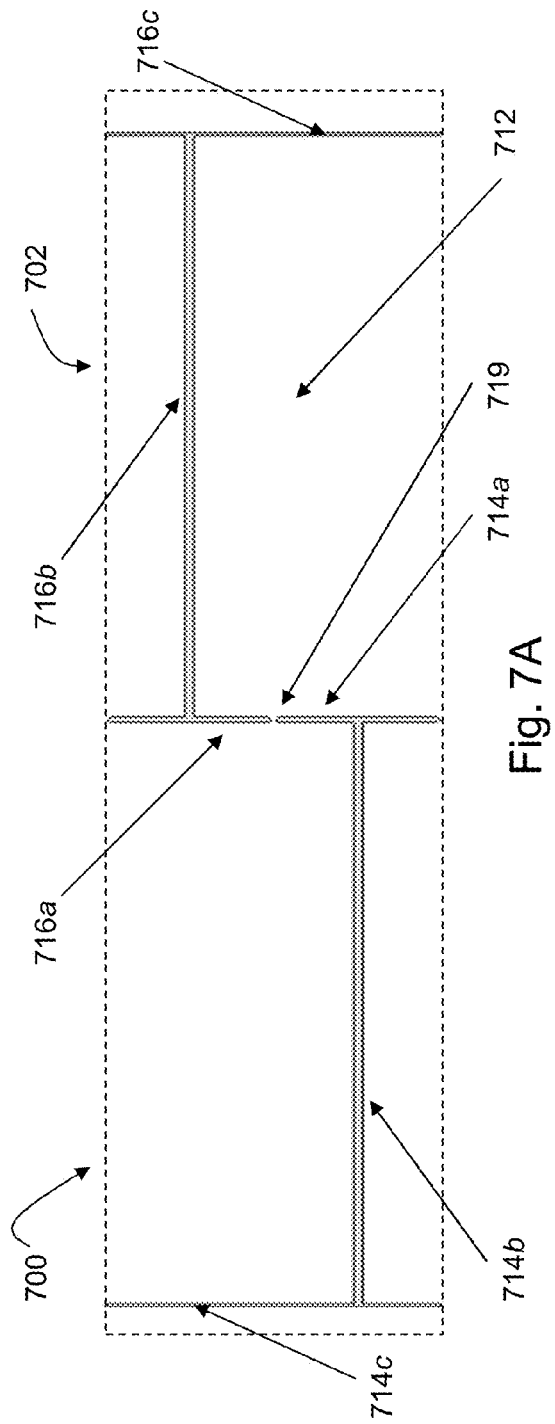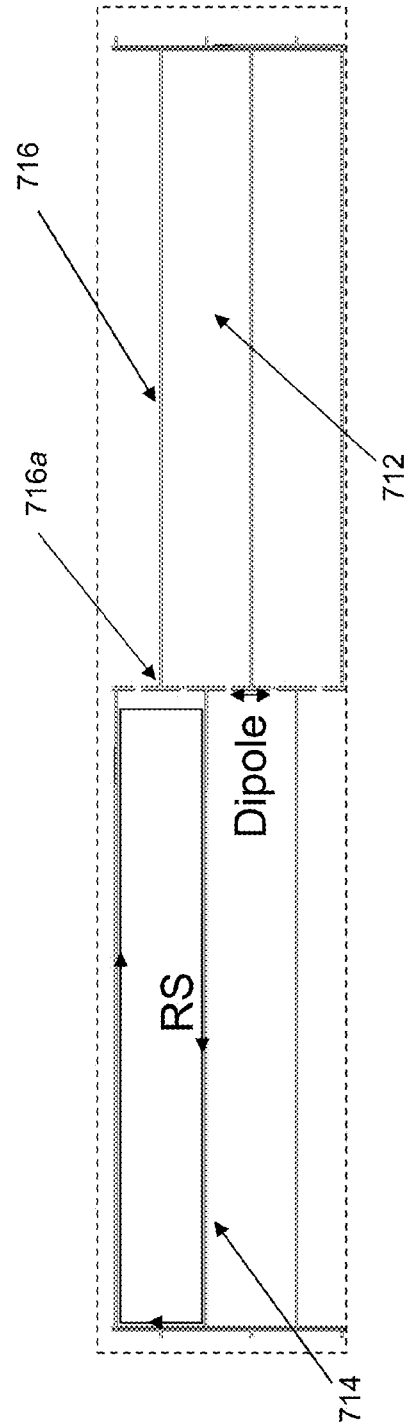
Fig. 7A
Fig. 7B

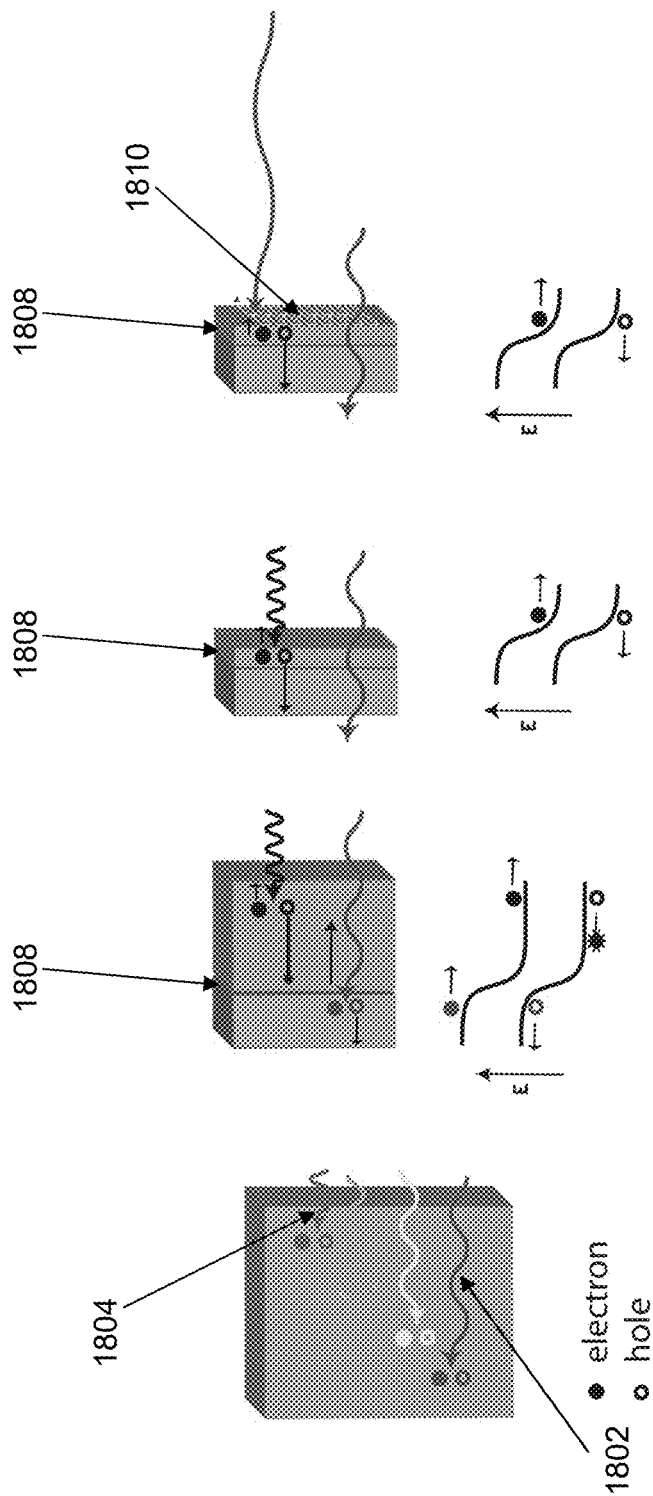

DETECTION OF ELECTROMAGNETIC RADIATION USING NONLINEAR MATERIALS

CROSS-REFERENCES TO RELATED APPLICATIONS

This application claims priority to U.S. provisional application Ser. No. 61/667,673, filed Jul. 3, 2012, entitled "DETECTION OF ELECTROMAGNETIC RADIATION USING NONLINEAR MATERIALS," which is hereby incorporated herein by reference in its entirety.

GOVERNMENT LICENSE RIGHTS

This invention was made with government support under contract no. N00014-09-1-1103 awarded by the Office of Naval Research (ONR). The government has certain rights in the invention.

BACKGROUND

Technology in the region of the electromagnetic spectrum between the infrared and microwave ranges holds tremendous promise for advances in applications such as surveillance and homeland security. Unlike other regions of the electromagnetic spectrum, development of technologies in the gigahertz and terahertz frequency ranges has been lacking due to challenges with generation and detection of electromagnetic radiation at these frequencies. Light in the gigahertz and terahertz frequency ranges is of great scientific and technological interest because several elementary physical processes give signatures in this range. Examples of such physical processes include atomic and molecular transitions and dynamics of biological molecules.

Electromagnetic radiation at gigahertz and terahertz frequency ranges can penetrate many packaging materials from a distance and identify material contained within. For example, terahertz frequencies can facilitate identification of possibly hazardous substances contained within packaging materials. Examples of such packaging materials include shipping containers, storage containers, trucking compartments, etc, that are made of non-conductive materials or sufficiently low conductivity materials.

There are also sizeable economic and social interests in improved security screening methods. Government spending on domestic security alone is estimated at around $75 billion per year. At present, the ability to effectively screen harmful substances is somewhat limited. A rapid chemically-specific screening technique would have direct impacts on the security, shipping, and travel industries. It can provide for a safer and more efficient environment across many different sectors.

Current technologies generally focus on supplying spatial information. For example, the most frequently used security technologies in airports, federal institutions, and other public arenas, are x-ray scanners and gigahertz scanners. These technologies can show images of concealed hazards (like knives and guns). However, they are able to provide little to no information about the composition of a potential hazard. Examples of those hazards include explosives, chemical agents, or biological agents. Given that x-rays can be ionizing radiation, there is also the potential for harm to living tissue.

Spectroscopic imaging in the gigahertz and terahertz frequency ranges can be used to identify both the existence of a concealed hazard and its chemical composition. In addition, it is presently believed that electromagnetic radiation in the gigahertz and terahertz frequency ranges do not cause apparent damage to living tissue.

Current terahertz or gigahertz spectroscopic imaging techniques may require time consuming scans to measure spectral and spatial information, which can make it impractical for security screening. Also, there are currently very few single element or array detectors for these frequency ranges. These include Golay cells, bolometers, and pyroelectric detectors. Each kind of detector has limitations in their ability to be useful both in a wide range of frequencies and as an array. In addition, these kinds of detectors use a thermal response to measure terahertz or gigahertz power. These detectors can be expensive (on the order of $10K to $100K) and slow (response times on the order of millisecond). While photocurrent methods have been employed for detection in the infrared and visible ranges, these photocurrent methods often depend on an above bandgap excitation to create electron-hole pairs which then generate a measureable change in the current or voltage in the device.

A spectroscopic tool that can be configured to detect and/or quantify electromagnetic radiation in the gigahertz and terahertz frequency ranges would be beneficial.

SUMMARY

In view of the foregoing, the Inventors have provided systems, methods, and apparatus that can be used for detecting or otherwise quantifying electromagnetic waves at frequencies between microwave frequencies and infrared frequencies. A local electric field enhancement in the substrate of a metamaterial structure is exploited to produce a photo-induced conductivity response in the substrate of the metamaterial structure. In an example, the photo-induced conductivity response can be correlated to the power of the incident electromagnetic radiation. The photo-induced conductivity response also can be used to quantify other properties of the electromagnetic radiation (including magnitude, spatial profile, polarization, etc.). Any of the apparatus described herein can be implemented in detectors, image sensors, or other devices or systems according to the principles described herein.

In a first example aspect, an apparatus is provided for detecting target electromagnetic radiation within a target frequency range. The apparatus includes a substrate that includes a dielectric material or a semiconductor material, and one or more resonator structures disposed on the substrate. Each of the resonator structures comprising at least two conductive structures separated by a spacing. The apparatus can be configured such that charge carriers are generated in a region of the substrate near the spacing based on an enhanced electric field induced in the spacing by a resonant response of one or more of the resonator structures to a presence of the target electromagnetic radiation. The apparatus can be configured to measure a conductivity based on the generated charge carriers. The measure of the conductivity provides an indication of the presence of the target electromagnetic radiation.

In the various examples of any of the apparatus described herein, each of the one or more resonator structures can have at least one dimension that is less than a wavelength of the target electromagnetic radiation. In other examples, each of the one or more resonator structures can have at least one dimension that is greater than or approximately equal to a wavelength of the target electromagnetic radiation.

In the various examples of any of the apparatus described herein, each of the conductive structures can have at least one dimension that is less than a wavelength of the target electromagnetic radiation. In other examples, each of the conductive structures can have at least one dimension that is greater than or approximately equal to a wavelength of the target electromagnetic radiation.

In an example of the apparatus, each of the one or more resonator structures can include a first conductive structure and a second conductive structure separated by the spacing, where a portion of the first conductive structure and a portion of the second conductive structure near the spacing are parallel to each other.

In an example of the apparatus, each of the one or more resonator structures is formed as a split-ring resonator structure, and each split-ring resonator structure can include at least two spacings formed between corresponding pairs of the at least two conductive structures.

In an example of the apparatus, the one or more resonator structures can be arranged in an alternating interdigitated arrangement such that a portion of a first resonator structure of the one or more resonator structures is disposed within a spacing of, and not in physical contact with, a second resonator structure of the one or more resonator structures, where the portion of the first resonator structure is oriented in a direction parallel to a side of the second resonator structure neighboring the spacing.

In an example of the apparatus, the one or more resonator structures can be configured such that the apparatus detects target electromagnetic radiation of different polarizations. In an aspect according to this example, each of the at least two conductive structures can be configured in a wedge morphology. In an aspect according to this example, the one or more resonator structures can each include at least four conductive structures formed in a cross pattern separated by the spacing.

In an example of the apparatus, the one or more resonator structures can each include a first conductive structure and a second conductive structure disposed on the substrate. A surface of the substrate that includes the first conductive structure and a second conductive structure lies in an y-z plane. The first conductive structure and the second conductive structure are aligned in a longitudinal antenna arrangement along a z-direction of the substrate, and the spacing separates an end of the first conductive structure from an end of the second conductive structure in the z-direction.

In the various examples of any of the apparatus described herein, the target frequency range can range from about 100 GHz to about 100 THz.

In the various examples of any of the apparatus described herein, the width of the spacing can be about 1.0 microns, about 1.5 microns, about 2.0 microns, or about 2.5 microns. The resonator structure can have a lateral dimension ranging from about 3.0 μm to about 3.0 mm.

In the various examples of any of the apparatus described herein, the conductive structure can include a metal or a conductive metal oxide. For example, the conductive structure can include gold, platinum copper, tantalum, tin, tungsten, titanium, tungsten, cobalt, chromium, silver, nickel or aluminum, or any combination thereof.

In the various examples of any of the apparatus described herein, the substrate can include a dielectric material. In an example, the dielectric material can include silicon, germanium, or a transition metal. In an example, the dielectric material can include a transition metal, where the transition metal is Ti, V, Cr, Mn, Fe, Co, Ni, Cu, Ru, Hf, Ta, Zr, or any combination thereof. In an example, the dielectric material can include $VO_2$ or $(V_{1-x}Ti_x)_2O_3$. in another example, the dielectric material can include an oxide, a phosphate, or a silicate, of a transition metal.

In the various examples of any of the apparatus described herein, the substrate can include a semiconductor material. The semiconductor material can include silicon, germanium, or a III-V semiconductor. In an example, the semiconductor material can include GaAs, InAs, InGaAs, InP, AlSb or InSb.

In the various examples of any of the apparatus described herein, the measure of the conductivity is a voltage measurement or a current measurement. In an example, the measure of the conductivity provides an indication of the presence of the target electromagnetic radiation if the measure of the conductivity exceeds a pre-determined threshold value. In an example, the measure of the conductivity provides an indication of a magnitude, a polarization, or a spatial profile of the target electromagnetic radiation.

In a second example aspect, an apparatus for detecting target electromagnetic radiation within a target frequency range is provided that includes a substrate comprising a dielectric material or a semiconductor material, and a first conductive structure and a second conductive structure disposed on the substrate. A spacing separates a first end of the first conductive structure from a first end of the second conductive structure. The first conductive structure and the second conductive structure are configured such that the apparatus detects the target electromagnetic radiation of different polarizations. In an example according to this aspect, the first conductive structure and the second conductive structure can each be configured in a wedge morphology. In another example according to this aspect, the apparatus can further include a third conductive structure and a fourth conductive structure disposed on the substrate, where the first conductive structure, the second conductive structure, the third conductive structure, and the fourth conductive structure are formed in a cross pattern separated by the spacing. In another example according to this aspect, the first end of the first conductive structure and the first end of the second conductive structure near the spacing can each be configured in a dual prong morphology. In another example according to this aspect, the apparatus can further include a first electrode disposed on the substrate and in electrical communication with an end of the first conductive structure at a position away from the spacing, and a second electrode disposed on the substrate and in electrical communication with an end of the second conductive structure at a position away from the spacing. The apparatus can be configured such that charge carriers are generated in a region of the substrate near the spacing based on an enhanced electric field induced in the spacing by a resonant response of the first conductive structure and the second conductive structure to a presence of the target electromagnetic radiation having the different polarizations, where the apparatus is configured to measure, using the first electrode and the second electrode, a conductivity based on the generated charge carriers as an indication of the presence of the target electromagnetic radiation.

A detector, image sensor, or other device or system according to principles herein can include a plurality of any of the apparatus described herein. The conductive structures can be disposed on a first surface of the substrate, and the substrate can include a charge separation region. The apparatus can be illuminated by target electromagnetic radiation at a second surface of the substrate opposite to the first surface, and the charge carriers that are generated are electron-hole pairs. The thickness of the substrate is configured such that the electron-hole pairs formed in the charge separation region when the image sensor is illuminated by the target electromagnetic radiation are measured to provide an indication of a presence of the target electromagnetic radiation.

In a third example aspect, an apparatus for detecting target electromagnetic radiation within a target frequency range is provided that includes a substrate comprising a dielectric material or a semiconductor material, and a first resonator structure and a coupling dipole structure disposed on the substrate. A portion of the first coupling structure is disposed within a spacing of the first resonator structure, where the first coupling structure is not in physical contact with the first resonator structure. In an example according to this aspect, the apparatus can be configured such that charge carriers are generated in a region of the substrate near the spacing based on an enhanced electric field induced in the spacing by a resonant response of the resonator structure to a presence of the target electromagnetic radiation having the different polarizations. The apparatus can be configured to measure the conductivity based on the generated charge carriers as an indication of a presence of the target electromagnetic radiation, and the measure of the conductivity can be a voltage measurement or a current measurement. In an example according to this aspect, the measure of the conductivity provides an indication of the presence of the target electromagnetic radiation if the measure of the conductivity exceeds a pre-determined threshold value. In an example according to this aspect, the measure of the conductivity provides an indication of a magnitude, a polarization, or a spatial profile of the target electromagnetic radiation.

Another example detector, image sensor, or other device or system according to principles herein can include a plurality of any of the apparatus according to this aspect. A plurality of the first resonator structures and the first dipole structures can be disposed on a first surface of the substrate; where the substrate can include a charge separation region. The apparatus can be illuminated by target electromagnetic radiation at a second surface of the substrate opposite to the first surface, and the charge carriers that are generated in the substrate by a resonant response of the plurality of the first resonator structures and the first dipole structures to a presence of the target electromagnetic radiation. The thickness of the substrate is configured such that the electron-hole pairs formed in the charge separation region when the image sensor is illuminated by target electromagnetic radiation are measured to provide an indication of the presence of the target electromagnetic radiation. In an example, the charge separation region can be a depletion region at an interface within the substrate. In an example, the substrate can be back-thinned, where the back-thinning of the substrate causes the electron-hole pairs generated by the target electromagnetic radiation to be formed in the charge separation region, and where a potential in the charge separation region separates the electron-hole pairs, thereby facilitating measurement of the charge carriers to provide an indication of the presence of the target electromagnetic radiation.

In a fourth example aspect, an apparatus for detecting electromagnetic radiation within a target frequency range is provided that includes a substrate comprising a dielectric material or a semiconductor material, where a surface of the substrate lies in an y-z plane. A first conductive structure and a second conductive structure are disposed on the substrate, where the first conductive structure and the second conductive structure are aligned in a longitudinal antenna arrangement along a z-direction of the substrate. A spacing separates an end of the first conductive structure from an end of the second conductive structure in the z-direction, where the target electromagnetic radiation is of a frequency within the target frequency range. The apparatus also includes a first electrode and a second electrode disposed on the substrate, where the first electrode is in electrical communication with an end of the first conductive structure at a position away from the spacing, and where the second electrode is in electrical communication with an end of the second conductive structure at a position away from the spacing. An example apparatus according to this aspect can further include at least one additional conductive structure disposed on the substrate, where the at least one additional conductive structure is positioned between and spaced apart from the first conductive structure and the second conductive structure in the longitudinal antenna arrangement along the z-direction of the substrate, and where each the at least one additional conductive structure is spaced apart from the other of the at least one additional conductive structure in the longitudinal antenna arrangement.

Another example detector, image sensor, or other device or system according to principles herein can include a plurality of any of the apparatus described herein. The apparatus can be configured for generating a resonant response with alternating charge accumulation in response to a presence of the target electromagnetic radiation, where the detector detects an amplitude of the target electromagnetic radiation based on a measurement of an amount the charge accumulation. In an example, the detector, image sensor, or other device or system can be used to detect a spatial profile of the target electromagnetic radiation based on the measurement.

In a fifth example aspect, an apparatus for detecting electromagnetic radiation within a target frequency range includes a substrate that includes a dielectric material or a semiconductor material, where a surface of the substrate lies in an y-z plane, at least two conductive structures disposed on the substrate, and at least two electrodes. The at least two conductive structures are aligned in a longitudinal antenna arrangement along a z-direction of the substrate, where a spacing separates an end of one of the at least two conductive structures from another of the at least two conductive structures in the z-direction, and where the target electromagnetic radiation is of a frequency within the target frequency range. Each of the at least two electrodes is in electrical communication with an end of a respective one of the at least two conductive structures at a position away from the spacing. An example apparatus according to this aspect can further include at least four conductive structures disposed on the substrate and at least four electrodes. Each conductive structure of a first pair of the at least four conductive structures can have a first length that targets electromagnetic radiation of a first frequency within the target frequency range, where the first pair of the at least four conductive structures are aligned and spaced apart in a longitudinal antenna arrangement along the z-direction of the substrate. Each of a first pair of the at least four electrodes is in electrical communication with an end of a respective one of the first pair of the at least four conductive structures at a position away from the spacing. Each conductive structure of a second pair of the at least four conductive structures can have a second length that is less than the first length, where the second pair of the at least four conductive structures targets electromagnetic radiation of a second frequency within the target frequency range. The second pair of the at least four conductive structures can be aligned in a longitudinal antenna arrangement along the z-direction of the substrate. Each of a second pair of the at least four electrodes is in electrical communication with an end of a respective one of the second pair of the at least four conductive structures at a position away from the spacing. The second frequency is greater than the first frequency.

Another example detector, image sensor, or other device or system according to principles herein can include a plurality of any of the apparatus according to this aspect. The apparatus can be configured for generating a resonant response with alternating charge accumulation in response to a presence of target electromagnetic radiation. The example detector, image sensor, or other device or system can be used to detect an amplitude of target electromagnetic radiation based on a measurement of an amount the charge accumulation. The example detector, image sensor, or other device or system can be used to detect a spatial profile of the target electromagnetic radiation based on the measurement.

Another example detector, image sensor, or other device or system according to principles herein can include a plurality of sensor elements, where each sensor element can include a substrate that includes a semiconductor material or a dielectric material, and one or more resonator structures disposed on a surface of the substrate. Each of the resonator structures can include at least two conductive structures separated by a spacing, where the substrate can include a depletion region. The sensor elements can be configured such that charge carriers are generated in a region of the substrate near the spacing based on an enhanced electric field induced in the spacing by a resonant response of one or more of the resonator structures to a presence of target electromagnetic radiation. The thickness of the substrate can be configured such that charge carriers are generated in the depletion region when the image sensor is illuminated by the target electromagnetic radiation, where the image sensor is configured to measure a conductivity based on the generated charge carriers as an indication of the presence of the target electromagnetic radiation. In an example, each of the one or more resonator structures can have at least one dimension that is less than a wavelength of the target electromagnetic radiation. In another example, each of the one or more resonator structures can have at least one dimension that is greater than or approximately equal to a wavelength of the target electromagnetic radiation.

Another example detector, image sensor, or other device or system according to principles herein can include a plurality of sensor elements, where each sensor elements can include a substrate and one or more resonator structures disposed over a first surface of the substrate. Each of the resonator structures can include at least two conductive structures separated by a spacing. The substrate can include a depletion region. The sensor elements can be configured such that charge carriers are generated in a region of the substrate near the spacing based on an enhanced electric field induced in the spacing by a resonant response of one or more of the resonator structures to a presence of target electromagnetic radiation. The thickness of the substrate can be configured such that charge carriers are generated in the depletion region when the image sensor is illuminated by the target electromagnetic radiation. The example detector, image sensor, or other device or system can be configured to measure a conductivity based on the generated charge carriers as an indication of the presence of the target electromagnetic radiation. In an example, each of the one or more resonator structures can have at least one dimension that is less than a wavelength of the target electromagnetic radiation. In an example, each of the one or more resonator structures can have at least one dimension that is greater than or approximately equal to a wavelength of the target electromagnetic radiation.

In example detectors, image sensors, or other devices or systems according to principles herein, each of the one or more resonator structures can include a first conductive structure and a second conductive structure separated by the spacing, where a portion of the first conductive structure and a portion of the second conductive structure near the spacing are parallel to each other.

In other example detectors, image sensors, or other devices or systems according to principles herein, each of the one or more resonator structures can be formed as a split-ring resonator structure, where each split-ring resonator structure includes at least two spacings formed between corresponding pairs of the at least two conductive structures.

In other example detectors, image sensors, or other devices or systems according to principles herein, the one or more resonator structures can be arranged in an alternating inter-digitated arrangement such that a portion of a first resonator structure of the one or more resonator structures is disposed within a spacing of, and not in physical contact with, a second resonator structure of the one or more resonator structures, where the portion of the first resonator structure is oriented in a direction parallel to a side of the second resonator structure neighboring the spacing.

In other example detectors, image sensors, or other devices or systems according to principles herein, the one or more resonator structures can be configured such that the apparatus detects target electromagnetic radiation of different polarizations. In an example, each of the at least two conductive structures is configured in a wedge morphology. In an example, the one or more resonator structures each can include at least four conductive structures formed in a cross pattern separated by the spacing.

In other example detectors, image sensors, or other devices or systems according to principles herein, the one or more resonator structures each can include a first conductive structure and a second conductive structure disposed on the substrate. A surface of the substrate that includes the first conductive structure and a second conductive structure lies in an y-z plane, where the first conductive structure and the second conductive structure are aligned in a longitudinal antenna arrangement along a z-direction of the substrate and the spacing separates an end of the first conductive structure from an end of the second conductive structure in the z-direction.

In a fifth example aspect, an apparatus is provided for detecting target electromagnetic radiation within a target frequency range that includes a substrate including a dielectric material or a semiconductor material, and a first resonator structure and a coupling dipole structure disposed on the substrate. A portion of the first coupling structure is disposed within a spacing of the first resonator structure, where the first coupling structure is not in physical contact with the first resonator structure. In an example, each of the first resonator structure and the first coupling structure is of a size less than a wavelength of the target electromagnetic radiation. In an example, each of the first resonator structure and the first coupling structure is of a size greater than or approximately equal to a wavelength of the target electromagnetic radiation. In an example, the portion of the first coupling structure disposed within the spacing is oriented in a direction perpendicular to a portion of the resonator structure neighboring the spacing.

Methods for detecting a polarization of target electromagnetic radiation within a target frequency range are also provided.

In an example aspect, a method can include exposing a plurality of sensor elements of an image sensor to an incident beam of electromagnetic radiation, and measuring a change in conductivity of the substrate of the one or more rotated sensor elements based on the generated charge carriers. Each sensor element can include a substrate including a dielectric material or a semiconductor material, and one or more resonator structures disposed on the substrate, each of the resonator structures including at least two conductive structures separated by a spacing. Each sensor element can be configured such that charge carriers are generated in a region of the substrate near the spacing based on an enhanced electric field induced in the spacing by a resonant response of one or more of the resonator structures to a presence of the target electromagnetic radiation. The measure of the change in conductivity can be used to provide an indication of the presence of the target electromagnetic radiation in the incident beam of electromagnetic radiation. In an example, each of the one or more resonator structures can have at least one dimension that is less than a wavelength of the target electromagnetic radiation. In an example, each of the one or more resonator structures can have at least one dimension that is greater than or approximately equal to a wavelength of the target electromagnetic radiation. The method of claim 102, further comprising rotating one or more sensor elements of the plurality of sensor elements, where the measure of the change in conductivity of the substrate of the one or more rotated sensor elements provides an indication of the polarization of the target electromagnetic radiation.

In an example of the method, the measure of the change in the conductivity can be used to provide the indication of the polarization of the target electromagnetic radiation if it exceeds a pre-determined threshold conductivity value.

In another example of the method, the one or more of the resonator structures can have a wedge morphology or a cross pattern.

In an example, a detector, image sensor, or other device or system according to principles herein can include an array including a plurality of sensor elements for detecting target electromagnetic radiation within a target frequency range. Each sensor element can include a substrate including a dielectric material or a semiconductor material and one or more resonator structures disposed on the substrate. Each of the resonator structures can include at least two conductive structures separated by a spacing, where the refractive index of the substrate of at least one of the sensor elements of the array differs from the refractive index of the substrate of other sensor elements of the array. The apparatus can be configured such that charge carriers are generated in a region of the substrate near the spacing based on an enhanced electric field induced in the spacing by a resonant response of one or more of the resonator structures to a presence of the target electromagnetic radiation. The apparatus can be configured to measure a conductivity based on the generated charge carriers. The measure of the conductivity can be used to provide an indication of the presence of the target electromagnetic radiation. In an example, each of the one or more resonator structures can have at least one dimension that is less than a wavelength of the target electromagnetic radiation. In an example, each of the one or more resonator structures can have at least one dimension that is greater than or approximately equal to a wavelength of the target electromagnetic radiation.

In an example, a detector, image sensor, or other device or system according to principles herein can include an array including a plurality of sensor elements for detecting target electromagnetic radiation within a target frequency range. Each sensor element can include a substrate including a dielectric material or a semiconductor material, and one or more resonator structures disposed on the substrate. Each of the resonator structures can include at least two conductive structures separated by a spacing. The dimensions of the one or more resonator structures of at least one of the sensor elements of the array can differ from the dimensions of the one or more resonator structures of other sensor elements of the array. The apparatus can be configured such that charge carriers are generated in a region of the substrate near the spacing based on an enhanced electric field induced in the spacing by a resonant response of one or more of the resonator structures to a presence of the target electromagnetic radiation. The apparatus can be configured to measure a conductivity based on the generated charge carriers. The measure of the conductivity can be used to provide an indication of the presence of the target electromagnetic radiation. In an example, each of the one or more resonator structures can have at least one dimension that is less than a wavelength of the target electromagnetic radiation. In an example, each of the one or more resonator structures can have at least one dimension that is greater than or approximately equal to a wavelength of the target electromagnetic radiation.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 7A and 7B show example arrays of detector elements with interdigitated resonator structures, according to principles of the present disclosure.

FIGS. 18A-18D illustrates a schematic of absorption of photons in a sensor element, according to principles of the present disclosure.

DETAILED DESCRIPTION

Following below are more detailed descriptions of various concepts related to, and embodiments of, inventive methods, apparatus, and systems for detecting or otherwise quantifying electromagnetic radiation of frequency on the order of gigahertz and/or terahertz frequencies, and detectors, image sensors, and other devices based thereon. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

As used herein, the term "includes" means includes but is not limited to, the term "including" means including but not limited to. The term "based on" means based at least in part on.

With respect to substrates or other surfaces described herein in connection with various examples of the principles herein, any references to "top" surface and "bottom" surface are used primarily to indicate relative position, alignment and/or orientation of various elements/components with respect to the substrate and each other, and these terms do not necessarily indicate any particular frame of reference (e.g., a gravitational frame of reference). Thus, reference to a "bottom surface of a substrate" does not necessarily require that the indicated surface be facing a ground surface. Similarly, terms such as "over," "under," "above," "beneath" and the like do not necessarily indicate any particular frame of reference, such as a gravitational frame of reference, but rather are used primarily to indicate relative position, alignment and/or orientation of various elements/components with respect to the substrate (or other surface) and each other. The terms "disposed on" and "disposed over" encompass the meaning of "embedded in," including "partially embedded in." In addition, reference to feature A being "disposed on" or "disposed over" feature B encompasses examples where feature A is in contact with feature B, as well as examples where other layers and/or other components are positioned between feature A and feature B.

Figure 1:
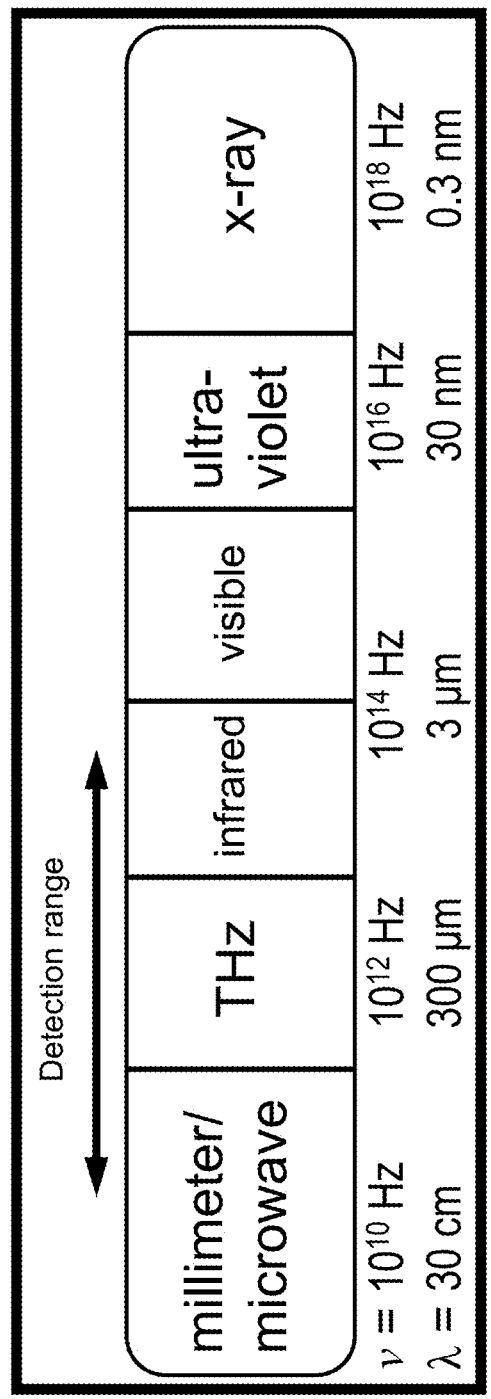
FIG. 1 illustrates the electromagnetic spectrum from the microwave and millimeter wave region to x-ray frequencies.

Systems, apparatus and methods described herein can be used for detecting electromagnetic waves at frequencies between millimeter/microwave frequencies and infrared (IR) frequencies. For example, systems, apparatus and methods described herein can be used for detecting electromagnetic waves at frequencies in the gigahertz and terahertz frequency ranges. As a non-limiting example, systems, apparatus and methods described herein can be used for detecting target electromagnetic waves at frequencies ranging from about 100 GHz to about 100 THz. This region is referred to collectively herein as the "detection range" of the electromagnetic spectrum. An example of the detection range is illustrated in the non-limiting example electromagnetic spectrum of FIG. 1. In other examples, the detection range may encompass frequencies somewhat lower than about 100 GHz and/or frequencies somewhat higher than about 100 THz. Electromagnetic radiation with frequencies in the detection range have wavelengths in a vacuum that range from about 3.0 μm to about 3.0 mm.

A system, apparatus and method herein exploit the measurable changes in the conductivity (i.e., current and/or voltage) in a device according to principles herein for detecting or otherwise quantifying electromagnetic radiation at frequencies in the detection range. In an example, the detection is facilitated by exploiting below bandgap excitation at terahertz frequencies or above bandgap excitation at frequencies in the IR.

An example apparatus, detector, image sensor, or other device or system according to principles herein are comprised of one or more detector elements. Each detector element is based on materials that exhibit non-linear excitations in the gigahertz and terahertz frequency ranges. In an example, the detector elements can be based on metamaterials that are configured to resonate with electromagnetic radiation in the gigahertz and terahertz frequency ranges. In a non-limiting example, the metamaterial is formed from one or more resonator structures disposed on a substrate. The detector elements herein exploit the Inventors' observation that light at frequencies in the detection range can be used to modify the properties of metamaterial-based devices according to the principles described herein.

In an example, an apparatus, detector, image sensor, or other device or system according to principles herein can be used to detect or otherwise quantify electromagnetic radiation at a frequency in the detection range based on local changes in the conductivity induced in the substrate of the metamaterial structures according to principles herein. The local change in conductivity can be induced when the metamaterial structures resonate with electromagnetic radiation in the gigahertz and terahertz frequency ranges. In an example, the substrate of the metamaterial can be a dielectric, and the local change in the conductivity can based on an electric field-induced insulator-to-metal phase transition in the dielectric. As a non-limiting example, the dielectric material can be an oxide, including an oxide of silicon or a transition metal oxide, such as but not limited to $VO_2$. In an example, the substrate of the metamaterial can be a semiconductor, and the local change in the conductivity can based on impact ionization in the semiconductor. As non-limiting examples, a lower bandgap semiconductor, such as but not limited to indium antimonide (InSb) or indium arsenide (InAs), can be used to generate charge carriers (e.g., electron-hole pairs) according to the principles described herein. In other non-limiting examples, a higher bandgap semiconductor, such as but not limited to indium phosphide (InP), gallium arsenide (GaAs) and aluminum antimonide (AlSb), can be used to generate charge carriers according to the principles described herein. A substrate of a metamaterial structure according to the principles herein, including a semiconductor substrate, can be undoped or can be doped with n-type or p-type dopants such that its conductivity varies from more insulating (e.g., about $10^7/cm^3$ carrier density or less) to more conductive (e.g., about $10^{16}/cm^3$ carrier density or more), including values of carrier density within the range from about $10^7/cm^3$ to about $10^{16}/cm^3$. As a non-limiting example, the substrate can be n-type doped GaAs (e.g., GaAs doped with Si). The metamaterial structures according to principles herein can be used to facilitate sub-wavelength field enhancement that drive the nonlinear response locally.

A resonator structure according to principles herein is formed from at least two conductive structures separated by a spacing. While a metamaterial structure herein is described as including one or more resonator structure disposed on a surface of a substrate, the metamaterial can include other components, including one or more coupling structures and/or other active components.

When a resonator structure according to principles herein is irradiated by electromagnetic radiation of a frequency in the detection range, the local electric field enhancement in the vicinity of the at least one spacing in the resonator structure can induce a local change in the conductivity of the substrate in the vicinity of the spacing. In effect, the resonator structures according to the principles herein are configured to act as local resonant field concentrators. The enhanced electric field inside the spacing (approximated as a capacitive gap) can be enhanced by an order of magnitude or more. In some example configurations, the resonator structures can be modeled as inductor-capacitor (LC) circuits with the spacing being approximated as the capacitive gap. The substrate performs the dual functions of facilitating the electric field enhancement that drives the nonlinear response locally and facilitating global sensitivity to the localized conductivity change that enables measurement. As a non-limiting example, the local conductivity can change by at least an order of magnitude or more. For example, in a metamaterial based on a $VO_2$ substrate, the local electric field enhancement can induce a change in the local conductivity by about two orders of magnitude or more at the spacing of the resonator structure. For an example metamaterial based on a semiconductor substrate, such as but not limited to a silicon, GaAs, InGaAs, InAs, InP, or InSb substrate, the conductivity change can be up to about ten orders of magnitude or more at the spacing of the resonator structure.

The response time of the substrate to the local electric field enhancement, whether for an insulator-to-metal phase transition in a dielectric substrate or impact ionization in a semiconductor substrate, can be sufficiently long enough such that the transient large change in photo-conductivity can be measured or otherwise quantified. As a non-limiting example, for a dielectric substrate of $VO_2$, the response times can be over 100 ps to possibly several nanosecond long. As another non-limiting example, for a semiconductor substrate of InSb, the response times also can be in excess of 100 ps to possibly several nanoseconds long. In an example, the change in photo-induced conductivity in the resonator structure may be measured or otherwise quantified using electrodes in electrical communication with the resonator structure. In another example, the photo-induced conductivity in the resonator structure may be measured or otherwise quantified using integrated circuitry coupled to the substrate on which the resonator structure is disposed.

According to an example apparatus, a detector, image sensor, or other device or system according to principles herein can include at least one detector element that is configured such that charge carriers are generated in the region of the substrate near the spacing between the conductive structures of the resonator structure. The charge carriers can be generated based on an enhanced electric field induced in the spacing by a resonant response of the one or more resonator structures to the presence of target electromagnetic radiation. The apparatus can be configured to measure a change in conductivity based on the generated charge carriers. In an example, the change in conductivity lasts sufficiently long that it can be measured. For example, such a measurement can be made with high bandwidth amplifier electronics. The measure of the current can be used to provide an indication of the presence of the target electromagnetic radiation.

The change in conductivity of the detector element can be measured using electrodes in electrical communication with (or otherwise electrically coupled to) at least one of the resonator structures, or using readout circuitry associated with the detector element. The measured conductivity in the presence of the target electromagnetic radiation can be compared to the measured conductivity in the absence of the target electromagnetic radiation. A change in the measured conductivity can be indicative of the presence of the target electromagnetic radiation, or otherwise quantify a property of the target electromagnetic radiation (including magnitude, spatial profile, polarization, etc.). In an example, the change in conductivity can be measured using high bandwidth amplifier electronics.

In some non-limiting examples, at least one feature size or dimension of the resonator structures disposed on the substrate can be configured to be smaller than the wavelength of the target electromagnetic radiation or the half-wavelength of the target electromagnetic radiation.

In some non-limiting examples, at least one feature size or dimension can be greater than or approximately equal to the half-wavelength of the target electromagnetic radiation. A detector, image sensor, or other device or system that includes resonator structures with feature sizes greater than or approximately equal to the half-wavelength of the target electromagnetic radiation can be used for resonating higher order modes of the resonator structure with the target electromagnetic radiation.

In some examples, a resonator structure can be modeled as an individual inductor-capacitor (LC) circuit with resonant frequency, $\omega_0 \sim (LC)^{-1/2}$. The resonator structure can be modeled as a distributed inductance (L) and a distributed capacitance (C) arising from charge build-up at the spacing. The materials of the conductive structures and the dimensions of the resonator structures set the parameters L and C, and determine the resonant frequency of the metamaterial structure, i.e., the target electromagnetic frequency or range of frequencies that resonate with the metamaterial structure.

In an example, the target electromagnetic frequency (or range of frequencies) that resonates with the metamaterial structures according to principles herein can be changed (i.e., tuned) by changing the materials of the conductive structures that form the resonator structures.

In another example, the target electromagnetic frequency (or range of frequencies) that resonates with the metamaterial structures according to principles herein can be changed (i.e., tuned) by changing the dimensions of the conductive structures that form the resonator structures.

In another example, the resonance of the metamaterial structure can be scale-invariant for a given choice of materials of the conductive structures and morphology of the resonator structures. That is, the target electromagnetic frequency (or range of frequencies) that resonates with the metamaterial structure according to principles herein can be changed (i.e., tuned) by scaling-up (for lower resonance frequencies) or scaling-down (for higher resonance frequencies) the dimensions of the one or more resonator structures. In various examples, the metamaterial structures according to the principles herein can be configured through up-conversion or down-conversion to resonate with frequencies outside the detection range, i.e., from visible wavelengths through millimeter wavelengths. In an example according to this principle, an array of detector elements that include resonator structures at different scales can be used to detect or otherwise quantify electromagnetic radiation at differing frequencies. In an example according to this principle, the array of detector elements can be spatially arranged such that differing regions of the array resonate with electromagnetic radiation of differing frequencies.

The metamaterial-based detector elements in the detection range described herein have direct application in the field of spectroscopy in the gigahertz and terahertz frequency ranges. The detector elements herein and devices that include them can facilitate reducing the response time as compared to devices that rely on a thermal response of a material for detection. The detectors herein also can be more sensitive than devices that rely on a thermal response for detection. The principle of operation of the detectors herein lends itself to array detection and could provide a better way to image the spatial profile of electromagnetic radiation in the detection range.

Image sensors may be formed based on any of the detector elements according to the principles described herein. The image sensors can be configured as back-thinned devices. In an example, a back-thinned device that includes one or more detector elements according to principles described herein can be sensitive to longer wavelengths of light. In operation of a back-thinned device, the concentration of the THz to IR field in a portion of the detector element liberates electrons near a surface of the back-thinned substrate. Where the back-thinned device includes a depletion region near the substrate surface, electron-hole pairs formed in the depletion region can be collected efficiently. As a result, the back-thinned devices provided herein can be highly efficient.

A detector or other device that includes a detector element according to any of the examples described herein can be both fast and sensitive. The detection is based on the generation of charge carriers according to principles of any of the examples herein and their subsequent relaxation, which can be on the order of nanosecond timescales. Fabrication costs for the metamaterial structures herein may be low since lower cost methods may be used, including photolithographic methods.

A detector according to principles herein could possibly perform over an order of magnitude faster than a detector based on a thermal response.

Detector Elements and Sensor Elements

An apparatus, detector, image sensor, or other device or system according to principles herein is based on an assembly of one or more detector elements. Each detector element includes a substrate having at least one resonator structure disposed in its surface. In an example, the detector elements can be configured as an array of resonator structures disposed on a surface of a substrate. Non-limiting examples of applicable resonator structures or arrays that include resonator structures according to principles herein are shown in FIGS. 2A to 13A, 14A, 15A and 15B.

Other resonator structures in the art are also applicable to the detector elements described herein. Such resonator structures could be implemented in certain of the apparatus, detectors, image sensors, and other devices and systems according to principles herein, based in assemblies of one or more detector elements.

Applicable resonator structures according to principles herein are formed from at least two conductive structures separated by a spacing. The conductive structures can have various morphologies. For example, the conductive structures can be configured in a wedge morphology or disposed in a cross pattern. In an example, the portions of the conductive structures near the spacing can be configured in a wedge morphology or in a dual prong morphology. In another example, the portions of the first conductive structures in the vicinity of the spacing can be disposed substantially parallel to each other. In another example, the resonator structure can be coupled with a coupling structure, where a portion of the coupling structure is disposed in the spacing of the resonator structure. In another example, the resonator structure can be formed from at least two conductive structures oriented in an antenna arrangement such that they are spaced apart on the surface by a spacing. In another example, the resonator structure can be a split-ring resonator structure. In an example, any resonator structure according to principles herein can be disposed in a pixel pattern on a surface of a dielectric or semiconductor to provide the metamaterial structure.

In an example, a dimension of the resonator structure is less than a wavelength of the target electromagnetic radiation. For example, a length of the resonator structures can be less than about 3.0 mm. In another example, a lateral dimension of the resonator structure on a surface can be less than about 3.0 µm. In another example, a lateral dimension of the resonator structure on a surface can range from about 3.0 µm to about 3.0 mm.

The dimensions of the resonator structures can be configured to be less than a wavelength of the target electromagnetic radiation (i.e., ranging from about 3.0 µm to about 3.0 mm) such that the metamaterial structure resonates with the target electromagnetic radiation. In an example, the dimensions of each of the conductive structures are configured to be less than a half of the wavelength of the target electromagnetic radiation. In an example, the dimensions of each of the conductive structures are configured to be less than a half of the wavelength of the target electromagnetic radiation reduced by a factor that depends on the effective refractive index of the substrate of the metamaterial. For example, for a resonator structure intended to resonate with target electromagnetic radiation of wavelength ($\lambda_t$), a dimension (l) of conductive structures of the resonator structure can be determined according to the expression: $l < \lambda_t / 2 \cdot n_{eff}$, where $n_{eff}$ represents the effective refractive index of the substrate material.

In some non-limiting examples, the dimensions of the resonator structures can be configured to be greater than or approximately equal to a wavelength of the target electromagnetic radiation (i.e., ranging from about 3.0 μm to about 3.0 mm) such that the target electromagnetic radiation resonates with higher order modes of the resonator structure.

In an example, the spacing can be about 1.0 microns (μm). In another example, the spacing can be less than about 1.0 microns, or greater than about 1.0 microns. The size of the spacing can be varied (i.e., tuned) to tune the amount of the electric field enhancement. For example, a narrower spacing (e.g., less than about 1.0 microns) can produce larger electric field enhancement. In another example, a wider spacing (e.g., greater less than about 1.0 microns) can be used to prevent potential damage of the substrate near the spacing (e.g., due to dielectric breakdown for a dielectric substrate).

In various examples, the portions of an apparatus, detector, image sensor, or other device or system that includes the detector elements described herein can be maintained at atmospheric pressure or at less than atmospheric pressure, including near vacuum pressures. In an example, the portions of an apparatus, detector, image sensor, or other device or system that includes the detector elements described herein can be hermetically sealed.

The operation of the detector elements herein exploits an electric field enhancement in the substrate in the region of the spacing when the resonator structure is exposed to electromagnetic radiation at a frequency in the detection range. According to a principle herein, the substrate is formed from a material or a device that produces a photo-induced conductivity response as a result of the electric field enhancement. In a non-limiting example, the substrate is a material that can undergo a transition to a more conductive state in the presence of a sufficiently high electric field. In an example metamaterial structure with a dielectric substrate, the photo-induced conductivity response can be based on an insulator-to-metal phase transition in the dielectric caused by the local electric field enhancement in the region of the spacing (and/or in some examples, a gap) in the resonator structure when the detector is exposed to the target electromagnetic radiation. The metal-insulator transition near the spacing is accompanied by large resistivity changes, of several orders of magnitude, which can be detected (including being quantified) according to a system, method or apparatus herein. In an example metamaterial structure with a semiconductor substrate, the photo-induced conductivity response can be based on impact ionization. In impact ionization, absorption of the incident electromagnetic radiation generates charge carriers which, in the local high electric field enhancement near the spacing, can generate multiple additional charge carriers in the substrate through avalanche multiplication (similar to avalanche photo-diodes). This change in charge carriers can be detected (including being quantified) according to a system, method or apparatus herein.

Non-limiting examples of dielectric materials applicable to the various detector elements described herein include dielectric materials based on silicon, germanium, or transition metals. Non-limiting examples of such transition metal dielectrics include oxides, phosphate, or silicates of Ti, V, Cr, Mn, Fe, Co, Ni, Cu, Ru, Hf, Ta, or Zr, or any combination thereof. For example, the dielectric material can be an oxide of vanadium, such as $VO_2$ or $(V_{1-x}Ti_x)_2O_3$.

Non-limiting examples of semiconductor materials applicable to the various detector elements described herein include silicon, germanium, and III-V semiconductors. Non-limiting examples of applicable III-V semiconductors include gallium arsenide, indium arsenide, indium gallium arsenide, indium phosphide and indium antimonide.

In an example, an apparatus, detector, image sensor, or other device or system that includes detector elements according to the principles herein can be operated at or near room temperature. In another example, an apparatus, detector, image sensor, or other device or system that includes detector elements according to the principles herein can be operated at temperatures higher than about 77K (liquid nitrogen, LN). At these higher than LN temperatures, the detector elements according to the principles herein can be operated to detect or otherwise quantify electromagnetic radiation even at lower light levels where thermal carriers may act to reduce the signal. A metamaterial that includes a substrate comprised of a small bandgap material may be operated according to an example implementation herein at temperatures higher than LN. For example, the bandgap of a III-V semiconductor substrate that includes indium or gallium can be tuned by varying the proportion of indium and/or gallium in the material. In an example, an example apparatus, detector, image sensor, or other device or system herein can include one or more of the detector elements that are associated with a thermoelectric material or thermoelectric device. When supplied with a voltage or current, the a thermoelectric material or thermoelectric device can be used to cool the one or more detector elements for more optimal operation and conductivity measurement.

The thickness of the substrate can range from between about 50 nm and about 10 microns in thickness. In other examples, the thickness of the substrate can be greater than about 10 microns or less than about 50 nm. In an example, the thickness of the substrate can be up to about 250 nm.

The conductive structures in any example herein can be formed from a conductive metal, a conductive metal oxide, or other conductive material. In an example, a conductive structure herein can be based on gold, platinum copper, tantalum, tin, tungsten, titanium, tungsten, cobalt, chromium, silver, nickel or aluminum, or a binary or ternary system of any of these conductive materials. The thickness of the conductive structures on the substrate surface can range between about 2 nm and about 250 nm in thickness. In other examples, the thickness of the conductive structures can be greater than about 250 nm or less than about 2 nm. In an example, the thickness of the conductive structures can be about 200 nm. As a non-limiting example, the conductive structures can be a gold/chromium system, formed from about 200 nm thickness of gold over a 20 nm thick chromium adhesion layer.

In some examples, a detector element herein can include electrodes that are in electrical communication (or otherwise electrically coupled) to one or more of the resonator structures of that detector element. These electrodes can be formed from a conductive metal, a conductive metal oxide, or other conductive material, as described above in connection with the conductive structures. The thickness of the electrodes can range between about 7 nm and about 100 nm in thickness, or be greater than about 100 nm.

As described above, the change in conductivity of the detector element can be measured using electrodes in electrical communication with (or otherwise electrically coupled to) at least one of the resonator structures, or using readout circuitry associated with the detector element. The measured conductivity in the presence of the target electromagnetic radiation can be compared to the measured conductivity in the absence of the target electromagnetic radiation. A change in the measured conductivity can be indicative of the presence of the target electromagnetic radiation, or otherwise quantify a property of the target electromagnetic radiation (including magnitude, spatial profile, polarization, etc.).

In an example, the change in conductivity can be measured based on a voltage measurement and/or a current measurement.

According to a system, apparatus and method herein, the measured degree of change of photo-induced conductivity can be related to the power of the incident electromagnetic radiation at the frequencies in the detection range.

In an example, the resonator structure can be configured to target a specific frequency of electromagnetic radiation (or range of frequencies) within the detection range. For example, the length (or other dimension) of the conductive structures can be selected based on the frequency (or range of frequencies) of the electromagnetic radiation to be detected. In an example, the resonator structures can be of a length that is less than a wavelength of the target electromagnetic radiation (i.e., ranging from about 3.0 μm or less to about 3.0 mm or more). In another example, the resonator structures can be of a length that is greater than or approximately equal to a wavelength of the target electromagnetic radiation such that the target electromagnetic radiation resonates with higher order modes of the resonator structure. The size of the spacing is configured such that the local electric field enhancement in the spacing in the presence of the target electromagnetic radiation results in the resonator structure resonating with the target electromagnetic radiation. In a non-limiting example, the spacing is around 1.0 microns (μm). In other examples, the spacing can be less than about 1.0 microns (μm), or greater than about 1.0 microns (μm).

In another example, detector elements of an example device can be arranged such that they can be independently rotated. For example, vertically polarized electromagnetic radiation can be enhanced at portions of a resonator structure where the conductive structures about the spacing are oriented essentially vertically. If the detector element is rotated away from that orientation, then the degree of resonance changes (i.e., diminishes) sharply. As a result, the electric field enhancement is much weaker and significantly fewer charge carriers are generated. Thus, the conductivity change based on the amount of charge carriers generated can be measured for different rotation angles of detector elements relative to the target electromagnetic radiation. The measured conductivity change can provide an indication of the degree of resonance between the detector element and the target electromagnetic radiation, and thereby provide a measure of the polarization of the target electromagnetic radiation. In an example implementation, detector elements can be separately and independently rotated to detect or otherwise quantify the polarization direction of the target electromagnetic radiation.

In an example, the resonator structure can be configured to target electromagnetic radiation at a specific polarization (or range of polarizations). As previously mentioned, vertically polarized electromagnetic radiation can be enhanced at portions of a resonator structure where the conductive structures about the spacing are oriented essentially vertically. Conductive structure portions of the resonator structure about the spacing that are not oriented substantially vertically, e.g., that are curved or oriented at an angle, may not resonate with that vertically polarized electromagnetic radiation. Rather, these conductive structure portions may be oriented so that they resonate with electromagnetic radiation with a polarization that is away from the vertical but that is roughly parallel to their direction. Based on this principle, detector elements can be configured for detecting or otherwise quantifying electromagnetic radiation of different polarization directions. That is, the resonator structures of these example detector elements can be configured such that the conductive structure portions neighboring the spacing are oriented at differing angles. In an example according to this principle, an array of detector elements that include resonator structures with differing angular configurations about their respective spacing(s) can be used to detect or otherwise quantify electromagnetic radiation at different polarizations. In an example according to this principle, the array of detector elements can be spatially arranged such that differing regions of the array resonate with electromagnetic radiation of differing polarizations.

In another example, detector elements or sensor elements can be arranged such that they can be independently rotated for calibrating a device or for measurement of the properties of the target electromagnetic radiation. For example, for detector elements that are based on split-ring resonator structures, a non-linear dependence of the degree of resonance of the resonator structure can be observed. For example, for a detector element based on the SRR in FIG. 15A-B that is rotated in the presence of target electromagnetic radiation, the degree of electric field enhancement (and as a result, the amount of induced charge carriers) can be observed to differ for each 90° rotation. Such a different in resonance response can be due to differences in the conductive structures that bracket a spacing, differences in the sizes of spacings, and differences in the homogeneity of the substrate material in the neighborhood of a spacing. Any resonator structures according to principles herein can show similar non-symmetrical, non-linear electric field enhancement behavior with rotation. Such differences in resonance response can be calibrated for a given detector element or sensor element. In an example operation, such differences in resonance response can be used for normalizing measurements of the target electromagnetic radiation made using the detector element or sensor element. In another example, the differences in resonance response can be exploited for providing a measure of the presence of the target electromagnetic radiation or otherwise quantify a property of the target electromagnetic radiation (including magnitude, spatial profile, polarization, etc.), as described herein.

In another example, the detector elements or sensor elements can be formed metamaterials that have varying substrate properties, and hence varying resonances. As described above, for a resonator structure intended to resonate with target electromagnetic radiation of wavelength ($\lambda_t$), a dimension (l) of conductive structures of the resonator structure can be determined according to the expression: $l < \lambda_t/2 \cdot n_{eff}$, where $n_{eff}$ is the effective refractive index of the substrate material. Accordingly, for a given resonator structure with specified dimensions, the wavelength of electromagnetic radiation that resonates with it can differ depending on the effective refractive index of the substrate in the region of that resonator structure. In an example implementation, an apparatus, detector, image sensor, or other device or system that includes detector elements or sensor elements according to the principles herein can be configured to detect of otherwise quantify target electromagnetic radiation of differing frequencies at different spatially-specific positions on a device array by modulating the effective refractive index of the substrate material of specific detector elements or sensor elements at specified positions of the device array.

Non-Limiting Examples of Detector Elements and Sensor Elements

Figure 2A:
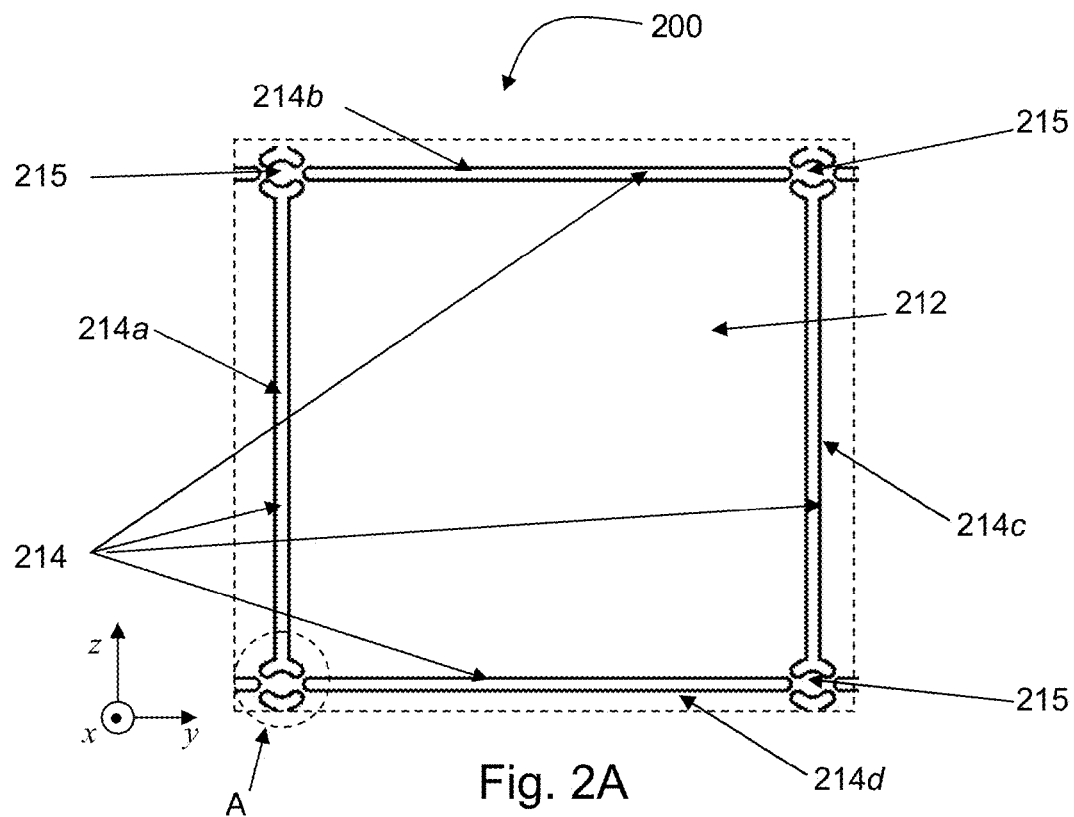
FIG. 2A shows an example detector element, according to principles of the present disclosure.
Figure 2B:
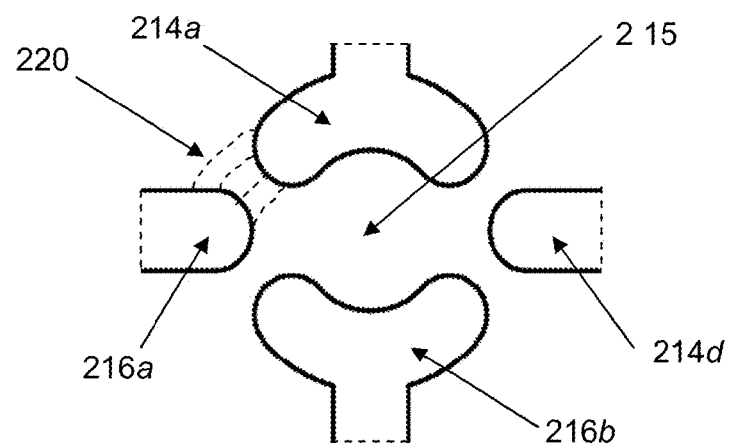
FIG. 2B shows a magnified view of a portion of the example detector element of FIG. 2A, according to principles of the present disclosure.

An example detector element 200 is illustrated in FIG. 2A. The detector element includes a substrate 212 and a resonator structure 214 disposed on the surface of substrate 212. The substrate 212 can be formed from a dielectric or semiconductor material, as described above. In the illustration of FIG. 2A, the surface is taken to lie in a y-z plane. The resonator structure 214 is formed from conductive structures (214a, 214b, 214c, and 214d) that are aligned in a substantially rectangular arrangement. The conductive structures (214a, 214b, 214c, and 214d) can be formed from a conductive metal, a conductive metal oxide, or other conductive material, as described above. Adjacent ends of conductive structures are spaced apart by a spacing 215. A magnified view of region A is shown in FIG. 2B. As shown in FIG. 2B, the spacing 215 separates portions of conductive structures 214a and 214b and conductive structures 216a and 216b. As described above, in the presence of target electromagnetic radiation (i.e., at a frequency within the detection range), there is a resonant response of the resonator structure. Charge carriers are generated in a region of the substrate near the spacing 215 based on an enhanced electric field induced in the spacing 215. The change in conductivity based on these induced charge carriers can be measured (i.e., quantified) to indicate the presence of the target electromagnetic radiation. In an example, the conductivity measurement also can be used to quantify a magnitude of the incident electromagnetic radiation.

An apparatus that includes the resonator structure 214 shown in FIGS. 2A and 2B also can be implemented to detect target electromagnetic radiation at a more than a single polarization. As shown in FIG. 2B, the resonator structure 214 is configured in a cross morphology with spacing 215 in between the conductive structures that form the cross. Electromagnetic radiation that is vertically polarized (i.e., along the z-axis in FIG. 2A) can generate the local electric field enhancement in the spacing 215 through resonantly coupling to the conductive structures about the spacing 215 that also are oriented along the z-axis. Electromagnetic radiation that is horizontally polarized (i.e., along the z-axis in FIG. 2A) can generate the local electric field enhancement in the spacing 215 through resonantly coupling to the conductive structures about the spacing 215 that also are oriented along the y-axis. In an example implementation, the change in conductivity based on the induced charge carriers can be measured to indicate the presence of vertically or horizontally polarized target electromagnetic radiation, or otherwise quantify a property of the target electromagnetic radiation (including magnitude, spatial profile, etc.) as a function of the polarization direction.

In the non-limiting example of FIG. 2B, portions of conductive structures 214a and 216b neighboring one of the spacings 215 are configured with a dual prong morphology. Such a morphology can facilitate more isotropic local electric field enhancement in the spacing 215. FIG. 2B illustrates example electric field lines 220 that can be induced between the conductive structures when the resonator structure 214 resonates with incident electromagnetic radiation having a range of different polarizations. Based on the dual prong morphology of the conductive structures, the local electric field enhancement can be more uniform at each of the four spacings 215 about the resonator structure 214, which can facilitate better detection of the induced charge carriers. The change in conductivity based on the induced charge carriers due to the different polarizations can be measured to indicate the presence of the target electromagnetic radiation and its polarization. The conductivity measurement also can be used to quantify a property of the target electromagnetic radiation (including magnitude, spatial profile, etc.) as a function of the polarization direction.

In an example, the resonator structure 214 can be configured to target a specific frequency of electromagnetic radiation (or range of frequencies) within the detection range. For example, the length of conductive structures (214a, 214b, 214c, and 214d) can be selected based on the frequency (or range of frequencies) of the electromagnetic radiation to be detected, according to the principles described herein. In an example, the resonator structure 214 can be of a length that is less than a wavelength of the target electromagnetic radiation (i.e., ranging from about 3.0 μm or less to about 3.0 mm or more). In another example, the resonator structure 214 can be of a length that is greater than or approximately equal to a wavelength of the target electromagnetic radiation such that the target electromagnetic radiation resonates with higher order modes of the resonator structure. The size of the spacing 215 is configured such that the local electric field enhancement in the spacing 215 in the presence of the target electromagnetic radiation results in the resonator structure 214 resonating with the target electromagnetic radiation. In an example, the spacing 215 is around 1.0 microns (μm). In other examples, the spacing 215 can be less than about, or greater than about 1.0 microns (μm).

In an example apparatus, detector, image sensor or other device that is formed from a plurality of the resonator structures 214 of FIG. 2A, the resonator structures that are targeted to detect different frequencies of the target electromagnetic radiation (based on dimensions of the conductive structures) can be disposed at differing spatial locations. An apparatus, detector, image sensor or other device according to such an example implementation could be used to quantify a property of the target electromagnetic radiation (including magnitude, spatial profile, etc.) as a function of the polarization direction.

In an example operation, the detector element 200 is exposed to a beam of electromagnetic radiation that may include the target electromagnetic radiation having a frequency (or range of frequencies) within the detection range. In the presence of the target electromagnetic radiation, the local electric field enhancement in the region of the spacing 215 of the resonator structure 214 results in a change of the photo-induced conductivity of the substrate 212. The change in conductivity of the substrate 212 can be measured using electrodes in electrical communication with (or otherwise electrically coupled to) at least one of the resonator structures, or using readout circuitry associated with the detector element. The measured conductivity in the presence of the target electromagnetic radiation can be compared to the measured conductivity in the absence of the target electromagnetic radiation. A change in the measured conductivity can be indicative of the presence of the target electromagnetic radiation in the beam of electromagnetic radiation.

The change in the measured photo-induced conductivity response of the substrate 212 can serve as an indicator of the presence and/or the magnitude of the target electromagnetic radiation in the incident beam. The detector element 200 of FIG. 2A also can be used to provide an indication of the spatial profile of the target electromagnetic radiation. In an example, a change in the measured photo-induced conductivity of the substrate 212 above a pre-determined threshold value can serve as an indicator of the presence and/or magnitude of the target electromagnetic radiation, or a spatial extent of the target electromagnetic radiation. The pre-determined threshold value may be determined based on the level of noise of the conductivity measurements of the substrate or based on a sensitivity limit of the instrument or integrated circuit used to probe the change in conductivity of the substrate.

The detector element of FIG. 2A may include electrodes that are electrically coupled to the substrate 212 or to the resonator structure(s) 214 for measuring the change in conductivity due to the charge carriers induced in the substrate by the local electric field enhancement in the spacing 215. In another example, integrated circuitry coupled to substrate 212 can be used for measuring the change in conductivity due to the charge carriers induced in the substrate by the local electric field enhancement in the spacing 215.

Figure 3:
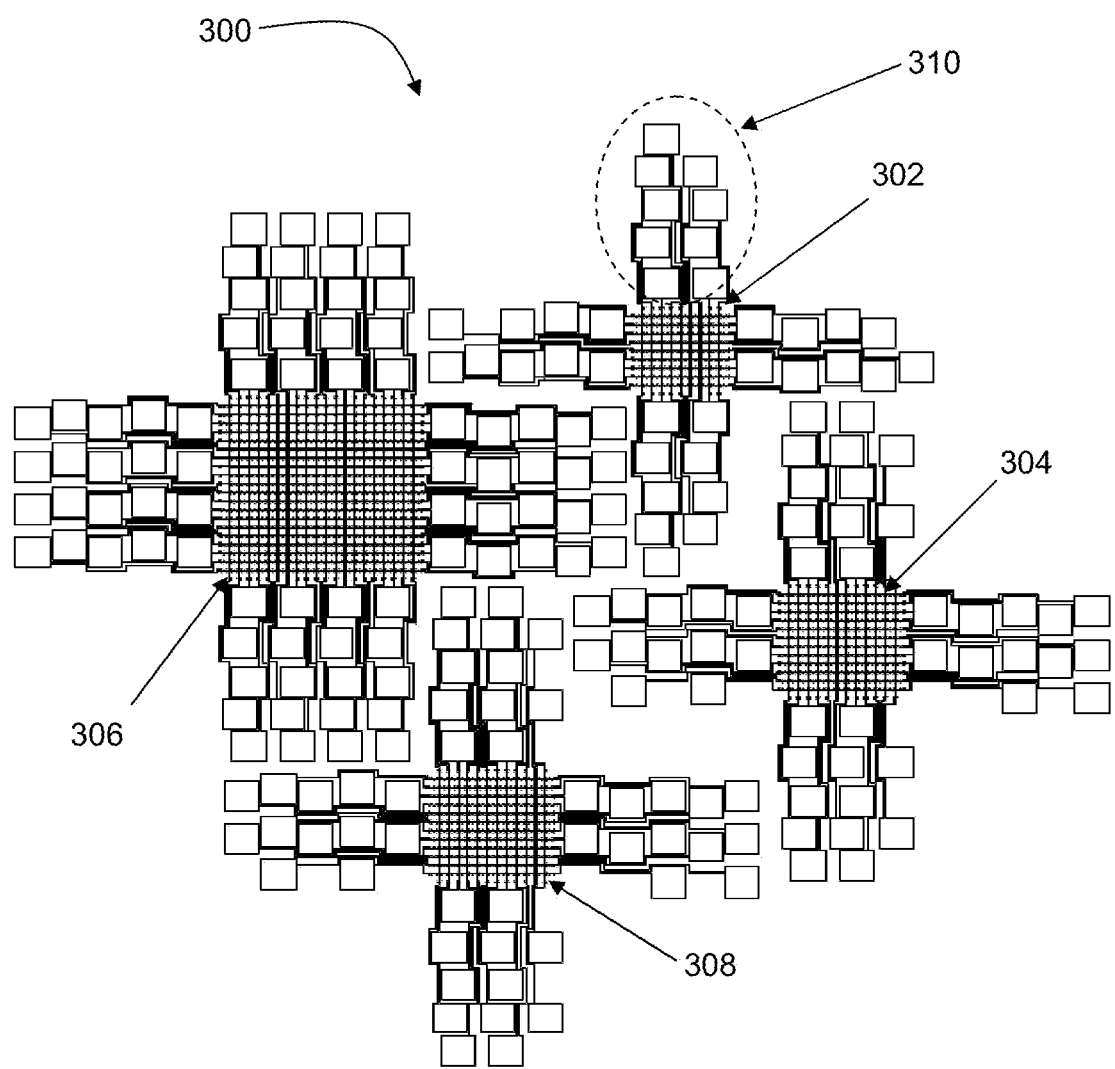
FIG. 3 shows example arrays of sensor elements, according to principles of the present disclosure.

FIG. 3 shows an example of an apparatus 300 that includes multiple sensor elements (302, 304, 306, and 308). Each sensor element (302, 304, 306, and 308) includes one or more detector elements. In a non-limiting example, the detector elements of a sensor element can be arranged in an array. The detector elements of a sensor element can be any of the example detector elements described herein, including any of FIGS. 2A, 2B, 4-12, 13A, 14A, and 15B, or any combination thereof. In an example, the apparatus 300 can be implemented as part of a detector, an image sensor or other device, and used to detect the presence of, or otherwise quantify a property of, the target electromagnetic radiation (including magnitude, polarization, spatial profile, etc.). As shown in FIG. 3, each sensor element is coupled to contacts, such as the contacts shown at 310. In various examples, the contacts may be coupled to electrodes that are in electrical communication with (or otherwise electrically coupled to) at least one of the resonator structures of the detector elements, or the contacts may be coupled to readout circuitry associated with the detector elements. The change in conductivity of the substrate of the detector elements in the presence of the target electromagnetic radiation (as described herein) can be measured by way of these contacts. The measured conductivity in the presence of the target electromagnetic radiation can be compared to the measured conductivity in the absence of the target electromagnetic radiation. A change in the measured conductivity can be indicative of the presence of, or otherwise quantify a property of, the target electromagnetic radiation (including magnitude, polarization, spatial profile, etc.).

Figure 4:
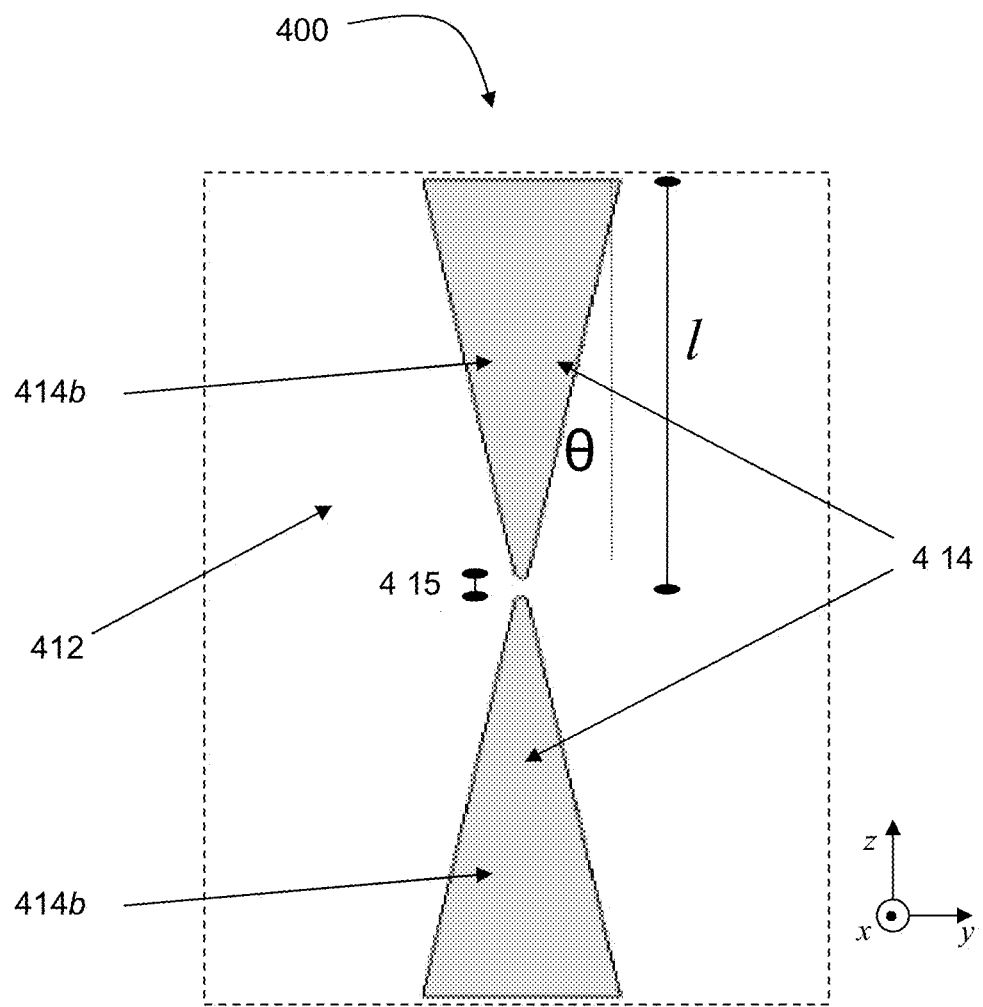
FIG. 4 shows another example detector element, according to principles of the present disclosure.

Another example detector element 400 is illustrated in FIG. 4. The detector element includes a substrate 412 and a resonator structure 414 disposed on the surface of substrate 412. The substrate 412 can be formed from a dielectric or semiconductor material, as described above. The resonator structure is formed from conductive structures (414a and 414b) that each have a wedge morphology. The conductive structures (414a and 414b) can be formed from a conductive metal, a conductive metal oxide, or other conductive material, as described above. The narrower portions of conductive structures (414a and 414b) are adjacent and spaced apart by a spacing 415. As described above, in the presence of target electromagnetic radiation (i.e., at a frequency within the detection range), there is a resonant response of the resonator structure. Charge carriers are generated in a region of the substrate near the spacing 415 based on an enhanced electric field induced in the spacing 415. The change in conductivity based on these induced charge carriers can be measured (i.e., quantified) to indicate the presence of the target electromagnetic radiation. In an example, the conductivity measurement also can be used to quantify a magnitude of the incident electromagnetic radiation.

An apparatus that includes the detector element shown in FIG. 4 also can be implemented to detect target electromagnetic radiation having a range of different polarizations. Based on the non-linear shape (i.e., the edge is at angle θ relative to the center) of the conductive structures, electromagnetic radiation having a range of different polarizations can cause an enhanced electromagnetic field to be induced in the substrate 412 in the vicinity of spacing 415. The change in conductivity based on the induced charge carriers due to the different polarizations can be measured to indicate the presence of the target electromagnetic radiation. The conductivity measurement also can be used to quantify a magnitude of the target electromagnetic radiation.

In an example, the size of the angle (θ) of the wedge-shaped conductive structures and/or their alignment direction in the y-z plane in FIG. 4 can be varied (i.e., tuned) so that the resonator structure can be used to detect or otherwise quantify differing ranges of polarizations of the incident electromagnetic radiation. For example, the vertical orientation (i.e., along the z-axis in FIG. 4) of conductive structures 41a and 414b facilitates enhancement of vertically polarized electromagnetic radiation. The angular spread of the wedge-shaped portions also facilitates enhancement of electromagnetic radiation that is polarized within an angular range about the z-axis. For an example apparatus, detector, image sensor or other device that is formed from two or more of the resonator structures of FIG. 4, different resonator structures that are targeted to detect different specific ranges of polarizations of the target electromagnetic radiation can be disposed at differing spatial locations. In another example, apparatus, detector, image sensor or other device that is formed from two or more of the resonator structures of FIG. 4, resonator structures that are targeted to detect the same specific ranges of polarizations of the target electromagnetic radiation can be disposed at differing spatial locations but rotated to differing directions relative to the z-axis shown in FIG. 4. An apparatus, detector, image sensor or other device according to these example implementations also could be used to detect quantify a property of the target electromagnetic radiation (including magnitude, spatial profile, etc.) as a function of the polarization directions of the incident electromagnetic radiation.

In an example, the resonator structure can be configured to target a specific frequency of electromagnetic radiation (or range of frequencies) within the detection range. For example, the length l of conductive structures (414a and 414b) can be selected based on the frequency (or range of frequencies) of the electromagnetic radiation to be detected. For example, the resonator structure can be of a length that is less than a wavelength of the target electromagnetic radiation (i.e., ranging from about 3.0 µm or less to about 3.0 mm or more). In another example, the resonator structure can be of a length that is greater than or approximately equal to a wavelength of the target electromagnetic radiation such that the target electromagnetic radiation resonates with higher order modes of the resonator structure. The size of the spacing 415 can be around 1.0 microns (µm). In other examples, the spacing 415 can be less than about 1.0 microns (µm) or greater than about 1.0 microns (µm).

In an example operation, the detector element 400 is exposed to a beam of electromagnetic radiation that may include the target electromagnetic radiation having a frequency (or range of frequencies) within the detection range. In the presence of the target electromagnetic radiation, the local electric field enhancement in the region of the spacing 415 of the resonator structure results in a change of the photo-induced conductivity of the substrate 412. The change in conductivity of the substrate 412 can be measured using electrodes in electrical communication with (or otherwise electrically coupled to) at least one of the resonator structures, or using readout circuitry associated with the detector element. The measured conductivity in the presence of the target electromagnetic radiation can be compared to the measured conductivity in the absence of the target electromagnetic radiation. A change in the measured conductivity can be indicative of the presence of the target electromagnetic radiation.

The change in the measured photo-induced conductivity response of the substrate 412 can serve as an indicator of the presence and/or the magnitude of the target electromagnetic radiation in the incident beam. Therefore, the detector element 400 of FIG. 4 also can be used to provide an indication of the spatial profile of the target electromagnetic radiation. In an example, a change in the measured photo-induced conductivity of the substrate 412 above a pre-determined threshold value can serve as an indicator of the presence and/or magnitude of the target electromagnetic radiation, or a spatial extent of the target electromagnetic radiation. The pre-determined threshold value may be determined based on the level of noise of the conductivity measurements of the substrate or based on a sensitivity limit of the instrument or integrated circuit used to probe the change in conductivity of the substrate.

The detector element of FIG. 4 may include electrodes that are electrically coupled to the substrate 412 or to the resonator structure(s) for measuring the change in conductivity due to the charge carriers induced in the substrate by the local electric field enhancement in the spacing 415. In another example, integrated circuitry coupled to substrate 412 can be used for measuring the change in conductivity due to the charge carriers induced in the substrate by the local electric field enhancement in the spacing 415.

Figure 5:
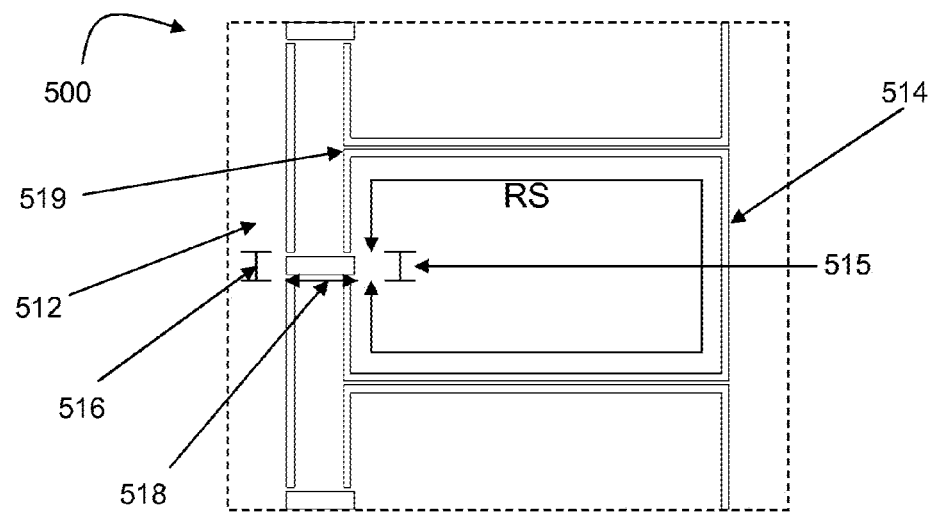
FIG. 5 shows a portion of an example array of resonator structures coupled with coupling structures, according to principles of the present disclosure.

Another example detector element 500 is illustrated in FIG. 5. The detector element is includes a substrate 512, a resonator structure 514 and a coupling structure 518, both of which are disposed on the surface of substrate 512. The substrate 512 can be formed from a dielectric or semiconductor material, as described above. The resonator structure is formed as a conductive structure 514 that includes a spacing 515. The conductive structures 514 can be formed from a conductive metal, a conductive metal oxide, or other conductive material, as described above. The arrows labeled RS show the dimensions and extent of the resonator structure 514. In an example, a portion of the coupling structure 518 is disposed in spacing 515 the first resonator structure 514. The coupling structure 518 does not make physical contact with the resonator structure 514. As described above, in the presence of target electromagnetic radiation (i.e., at a frequency within the detection range), there is a resonant response of the resonator structure. Charge carriers are generated in a region of the substrate near the spacing 515 based on an enhanced electric field induced in the region of spacing 515. Coupling structure 518 can facilitate near-field coupling so that the response of the substrate to the resonant coupling (including the induced charge carriers) can be read-out over the length of coupling structure 518. In an example implementation, electrodes can be electrically coupled to the resonator structure 514 by way of coupling structure 518 to facilitate read-out of the response of the substrate to the resonant coupling (including the induced charge carriers). The change in conductivity based on these induced charge carriers can be measured (i.e., quantified) to indicate the presence of the target electromagnetic radiation. In an example, the conductivity measurement also can be used to quantify a magnitude of the incident electromagnetic radiation.

In an example, an apparatus, detector, image sensor or other device based on the detector element of FIG. 5 can be used for broadband electromagnetic spectrum detection. The resonator structure 514 and coupling structure 518 can exhibit multiple resonant modes that couple to electromagnetic radiation in the detection range, allowing for fairly broad spectrum detection. The resonator structure 514 can be modeled as capacitor-inductor (LC) resonators. The materials of the conductive structures and the dimensions of the resonator structures set the parameters L and C, and can be used to model the resonant frequency of the metamaterial structure, i.e., the target electromagnetic frequency or range of frequencies that resonate with the metamaterial structure.

In an example, the dimensions of the resonator structure 514 and coupling structure 518 can be selected based on the range of frequencies of the electromagnetic radiation to be detected. For example, the resonator structure can have dimensions that are less than a wavelength of the target electromagnetic radiation (i.e., ranging from about 3.0 µm or less to about 3.0 mm or more). In another example, the resonator structure can have dimensions that are greater than or approximately equal to a wavelength of the target electromagnetic radiation such that the target electromagnetic radiation resonates with higher order modes of the resonator structure. The size of the spacings 515 and 516 can be around 5.0 microns (µm). In other examples, the spacings 515 and 516 can be less than about 5.0 microns (µm) or greater than about 5.0 microns (µm). The dimension of the spacing 515 and 516 puts an upper bound on the possible lateral dimensions of the coupling structure 518 in the region of the spacing 515 and 516. The size of gap 519 can be about 1.0 microns.

In an example operation, the detector element 500 is exposed to a beam of electromagnetic radiation that may include the target electromagnetic radiation having a frequency (or range of frequencies) within the detection range. In the presence of the target electromagnetic radiation, the broadband resonance results in a change of the photo-induced conductivity of the substrate 512. The change in conductivity of the substrate 512 can be measured using electrodes in electrical communication with (or otherwise electrically coupled to) at least one of the resonator structures, or using readout circuitry associated with the detector element. The measured conductivity in the presence of the target electromagnetic radiation can be compared to the measured conductivity in the absence of the target electromagnetic radiation. A change in the measured conductivity can be indicative of the presence of the target electromagnetic radiation.

In an example implementation, the change in the measured photo-induced conductivity response of the substrate 512 can serve as an indicator of the presence and/or the magnitude of the target electromagnetic radiation in the incident beam. Therefore, the detector element 500 of FIG. 5 also can be used to provide an indication of the spatial profile of the target electromagnetic radiation. In an example, a change in the measured photo-induced conductivity of the substrate 512 above a pre-determined threshold value can serve as an indicator of the presence and/or magnitude of the target electromagnetic radiation, or a spatial extent of the target electromagnetic radiation. The pre-determined threshold value may be determined based on the level of noise of the conductivity measurements of the substrate or based on a sensitivity limit of the instrument or integrated circuit used to probe the change in conductivity of the substrate.

The detector element of FIG. 5 may include electrodes that are electrically coupled to the substrate 512 or to the resonator structure(s) for measuring the change in conductivity due to the charge carriers induced in the substrate by the local electric field enhancement in the spacing 515. In another example, integrated circuitry coupled to substrate 512 can be used for measuring the change in conductivity due to the charge carriers induced in the substrate by the local electric field enhancement in the spacing 515.

In a non-limiting example implementation, the resonator structure 514 can be configured to have dimensions of about 100 microns in length and about 53 microns in width. The width of the coupling structure 518 in the region of spacing 515 can be about 5 microns, and gap 519 can be around 1.0 micron.

Figure 6:
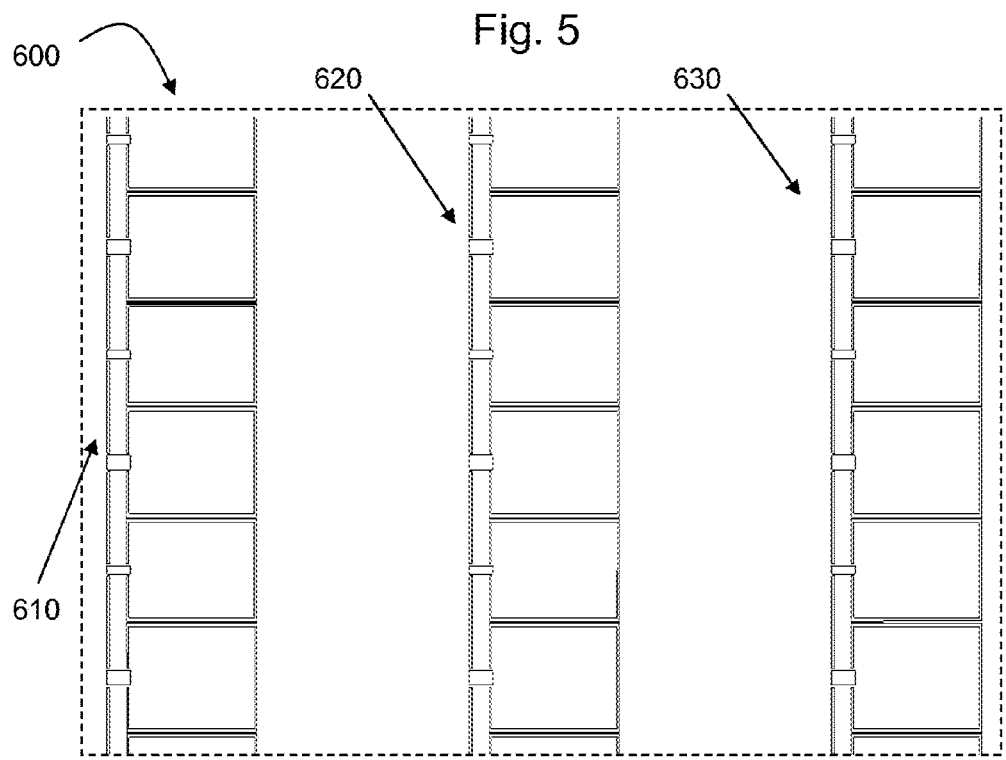
FIG. 6 shows another example of an array of the resonator structures coupled with coupling structures shown in FIG. 5, according to principles of the present disclosure.

FIG. 6 shows an example arrangement of the detector elements of FIG. 5 in three arrays 610, 620 and 630. The arrays of FIG. 6 can be implemented in an apparatus, detector, image sensor or other device that is used to detect target electromagnetic radiation, i.e., at a frequency in the detection range. In an example implementation, electrodes can be electrically coupled to the resonator structures of arrays 610, 620 and 630 by way of its associated coupling structure to facilitate read-out of the response of the substrate to the resonant coupling (including the induced charge carriers) for each array 610, 620 and 630. The structure 600 can be configured as a pixel of the an apparatus, detector, image sensor or other device. In another example, the arrays of FIG. 6 can be used to quantify the magnitude of target electromagnetic radiation.

Another example of a detector element 700 is illustrated in FIG. 7A. The detector element includes a substrate 712 and conductive structure 714a, 714b and 714c disposed on the surface of substrate 712. The substrate 712 can be formed from a dielectric or semiconductor material, as described above. FIG. 7 also shows a second detector element 702 that includes conductive structure 716a, 716b and 716c disposed on the surface of substrate 712. As shown in FIG. 7B, conductive structures 714a, 714b and 714c are a part of resonator structure 714; conductive structures 716a, 716b and 716c are a part of resonator structure 716. The conductive structures (714a, 714b, 714c, 716a, 716b and 716c) can be formed from a conductive metal, a conductive metal oxide, or other conductive material, as described above. A gap 719 separates conductive structure 714a from conductive structure 716a. A portion of resonator structure 716 (i.e., conductive structure 716a) is positioned within the spacing in resonator structure 714. The arrows labeled RS show the dimensions and extent of the resonator structure 714. As shown in FIG. 7B, this portion of resonator structure 716 (i.e., conductive structure 716a) serves as a dipole structure relative to the resonator structure 714. This dipole structure does not make physical contact with the resonator structure 714. That is, the structure of FIG. 7B is formed based on interdigitated resonator structures, where a portion of one resonator structure is disposed in the spacing of another resonator structure and serves as a dipole structure. As described above, in the presence of target electromagnetic radiation (i.e., at a frequency within the detection range), there is a resonant response of the resonator structure. Charge carriers are generated in a region of the substrate near the spacing in resonator structure 714 based on an enhanced electric field induced in the region of the spacing. The change in conductivity based on these induced charge carriers can be measured (i.e., quantified) to indicate the presence of the target electromagnetic radiation. In an example, the conductivity measurement also can be used to quantify a magnitude of the incident electromagnetic radiation.

In an example, an apparatus, detector, image sensor or other device based on the detector elements of FIGS. 7A and 7B also can be used for broadband electromagnetic spectrum detection. The detector elements 714 and 716 of FIGS. 7A and 7B are formed as interdigitated resonator structures, where a portion of one resonator structure is disposed in the spacing of another resonator structure and acts as equivalent dipole structures. Thus, the structure essentially behaves as a series of dipoles positioned within the spacings of capacitor-inductor (LC) resonators. In this example, the equivalent dipole structures are oriented in a direction perpendicular to the side of the resonator structure neighboring the spacing. In a non-limiting example, for frequencies above about one or more THz, a surface current may be localized to the region of the substrate in the vicinity of the dipoles; for lower frequencies, the peak surface current may be largely localized to the connected portions of the resonator structures. The peak surface current may be localized to the equivalent dipole structures for frequencies above about one THz, whereas for frequencies lower than about one THz, the peak surface current may be largely localized to the connected bar (such as conductive structures 714c and 716c).

In an example, the dimensions of the resonator structure 714 and dipole structure 718 can be selected based on the range of frequencies of the electromagnetic radiation to be detected. For example, the resonator structure can have dimensions that are less than a wavelength of the target electromagnetic radiation (i.e., ranging from about 3.0 µm or less to about 3.0 mm or more). In another example, the resonator structure can have dimensions that are greater than or approximately equal to a wavelength of the target electromagnetic radiation such that the target electromagnetic radiation resonates with higher order modes of the resonator structure. The dimension of the spacing in a first resonator structure puts an upper bound on the possible dimensions of the equivalent "dipole" portion of a second resonator structure that is disposed in the spacing. In a non-limiting example, the resonator structure can have a length of about 300 microns, and the dimension of the equivalent "dipole" portion can be about 35 microns. The gap 719 between the equivalent "dipole" portion and the resonator structure in the spacing can be about one 1.0 micron. In another examples, the gap can be less than about 1.0 microns (µm) or greater than about 1.0 microns (µm).

In an example operation, the detector elements 700 and 702 of FIG. 7B are exposed to a beam of electromagnetic radiation that may include the target electromagnetic radiation having a frequency (or range of frequencies) within the detection range. In the presence of the target electromagnetic radiation, the broadband resonance results in a change of the photo-induced conductivity of the substrate 712. The change in conductivity of the substrate 712 can be measured using electrodes in electrical communication with (or otherwise electrically coupled to) at least one of the resonator structures, or using readout circuitry associated with the detector element. The measured conductivity in the presence of the target electromagnetic radiation can be compared to the measured conductivity in the absence of the target electromagnetic radiation. A change in the measured conductivity can be used as an indication of the presence of the target electromagnetic radiation.

In an example implementation, the change in the measured photo-induced conductivity response of the substrate 712 can serve as an indicator of the presence and/or the magnitude of the target electromagnetic radiation in the incident beam. Therefore, the detector element 700 of FIG. 7 also can be used to provide an indication of the spatial profile of the target electromagnetic radiation. In an example, a change in the measured photo-induced conductivity of the substrate 712 above a pre-determined threshold value can be used as an indicator of the presence and/or magnitude of the target electromagnetic radiation, or a spatial extent of the target electromagnetic radiation. The pre-determined threshold value may be determined based on the level of noise of the conductivity measurements of the substrate or based on a sensitivity limit of the instrument or integrated circuit used to probe the change in conductivity of the substrate.

The detector element of FIG. 7 may include electrodes that are electrically coupled to the substrate 712 or to the resonator structure(s) for measuring the change in conductivity due to the charge carriers induced in the substrate by the local electric field enhancement in the spacing 715. In another example, integrated circuitry coupled to substrate 712 can be used for measuring the change in conductivity due to the charge carriers induced in the substrate by the local electric field enhancement in the spacing 715.

In a non-limiting example implementation, the resonator structure 714 can be configured to have dimensions of about 300 microns in length (e.g., conductive elements 714b and 716b), with the equivalent dipole structure portion having a length of about 53 microns (e.g., conductive elements 714a and 716a). The gap 719 can be around 1.0 micron.

Figure 8:
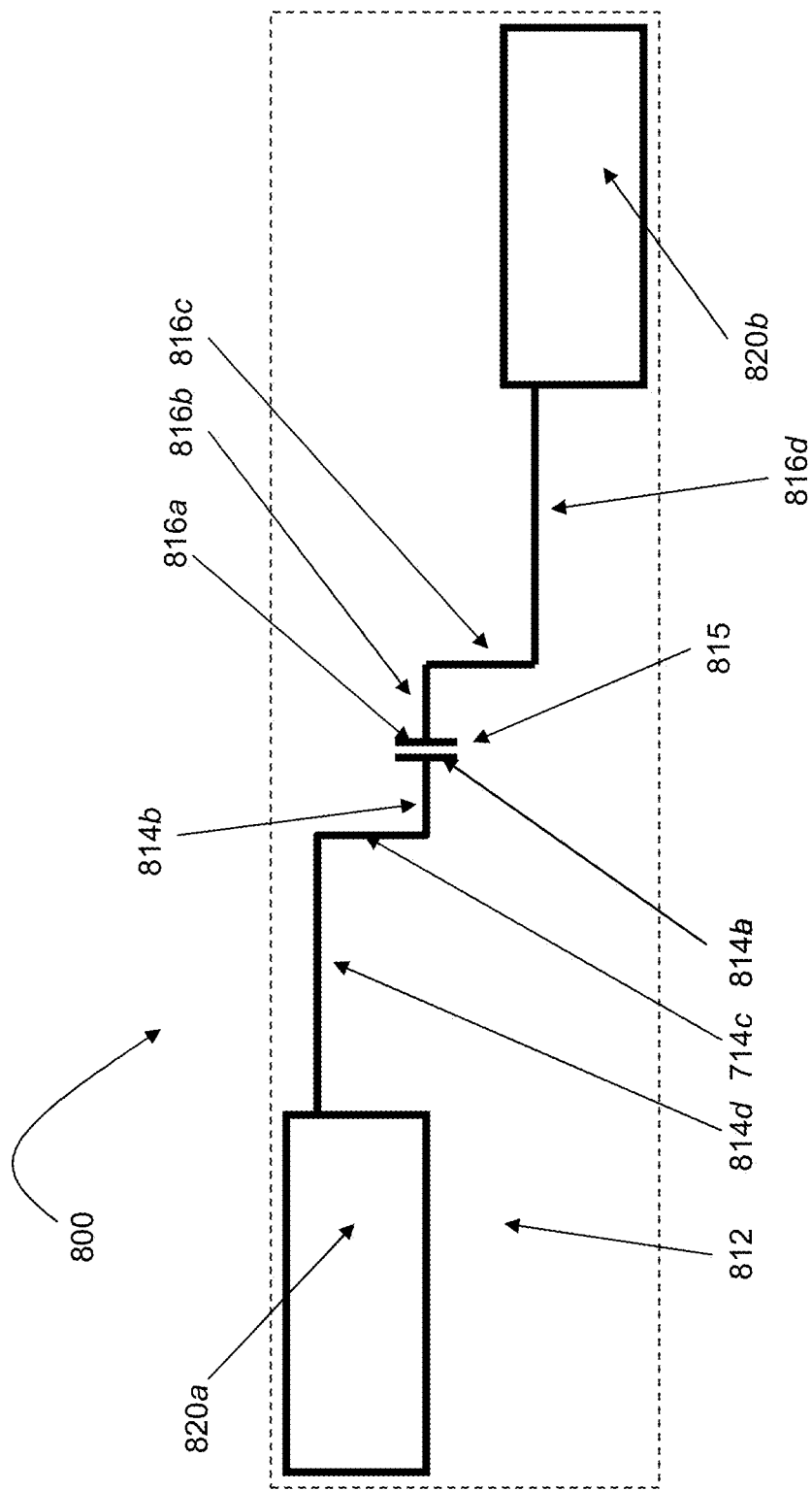
FIG. 8 show another example detector element, according to principles of the present disclosure.

Another example of a detector element 800 is illustrated in FIG. 8. The detector element includes a substrate 812 and conductive structure 814a, 814b, 814c, 814d, 816a, 816b, 816c and 816d disposed on the surface of substrate 812. The substrate 812 can be formed from a dielectric or semiconductor material, as described above. Conductive structures 814a, 814b, 814c, 814d, 816a, 816b, 816c and 816d are a part of a resonator structure. The conductive structures (814a, 814b, 814c, 814d, 816a, 816b, 816c and 816d) can be formed from a conductive metal, a conductive metal oxide, or other conductive material, as described above. A spacing 815 separates conductive structure 814a from conductive structure 816a. As described above, in the presence of target electromagnetic radiation (i.e., having a frequency within the detection range), there is a resonant response of the resonator structure. Charge carriers are generated in a region of the substrate near the spacing 815 in resonator structure 814 based on an enhanced electric field induced in the region of the spacing 815. The change in conductivity based on these induced charge carriers can be measured (i.e., quantified) to indicate the presence of the target electromagnetic radiation. In an example, the conductivity measurement also can be used to quantify a magnitude of the incident electromagnetic radiation.

In an example, an apparatus, detector, image sensor or other device based on the detector element of FIG. 8 also can be used for broadband electromagnetic spectrum detection. Most of the resonant response that produces the local electric field enhancement that generates the charge carriers occurs in the region of spacing 815.

In an example, the dimensions of the resonator structure can be selected based on the range of frequencies of the electromagnetic radiation to be detected. For example, the resonator structure can have dimensions that are less than a wavelength of the target electromagnetic radiation (i.e., ranging from about 3.0 μm or less to about 3.0 mm or more). In another example, the resonator structure can have dimensions that are greater than or approximately equal to a wavelength of the target electromagnetic radiation such that the target electromagnetic radiation resonates with higher order modes of the resonator structure.

In an example operation, the detector element 800 of FIG. 8 are exposed to a beam of electromagnetic radiation that may include the target electromagnetic radiation having a frequency (or range of frequencies) within the detection range. In the presence of the target electromagnetic radiation, the broadband resonance results in a change of the photo-induced conductivity of the substrate 812. The change in conductivity of the substrate 812 can be measured using electrodes in electrical communication with (or otherwise electrically coupled to) the contacts 820a and 820b of at least one of the resonator structures, or using readout circuitry associated with the detector element. The measured conductivity in the presence of the target electromagnetic radiation can be compared to the measured conductivity in the absence of the target electromagnetic radiation. A change in the measured conductivity can be used as an indication of the presence of the target electromagnetic radiation.

In an example implementation, the change in the measured photo-induced conductivity response of the substrate 812 can serve as an indicator of the presence and/or the magnitude of the target electromagnetic radiation in the incident beam. Therefore, the detector element 800 of FIG. 8 also can be used to provide an indication of the spatial profile of the target electromagnetic radiation. In an example, a change in the measured photo-induced conductivity of the substrate 812 above a pre-determined threshold value can be used as an indicator of the presence and/or magnitude of the target electromagnetic radiation, or a spatial extent of the target electromagnetic radiation. The pre-determined threshold value may be determined based on the level of noise of the conductivity measurements of the substrate or based on a sensitivity limit of the instrument or integrated circuit used to probe the change in conductivity of the substrate.

Figure 9A:
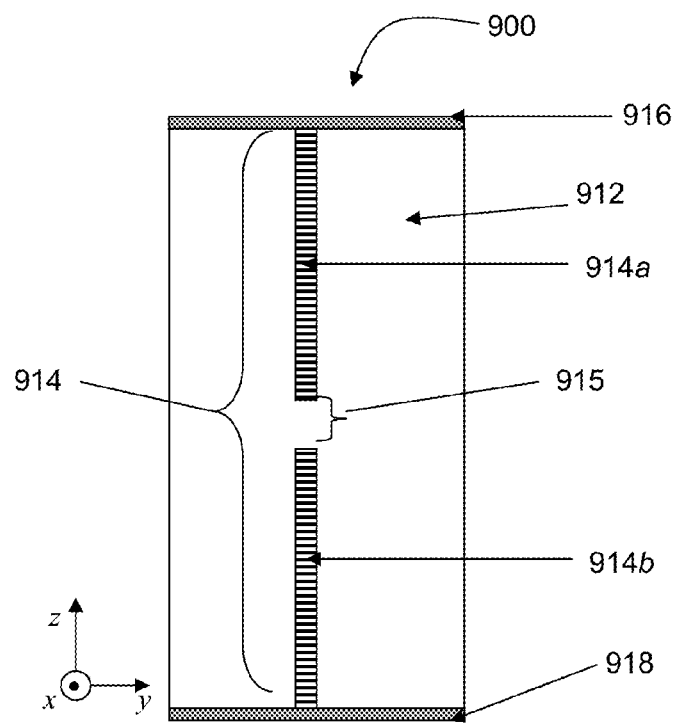
FIG. 9A shows an example detector element with an antenna arrangement of conductive structures, according to principles of the present disclosure.

Another example detector element 900 is illustrated in FIG. 9A. The detector element includes a substrate 912 and a resonator structure 914 disposed on the surface of substrate 912. In the illustration of FIG. 9A, the surface is taken to lie in a y-z plane. Resonator structure 914 is formed from two conductive structures 914a and 914b that are aligned in a longitudinal antenna arrangement. Based on the axes defined in FIG. 9A, the conductive structures 914a and 914b are aligned along a z-direction of the substrate. Adjacent ends of conductive structures 914a and 914b are spaced apart by a spacing 915 in the z-direction. Electrodes 916 and 918 are in electrical communication with the resonator structure 914. Electrode 916 is depicted as being in electrical communication with a region of conductive structure 914a at a position away from the spacing 915. Similarly, electrode 918 is depicted as being in electrical communication with a region of conductive structure 914b at a position away from the spacing 915. As shown in the non-limiting example of FIG. 9A, electrodes 916 and 918 can be disposed at or near opposite ends of the substrate 912 in the z-direction and oriented along the y-direction. In an example, electrodes 916 and 918 are disposed on the substrate 912.

In an example, the resonator structure 914 is configured to target a specific frequency of electromagnetic radiation (or range of frequencies) within the detection range. The length of conductive structures 914a and 914b in resonator structure 914 is selected based on the frequency (or range of frequencies) of the electromagnetic radiation to be detected. In an example, the resonator structure 914 can be of a length that is less than a wavelength of the target electromagnetic radiation (i.e., ranging from about 3.0 μm to about 3.0 mm). In another example, the resonator structure 914 can be of a length that is greater than or approximately equal to a wavelength of the target electromagnetic radiation such that the target electromagnetic radiation resonates with higher order modes of the resonator structure. The spacing 915 is selected such that the local electric field enhancement in the spacing 915 in the presence of the target electromagnetic radiation results in the resonator structure 914 resonating with the frequency of that target electromagnetic radiation. In an example, the spacing 915 is around 1.0 microns (μm). The spacing 915 can be less than about, or greater than about 1.0 microns (μm).

In an example operation, the detector element 900 is exposed to a beam of electromagnetic radiation that may include the target electromagnetic radiation having a frequency (or range of frequencies) within the detection range. In the presence of the target electromagnetic radiation, the local electric field enhancement in the region of the spacing 915 of resonator structure 914 results in a change of the photo-induced conductivity of the substrate 912. The conductivity of the substrate 912 can be measured using electrodes 916 and 918. The measured conductivity in the presence of the target electromagnetic radiation can be compared to the measured conductivity in the absence of the target electromagnetic radiation. A change in the measured conductivity can be indicative of the presence of the target electromagnetic radiation.

The detector element 910 of FIG. 9A can be used as a detector of the target electromagnetic radiation in an incident beam. A change in the measured photo-induced conductivity response of the substrate 912 can serve as an indicator of the presence in the incident beam of the target electromagnetic radiation having a frequency (or range of frequencies) within the detection range. In an example, a change in the measured photo-induced conductivity response of the substrate 912 above a threshold value can serve as an indicator of the presence of the target electromagnetic radiation. The threshold value for a detector element may be determined based on the noise of the conductivity signal measured using the electrodes or based on a measurement sensitivity limit of the instrument probing the change in conductivity at the electrodes.

The detector element 910 of FIG. 9A can be used to provide an indication of the power of the target electromagnetic radiation in an incident beam. For example, the amount of photo-induced conductivity response of the substrate 912, as measured using the electrodes 916 and 918 can be related to the power of the target electromagnetic radiation. In another example, detector element 900 can be used to provide an indication of the spatial profile of the target electromagnetic radiation.

In an example, the substrate 912 of detector element 900 of FIG. 9A is a dielectric or semiconductor material, as described above. The conductive structures 914a and 914b can be formed from a conductive metal, a conductive metal oxide, or other conductive material, as described above. The electrodes 916 and 918 also can be formed from a conductive metal, a conductive metal oxide, or other conductive material, as described above.

Figure 9B:
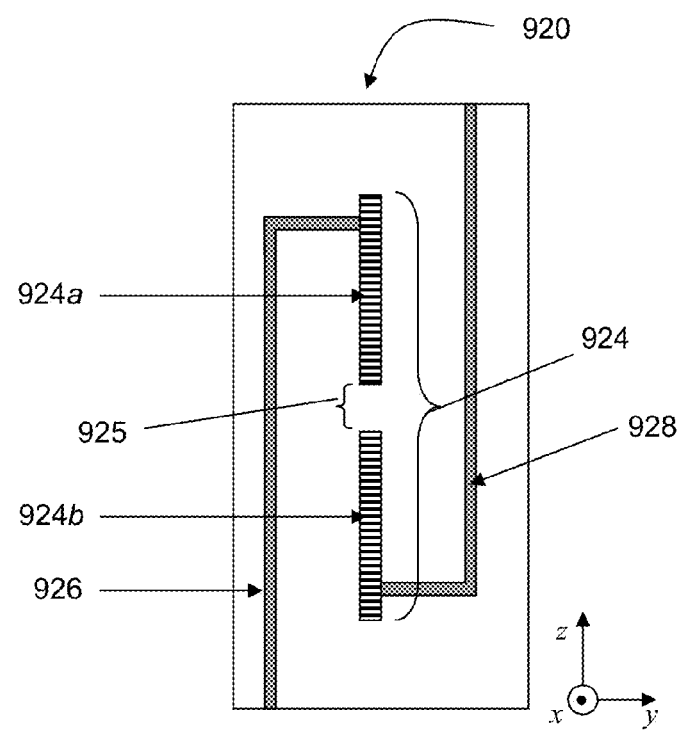
FIG. 9B shows another example detector element with an antenna arrangement of conductive structures, according to principles of the present disclosure.

Another example detector element 920 is illustrated in FIG. 9B. Similar to detector element 10 of FIG. 9A, detector element 920 includes a substrate 922 and a resonator structure 924 disposed on the surface of substrate 922. In the illustration of FIG. 9B, the surface is taken to lie in a y-z plane. Resonator structure 924 is formed from two conductive structures 924a and 924b that are aligned in a longitudinal antenna arrangement. Based on the axes defined in FIG. 9B, the conductive structures 924a and 924b are aligned along a z-direction of the substrate. Adjacent ends of conductive structures 924a and 924b are spaced apart by a spacing 925 in the z-direction. Electrodes 926 and 928 are in electrical communication with the resonator structure 924. Electrode 926 is depicted as being in electrical communication with a region of conductive structure 924a at a position away from the spacing 925. Similarly, electrode 928 is depicted as being in electrical communication with a region of conductive structure 924b at a position away from the spacing 925.

In the non-limiting example depicted in FIG. 9B, electrodes 926 and 928 are disposed on the substrate 922. As depicted, portions of electrodes 926 and 928 can be disposed near opposite ends of the substrate 922 in the z-direction and oriented in the y-direction, while other portions of the electrodes 926 and 928 run substantially parallel to conductive structures 924a and 924b in the z-direction.

The resonator structure 924 is also configured to target a specific frequency of electromagnetic radiation (or range of frequencies) within the detection range. The length of conductive structures 924a and 924b in resonator structure 924 is selected based on the frequency (or range of frequencies) of the electromagnetic radiation to be detected. In an example, the resonator structure 924 can be of a length that is less than a wavelength of the target electromagnetic radiation (i.e., ranging from about 3.0 µm to about 3.0 mm). In another example, the resonator structure 924 can be of a length that is greater than or approximately equal to a wavelength of the target electromagnetic radiation such that the target electromagnetic radiation resonates with higher order modes of the resonator structure. The spacing 925 is selected such that the local electric field enhancement in the spacing 925 in the presence of the target electromagnetic radiation results in the resonator structure 924 resonating with the frequency of that target electromagnetic radiation. In an example, the spacing 925 is around 1.0 microns (µm). The spacing 925 can be less than about, or greater than about 1.0 microns (µm).

In an example operation, the detector element 920 is exposed to a beam of electromagnetic radiation that may include the target electromagnetic radiation having a frequency (or range of frequencies) within the detection range. In the presence of the target electromagnetic radiation, the local electric field enhancement in the region of the spacing 925 of resonator structure 924 results in a change of the photo-induced conductivity of the substrate 922. The conductivity of the substrate 922 in the region of spacing 925 can be measured using electrodes 926 and 928. The measured conductivity in the presence of the target electromagnetic radiation can be compared to the measured conductivity in the absence of the target electromagnetic radiation. A change in the measured conductivity can be indicative of the presence of the target electromagnetic radiation.

The detector element 920 of FIG. 9A can be used as a detector of the presence of the target electromagnetic radiation in an incident beam. A change in the measured photo-induced conductivity response of the substrate 922 can serve as an indicator of the presence in the incident beam of the target electromagnetic radiation having a frequency (or range of frequencies) within the detection range. In an example, a change in the measured photo-induced conductivity response of the substrate 922 above a threshold value can serve as an indicator of the presence of the target electromagnetic radiation. The threshold value for a detector element may be determined based on the noise of the conductivity signal measured using the electrodes or based on a measurement sensitivity limit of the instrument probing the change in conductivity at the electrodes.

Detector element 920 of FIG. 9A also can be used to provide an indication of the power of the target electromagnetic radiation in an incident beam. The amount of photo-induced conductivity response of the substrate 922, as measured using the electrodes 926 and 928 can be related to the power of the target electromagnetic radiation. In another example, detector element 920 can be used to provide an indication of the spatial profile of the target electromagnetic radiation.

In an example, the substrate 922 of detector element 920 of FIG. 9B is a dielectric or semiconductor material, as described above. The conductive structures 924a and 924b can be formed from a conductive metal, a conductive metal oxide, or other conductive material, as described above. The electrodes 926 and 928 can be formed from a conductive metal, a conductive metal oxide, or other conductive material, as described above.

Figure 10A:
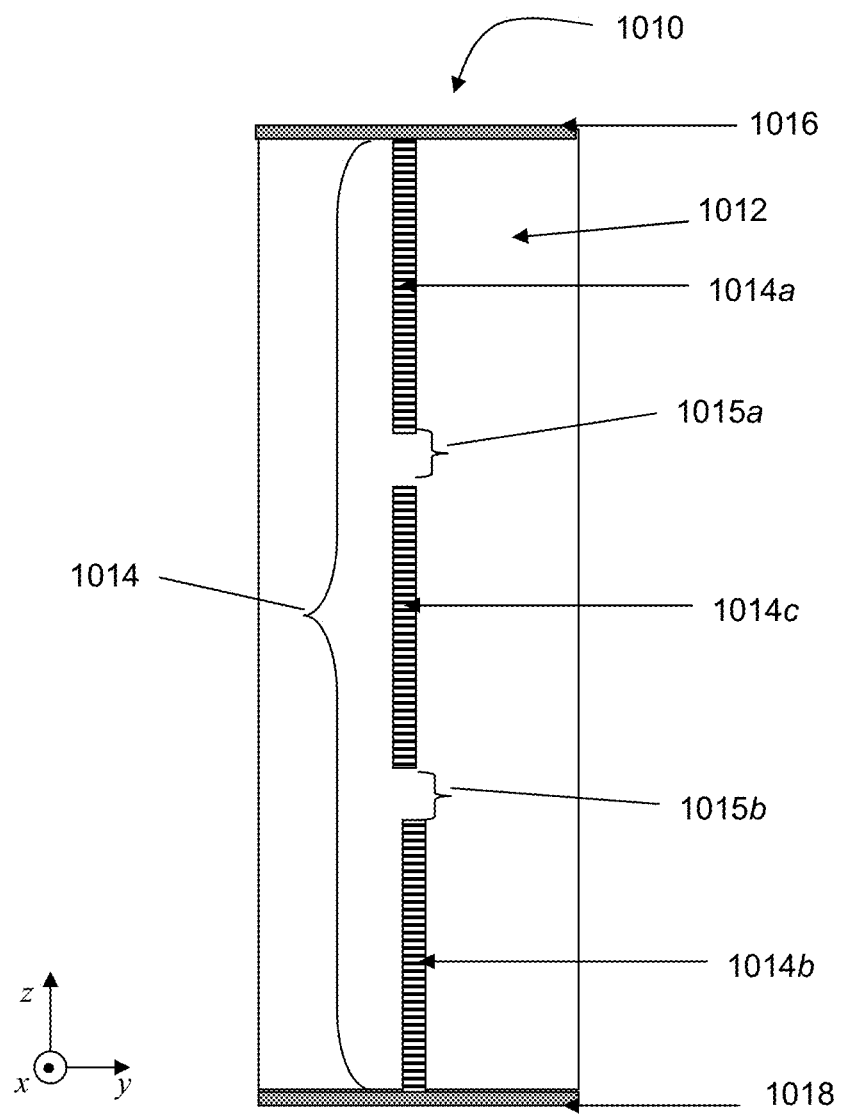
FIG. 10A shows another example detector element with an antenna arrangement of conductive structures, according to principles of the present disclosure.

Another example detector element 1010 is illustrated in FIG. 10A. The detector element includes a substrate 1012 and a resonator structure 1014 disposed on the surface of substrate 1012 (where the substrate surface lies in a y-z plane). Resonator structure 1014 is formed from three conductive structures 1014a, 1014b, and 1014c that are aligned in a longitudinal antenna arrangement. That is, detector element 1010 is similar to detector element 900 except that an additional conductive structure 1014c is positioned between and spaced apart from the top conductive structure 1014a and the bottom conductive structure 1014b. Based on the axes defined in FIG. 9A, the conductive structures 1014a, 1014b, and 1014c are aligned along a z-direction of the substrate. Adjacent ends of conductive structures 1014a, 1014b, and 1014c are spaced apart by a spacing 1015a or 1015b in the z-direction. Electrodes 1016 and 1018 are in electrical communication with the resonator structure 1014. Electrode 1016 is depicted as being in electrical communication with a region of conductive structure 1014a at a position away from the spacing 1015a. Similarly, electrode 1018 is depicted as being in electrical communication with a region of conductive structure 1014c at a position away from the spacing 1015b. As shown in the non-limiting example of FIG. 10A, electrodes 1016 and 1018 can be disposed at or near opposite ends of the substrate 1012 in the z-direction and oriented along the y-direction. In the example of FIG. 10A, electrodes 1016 and 1018 are disposed on the substrate 1012. In another example, electrodes 1016 and 1018 may be disposed substantially at the edges of the substrate 1012 (e.g., the edges of substrate 1012 aligned along the y-direction).

In an example, the resonator structure 1014 is configured to target a specific frequency of electromagnetic radiation (or range of frequencies) within the detection range. The length of conductive structures 1014a, 1014b, and 1014c in resonator structure 1014 is selected based on the frequency (or range of frequencies) of the electromagnetic radiation to be detected. In an example, the resonator structure 1014 can be of a length that is less than a wavelength of the target electromagnetic radiation (i.e., ranging from about 3.0 µm to about 3.0 mm). In another example, the resonator structure 1014 can be of a length that is greater than or approximately equal to a wavelength of the target electromagnetic radiation such that the target electromagnetic radiation resonates with higher order modes of the resonator structure. Although each conductive structure 1014a, conductive structure 1014b, and conductive structure 1014c is illustrated as having a same length, the lengths may be different. For example, conductive structure 1014a and conductive structure 1014b may have a different length compared to conductive structure 1014c. In addition, the lengths of conductive structure 1014a and conductive structure 1014b may differ from each other. The spacing 1015a and 1015b are selected such that the local electric field enhancement in the spacings 1015a, and 1015b in the presence of the target electromagnetic radiation results in the resonator structure 1014 resonating with the frequency of that target electromagnetic radiation. In an example, spacings 1015a, and 1015b are each around 1.0 microns (µm). Each of the spacings 1015a, and 1015b can be less than about, or greater than about 1.0 microns (µm).

In an example operation, the detector element 1010 is exposed to a beam of electromagnetic radiation that may include the target electromagnetic radiation having a frequency (or range of frequencies) within the detection range. In the presence of the target electromagnetic radiation, the local electric field enhancement in the region of the spacings 1015a, and 1015b of resonator structure 1014 results in a change of the photo-induced conductivity of the substrate 1012. The conductivity of the substrate 1012 can be measured using electrodes 1016 and 1018. The measured conductivity in the presence of the target electromagnetic radiation can be compared to the measured conductivity in the absence of the target electromagnetic radiation. A change in the measured conductivity can be indicative of the presence of the target electromagnetic radiation. Similarly to as described above in connection with FIG. 9A, detector element 1010 also can be used to detect the presence, power, and/or spatial profile of the target electromagnetic radiation.

All of the principles described above for the components, materials, features, and operation of detector element 900 of FIG. 9A or detector element 920 of FIG. 9B apply to the respective components, materials, features, and operation of detector element 1010.

Figure 10B:
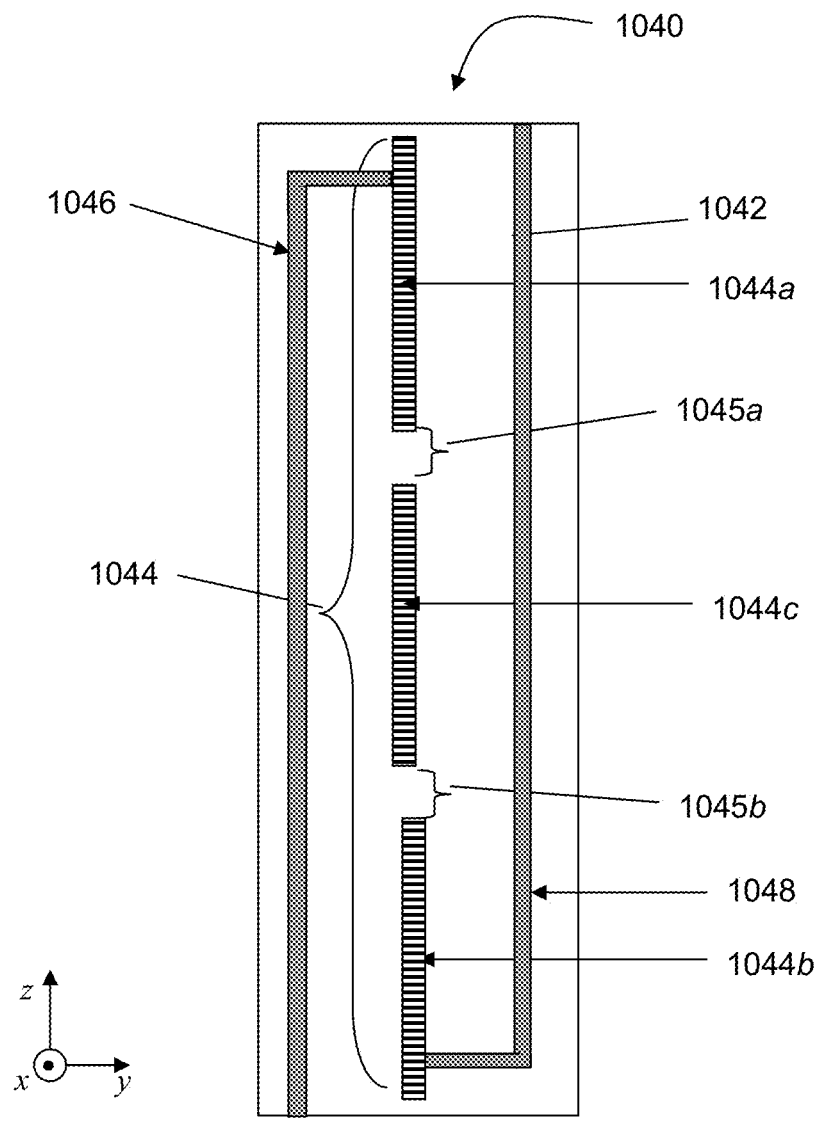
FIG. 10B shows another example detector element with an antenna arrangement of conductive structures, according to principles of the present disclosure.

Yet another example detector element 1040 is illustrated in FIG. 10B. The detector element includes a substrate 1042 and a resonator structure 1044 disposed on the surface of substrate 1042 (where the substrate surface lies in a y-z plane). Resonator structure 1044 is formed from three conductive structures 1044a, 1044b, and 1044c that are aligned in a longitudinal antenna arrangement. That is, detector element 1040 is similar to detector element 920 except that an additional conductive structure 1044c is positioned between and spaced apart from the top conductive structure 1044a and the bottom conductive structure 1044b. Based on the axes defined in FIG. 9B, the conductive structures 1044a, 1044b, and 1044c are aligned along a z-direction of the substrate. Adjacent ends of conductive structures 1044a, 1044b, and 1044c are spaced apart by a spacing 1045a or 1045b in the z-direction. Electrodes 1046, 1048 are in electrical communication with the resonator structure 1044. Electrode 1046 is depicted as being in electrical communication with a region of conductive structure 1044a at a position away from the spacing 1045a. Similarly, electrode 1048 is depicted as being in electrical communication with a region of conductive structure 1044c at a position away from the spacing 1045b.

In the non-limiting example depicted in FIG. 10B, electrodes 1046 and 1048 are disposed on the substrate 1042. As depicted, portions of electrodes 1046 and 1048 are disposed near opposite ends of the substrate 1042 in the z-direction and oriented in the y-direction, while other portions of the electrodes 1046 and 1048 run substantially parallel to conductive structures 1044a, 1044b, and 1044c in the z-direction.

In an example, the resonator structure 1044 is configured to target a specific frequency of electromagnetic radiation (or range of frequencies) within the detection range. The length of conductive structures 1044a, 1044b, and 1044c in resonator structure 1044 is selected based on the frequency (or range of frequencies) of the electromagnetic radiation to be detected. In an example, the resonator structure 1044 can be of a length that is less than a wavelength of the target electromagnetic radiation (i.e., ranging from about 3.0 µm to about 3.0 mm). In another example, the resonator structure 1044 can be of a length that is greater than or approximately equal to a wavelength of the target electromagnetic radiation such that the target electromagnetic radiation resonates with higher order modes of the resonator structure. Although each conductive structure 1044a, conductive structure 1044b, and conductive structure 1044c is illustrated as having a same length, the lengths may be different. For example, conductive structure 1044a and conductive structure 1044b may have a different length compared to conductive structure 1044c. In addition, the lengths of conductive structure 1044a and conductive structure 1044b may differ from each other. The spacing 1045a and 1045b are selected such that the local electric field enhancement in the spacings 1045a and 1045b in the presence of the target electromagnetic radiation results in the resonator structure 1044 resonating with the frequency of that target electromagnetic radiation. In an example, spacings 1045a and 1045b are each around 1.0 microns (µm). Each of the spacings 1045a and 1045b can be less than about, or greater than about 1.0 microns (µm).

In an example operation, the detector element 1040 is exposed to a beam of electromagnetic radiation that may include the target electromagnetic radiation having a frequency (or range of frequencies) within the detection range. In the presence of the target electromagnetic radiation, the local electric field enhancement in the region of the spacings 1045a and 1045b of resonator structure 1044 results in a change of the photo-induced conductivity of the substrate 1042. The conductivity of the substrate 1042 can be measured using electrodes 1046 and 1048. The measured conductivity in the presence of the target electromagnetic radiation can be compared to the measured conductivity in the absence of the target electromagnetic radiation. A change in the measured conductivity can be indicative of the presence of the target electromagnetic radiation. Similarly to as described above in connection with FIG. 9A or 9B, detector element 1040 also can be used to detect the presence, power, and/or spatial profile of the target electromagnetic radiation.

All of the principles described above for the components, materials, features, and operation of detector element 900 of FIG. 9A or detector element 920 of FIG. 9B apply to the respective components, materials, features, and operation of detector element 1040.

In another example, a detector element may be formed substantially as illustrated in FIG. 10A, but include more than one additional conductive structure positioned between and spaced apart from the top conductive structure and the bottom conductive structure. Each of the additional conductive structures positioned is also spaced apart from each of the other additional conductive structures. All of the principles described above for the components, materials, features, and operation of detector element 900 of FIG. 9A and detector element 1010 of FIG. 10B apply to the respective components, materials, features, and operation of this example detector element.

Figure 11:
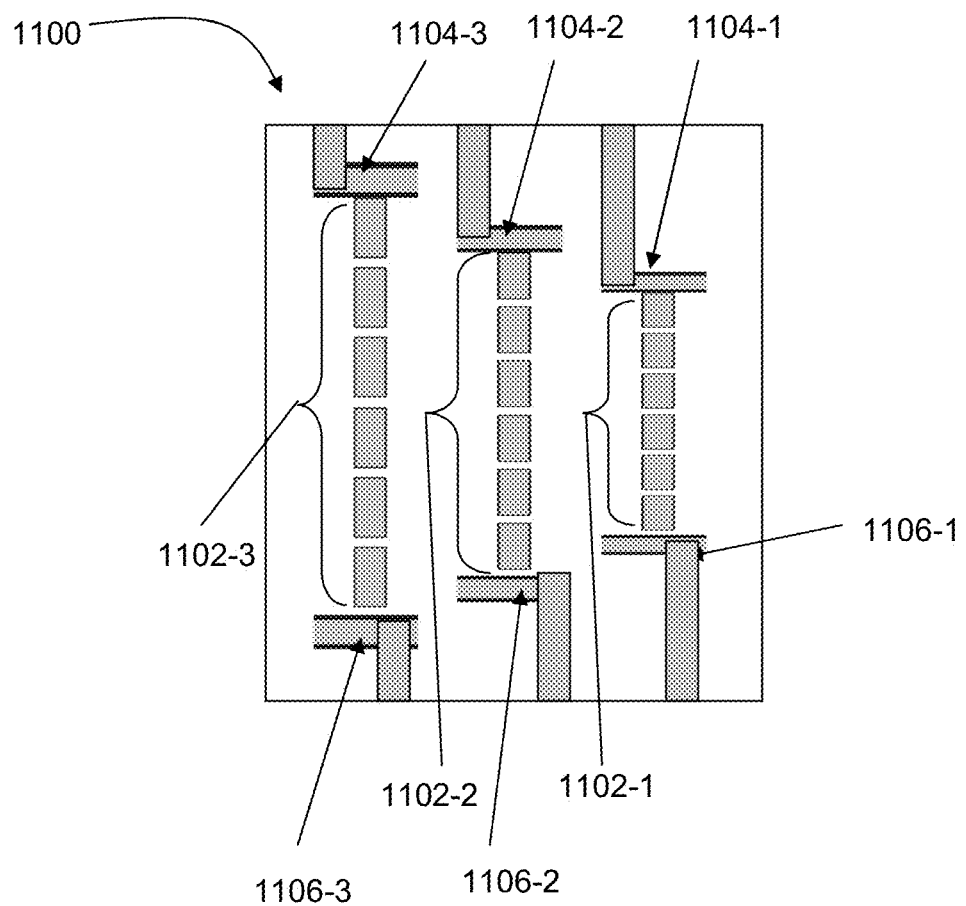
FIG. 11 shows an example detector element formed from conductive structures in an antenna arrangement, according to principles of the present disclosure.

FIG. 11 illustrates an example where a detector element is formed from multiple resonator structures. In the non-limiting example of FIG. 11, the example detector element 1100 is formed from three resonator structures 1102-*i* (i=1, 2, and 3), each disposed between and in electrical communication with respective pairs of electrodes 1104-*i* and 1106-*i* (i=1, 2, and 3). All of the principles described above for the components, materials, features, and operation of the detector elements of FIGS. 9A, 9B, 10A and 10B apply to the respective components, materials, features, and operation of this example detector element.

The detector element 1100 is configured to target several different specific frequencies (or ranges of frequencies) of electromagnetic radiation within the detection range. The three resonator structures 1102-*i* are each of different lengths. As a result, each of the resonator structures 1102-*i* can be configured to target a different specific frequency (or range of frequencies) of electromagnetic radiation within the detection range. That is, the length of resonator structure 1102-1 is configured based on a specific frequency (or range of frequencies) of the electromagnetic radiation to be detected. As illustrated, the length of resonator structure 1102-2 is greater than that of resonator structure 1102-1, and as a result resonator structure 1102-2 is configured to detect a lower frequency (or a lower range of frequencies) of electromagnetic radiation than that detected using resonator structure 1102-1. Although a central value of the range of frequencies of electromagnetic radiation detected using resonator structure 1102-2 is lower than a central value of the range of frequencies of electromagnetic radiation detected using resonator structure 1102-1, portions of these ranges of frequencies may overlap. As defined herein, the "central value" of a range of frequencies may be a mean, a mode or a median frequency of the range of frequencies. As illustrated in FIG. 11, the length of resonator structure 1102-3 is greater than that of resonator structure 1102-2, and as a result resonator structure 1102-3 is configured to detect a lower frequency (or a lower range of frequencies) of electromagnetic radiation than that detected using resonator structure 1102-2 and 1102-1. Although a central value of the range of frequencies of electromagnetic radiation detected using resonator structure 1102-3 is lower than a central value of the range of frequencies of electromagnetic radiation detected using resonator structure 1102-2, portions of these ranges of frequencies may overlap.

The three resonator structures 1102-*i* are each of different lengths that range from about 3.0 µm to about 3.0 mm. Each of the three resonator structures 1102-*i* is of a length that is less than the wavelength of the respective electromagnetic radiation that it is configured to target. The spacings between the conductive structures of each resonator structure 1102-*i* is selected such that the local electric field enhancement in the spacings in the presence of the target electromagnetic radiation results in the respective resonator structures 1102-*i* resonating with the frequency of its respective target electromagnetic radiation. In an example, the spacings between the conductive structures of resonator structures 1102-*i* may be substantially the same. For example, the spacings between the conductive structures can be around 1.0 µm. In another example, the spacings between the conductive structures of resonator structures 1102-3 may be greater than the spacings between the conductive structures of resonator structures 1102-2. In another example, the spacings between the conductive structures of resonator structures 1102-2 may be greater than the spacings between the conductive structures of resonator structures 1102-1.

Each of the three resonator structures 1102-*i* is illustrated in FIG. 11 as including six conductive structures disposed between the respective electrodes. However, in another example, each of the resonator structures 1102-*i* (i=1, 2, and 3) can include fewer than or more than six conductive structures disposed between the respective electrodes. The lengths of the conductive structures and the spacings between these conductive structures for each of the resonator structures 1102-*i* is configured according to the principles described herein so that the resonator structure 1102-*i* targets a different, specific frequency (or range of frequencies) of electromagnetic radiation within the detection range.

Figure 12:
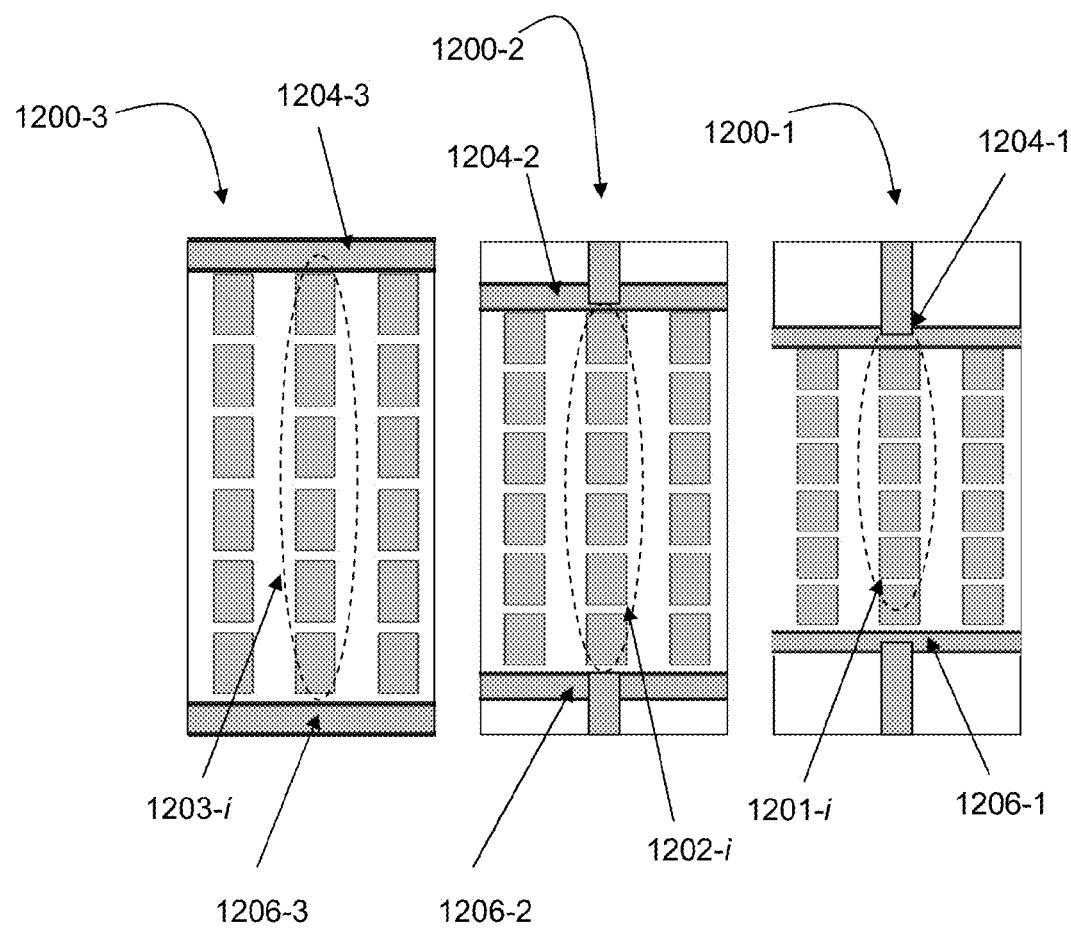
FIG. 12 shows another example of detector elements formed from conductive structures in an antenna arrangement, according to principles of the present disclosure.

FIG. 12 illustrates other examples of detector elements that are each be formed from multiple resonator structures. In the non-limiting example of FIG. 12, each detector element 1200-*j* (j=1, 2, and 3) is formed from three resonator structures disposed between and in electrical communication with respective pairs of electrodes. In another example, each detector element 1200-*j* may be formed from differing numbers of resonator structures. Detector element 1200-1 is formed from three resonator structures 1201-*i* (i=1, 2, and 3) disposed between and in electrical communication with respective pairs of electrodes 1204-1 and 1206-1. Detector element 1200-2 is formed from three resonator structures 1202-*i* (i=1, 2, and 3) disposed between and in electrical communication with respective pairs of electrodes 1204-2 and 1206-2. Detector element 1200-3 is formed from three resonator structures 1203-*i* (i=1, 2, and 3) disposed between and in electrical communication with respective pairs of electrodes 1204-3 and 1206-3. All of the principles described above for the components, materials, features, and operation of the detector elements of FIGS. 9A, 9B, 10A and 10B apply to the respective components, materials, features, and operation of this example detector element.

The three sets of resonator structures 1201-$i$, 1202-$i$, and 1203-$i$ are each of different lengths. As a result, each of the detector elements 1200-$j$ is configured to target a different specific frequency (or range of frequencies) of electromagnetic radiation within the detection range. That is, the length of resonator structures 1201-$i$ is configured based on a specific frequency (or range of frequencies) of the electromagnetic radiation to be detected. As illustrated, the length of resonator structures 1202-$i$ is greater than that of resonator structures 1201-$i$, and as a result detector element 1200-2 is configured to detect a lower frequency (or a lower range of frequencies) of electromagnetic radiation than that detected using detector element 1200-1. Although a central value of the range of frequencies of electromagnetic radiation detected using resonator structures 1202-$i$ is lower than a central value of the range of frequencies of electromagnetic radiation detected using resonator structures 1201-$i$, portions of these ranges of frequencies may overlap. As illustrated in FIG. 12, the length of resonator structures 1203-$i$ is greater than that of resonator structures 1202-$i$, and as a result detector element 1200-3 is configured to detect a lower frequency (or a lower range of frequencies) of electromagnetic radiation than that detected using detector elements 1200-2 and 1200-1. Although a central value of the range of frequencies of electromagnetic radiation detected using resonator structures 1203-$i$ is lower than a central value of the range of frequencies of electromagnetic radiation detected using resonator structures 1202-$i$, portions of these ranges of frequencies may overlap.

The three detector elements 1200-$j$ are configured with resonator structures 1201-$i$, 1202-$i$, and 1203-$i$ of different lengths that range from about 3.0 µm to about 3.0 mm. The resonator structures 1201-$i$, 1202-$i$, and 1203-$i$ of each detector element 1200-$j$ are of a length that is less than the wavelength of the respective electromagnetic radiation that the respective detector element 1200-$j$ is configured to target. The spacings between the conductive structures of each resonator structure 1201-$i$, 1202-$i$, and 1203-$i$ is selected such that the local electric field enhancement in the spacings in the presence of the target electromagnetic radiation results in the respective resonator structure 1201-$i$, 1202-$i$, or 1203-$i$ resonating with the frequency of its respective target electromagnetic radiation. In an example, the spacings between the conductive structures of resonator structures 1201-$i$, 1202-$i$, or 1203-$i$ may be substantially the same. For example, the spacings between the conductive structures can be around 1.0 µm. In another example, the spacings between the conductive structures of resonator structures 1203-$i$ may be greater than the spacings between the conductive structures of resonator structures 1202-$i$. In another example, the spacings between the conductive structures of resonator structures 1202-$i$ may be greater than the spacings between the conductive structures of resonator structures 1201-$i$.

In the example of FIG. 12, each of the resonator structures 1201-$i$ (i=1, 2, and 3), 1202-$i$ (i=1, 2, and 3), and 1203-$i$ (i=1, 2, and 3) includes six conductive structures disposed between the respective electrodes. However, in another example, each of the resonator structures 1201-$i$ (i=1, 2, and 3), 1202-$i$ (i=1, 2, and 3), and 1203-$i$ (i=1, 2, and 3) can include fewer than or more than six conductive structures disposed between the respective electrodes. The lengths of the conductive structures and the spacings between the conductive structures for each of the resonator structures 1201-$i$ (i=1, 2, and 3), 1202-$i$ (i=1, 2, and 3), and 1203-$i$ (i=1, 2, and 3) is configured according to the principles described herein so that the resonator structure 1201-$i$ (i=1, 2, and 3), 1202-$i$ (i=1, 2, and 3), and 1203-$i$ (i=1, 2, and 3) targets the different, specific frequency (or range of frequencies) of electromagnetic radiation within the detection range.

Figure 13A:
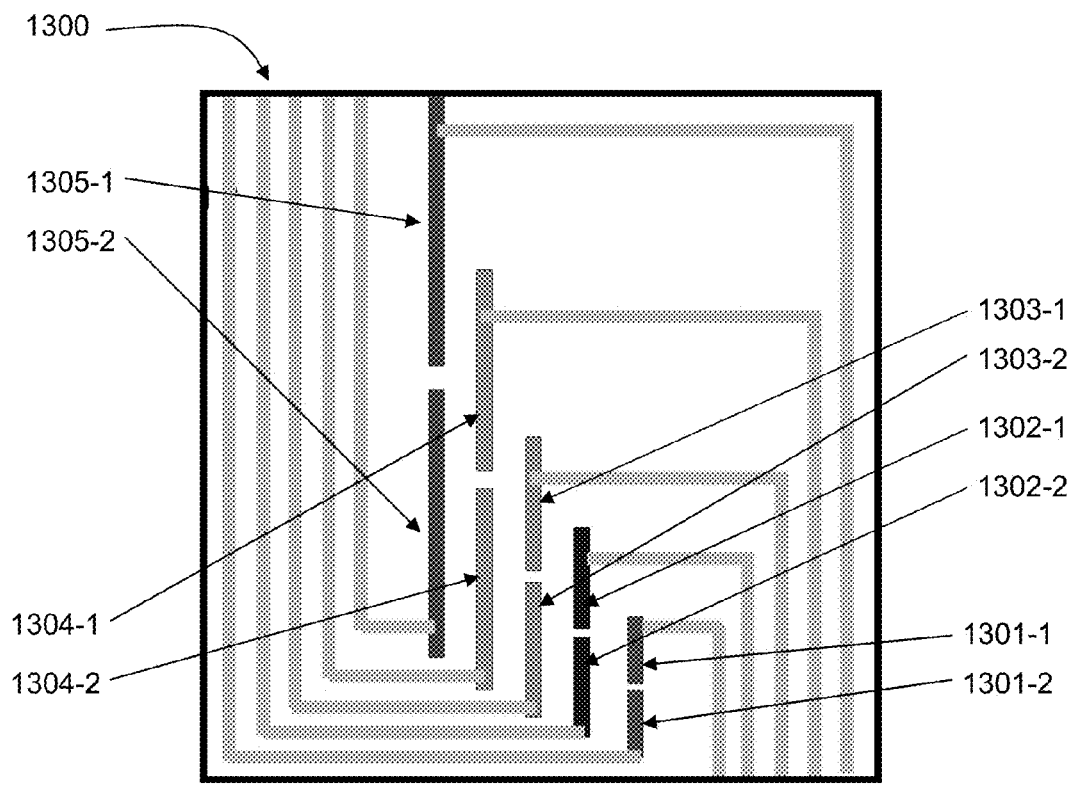
FIG. 13A shows another example of detector elements formed from an arrangement of resonator structures, according to principles of the present disclosure.

FIG. 13A illustrates yet another example of a detector element 1300 that is formed from multiple resonator structures. In the non-limiting example of FIG. 13A, each resonator structure 1301-$i$ (i=1 and 2), 1302-$i$ (i=1 and 2), 1303-$i$ (i=1 and 2), 1304-$i$ (i=1 and 2), and 1305-$i$ (i=1 and 2), and their respective electrodes, are based on a similar form and conformation as the resonator structure 924 and electrodes 926, and 928 described in connection with FIG. 9B. Each resonator structure 1301-$i$ (i=1 and 2), 1302-$i$ (i=1 and 2), 1303-$i$ (i=1 and 2), 1304-$i$ (i=1 and 2), and 1305-$i$ (i=1 and 2) of FIG. 13A is formed from a pair of conductive structures disposed between and in electrical communication with respective pairs of electrodes. All of the principles described above for the components, materials, features, and operation of the detector elements of FIGS. 9A, 9B, 10A and 10B apply to the respective components, materials, features, and operation of this example detector element.

The five sets of resonator structures 1301-$i$ (i=1 and 2), 1302-$i$ (i=1 and 2), 1303-$i$ (i=1 and 2), 1304-$i$ (i=1 and 2), and 1305-$i$ (i=1 and 2) are each of different lengths. As a result, detector element 1300 is configured to target several different specific frequencies (or ranges of frequencies) of electromagnetic radiation within the detection range. That is, the length of resonator structures 1301-$i$ (i=1 and 2) is configured based on a specific frequency (or range of frequencies) of the electromagnetic radiation to be detected. As illustrated, the length of resonator structures 1302-$i$ (i=1 and 2) is greater than that of resonator structures 1301-$i$ (i=1 and 2), and as a result resonator structures 1302-$i$ (i=1 and 2) are configured to detect a lower frequency (or a lower range of frequencies) of electromagnetic radiation than that detected using resonator structures 1301-$i$ (i=1 and 2). Although a central value of the range of frequencies of electromagnetic radiation detected using resonator structures 1302-$i$ (i=1 and 2) is lower than a central value of the range of frequencies of electromagnetic radiation detected using resonator structures 1301-$i$ (i=1 and 2), portions of these ranges of frequencies may overlap. For similar reasons, resonator structures 1303-$i$ (i=1 and 2) is configured to detect a lower frequency (or a lower range of frequencies) of electromagnetic radiation than resonator structures 1302-$i$ (i=1 and 2), resonator structures 1304-$i$ (i=1 and 2) is configured to detect a lower frequency (or a lower range of frequencies) of electromagnetic radiation than resonator structures 1303-$i$ (i=1 and 2), and resonator structures 1305-$i$ (i=1 and 2) is configured to detect a lower frequency (or a lower range of frequencies) of electromagnetic radiation than resonator structures 1304-$i$ (i=1 and 2). Also, although the central values of the range of frequencies detected by each of the resonator structures differ, some portion of these ranges of frequencies may overlap.

The resonator structures 1301-$i$ (i=1 and 2), 1302-$i$ (i=1 and 2), 1303-$i$ (i=1 and 2), 1304-$i$ (i=1 and 2), and 1305-$i$ (i=1 and 2) are each of different lengths that range from about 3.0 µm to about 3.0 mm. The length of each of resonator structures 1301-$i$ (i=1 and 2), 1302-$i$ (i=1 and 2), 1303-$i$ (i=1 and 2), 1304-$i$ (i=1 and 2), and 1305-$i$ (i=1 and 2) is less than the wavelength of the respective electromagnetic radiation that they are configured to target. The spacings between the conductive structures of resonator structure 1301-$i$ (i=1 and 2), 1302-$i$ (i=1 and 2), 1303-$i$ (i=1 and 2), 1304-$i$ (i=1 and 2), and 1305-$i$ (i=1 and 2) is selected such that the local electric field enhancement in the spacings in the presence of the target electromagnetic radiation results in the respective resonator structures 1301-$i$ (i=1 and 2), 1302-$i$ (i=1 and 2), 1303-$i$ (i=1 and 2), 1304-*i* (i=1 and 2), or 1305-*i* (i=1 and 2) resonating with the frequency (or range of frequencies) of its respective target electromagnetic radiation. In an example, the spacings between the conductive structures of resonator structures 1301-*i* (i=1 and 2), 1302-*i* (i=1 and 2), 1303-*i* (i=1 and 2), 1304-*i* (i=1 and 2), and 1305-*i* (i=1 and 2) may be substantially the same (around 1.0 µm). In another example, the width of the spacings between the conductive structures of the resonator structures 1301-*i* (i=1 and 2), 1302-*i* (i=1 and 2), 1303-*i* (i=1 and 2), 1304-*i* (i=1 and 2), and 1305-*i* (i=1 and 2) decreases similarly with the decrease in their length.

The lengths of the conductive structures and the spacings between the conductive structures for each of the resonator structures 1301-*i* (i=1 and 2), 1302-*i* (i=1 and 2), 1303-*i* (i=1 and 2), 1304-*i* (i=1 and 2), and 1305-*i* (i=1 and 2) are configured according to the principles described herein so that the resonator structure 1301-*i* (i=1 and 2), 1302-*i* (i=1 and 2), 1303-*i* (i=1 and 2), 1304-*i* (i=1 and 2), and 1305-*i* (i=1 and 2) targets the different, specific frequency (or range of frequencies) of electromagnetic radiation within the detection range.

Figure 13B:
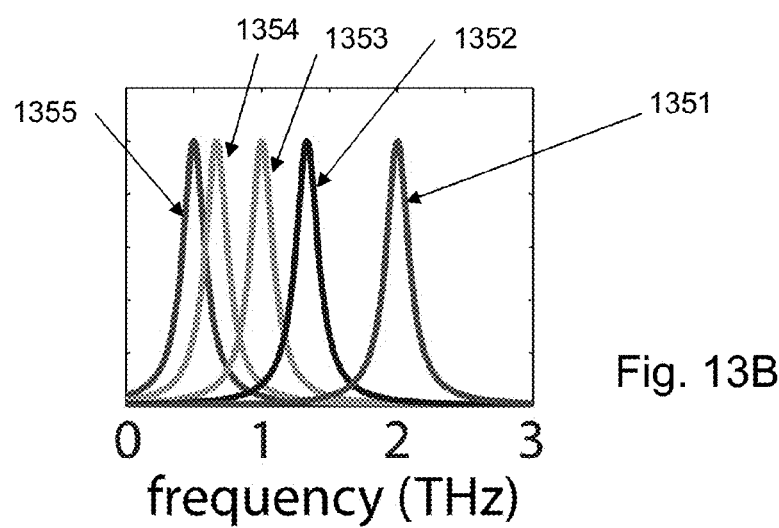
FIG. 13B shows a plot of frequencies of electromagnetic radiation that can be detected using the detector element of FIG. 13A, according to principles of the present disclosure.

FIG. 13B illustrates example electromagnetic spectral ranges within the detection range that the resonator structures of detector element 1300 can be configured to detect. In the example of FIG. 13B, resonator structures 1301-*i* (i=1 and 2) are configured to detect electromagnetic radiation in the range of frequencies of curve 1351. The resonator structures 1302-*i* (i=1 and 2) are configured to detect electromagnetic radiation in the range of frequencies of curve 1352. The resonator structures 1303-*i* (i=1 and 2) are configured to detect electromagnetic radiation in the range of frequencies of curve 1353. The resonator structures 1304-*i* (i=1 and 2) are configured to detect electromagnetic radiation in the range of frequencies of curve 1354. The resonator structures 1305-*i* (i=1 and 2) are configured to detect electromagnetic radiation in the range of frequencies of curve 1355.

Figure 14A:
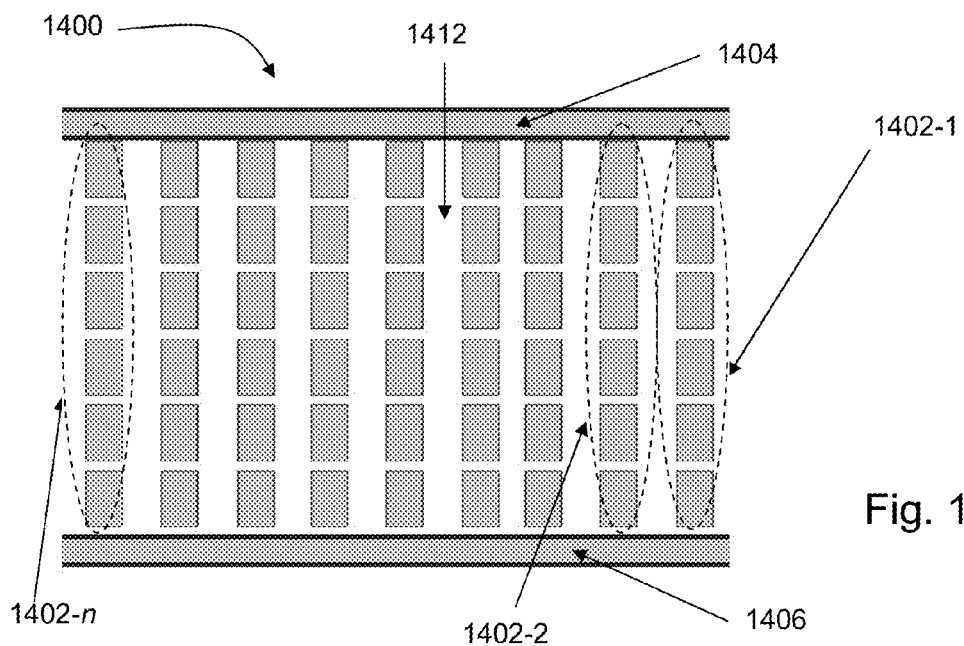
FIG. 14A shows an example detector formed from an arrangement of resonator structures, according to principles of the present disclosure.

FIG. 14A illustrates an example of a detector element 1400 that is formed from multiple resonator structures 1402-*i* (i=1, 2, 3 . . . n) disposed between and in electrical communication with electrodes 1404 and 1406. The resonator structures 1402-*i* (i=1, 2, 3 . . . n) and electrodes 1404 and 1406 are disposed on a substrate 1412. All of the principles described above for the components, materials, features, and operation of the detector elements of FIGS. 9A, 9B, 10A and 10B apply to the respective components, materials, features, and operation of this example detector element.

The detector element 1400 is configured as an antenna array (multiple resonator structures 1402-*i* (i=1, 2, 3 . . . n)) sandwiched between electrodes 1404 and 1406. The array and electrodes are deposited onto a suitable material that exhibits the desired nonlinear response in the presence of the localized enhanced electric field. The spacings can be about 1.0 µm to give a large electric field enhancement and the length of the conductive structures of the antenna array is configured to interact with a specific frequency of electromagnetic radiation. The detector element works as follows: electromagnetic radiation illuminates a portion of the detector, the light is absorbed by the antenna structures, enhancing the electric field in the spacings, the enhanced electric field liberates electrons changing the overall conductivity of the substrate, and the change in conductivity is measured electronically. In an example, the change in conductivity can be measured as a change in voltage across a resistor.

Figure 14B:
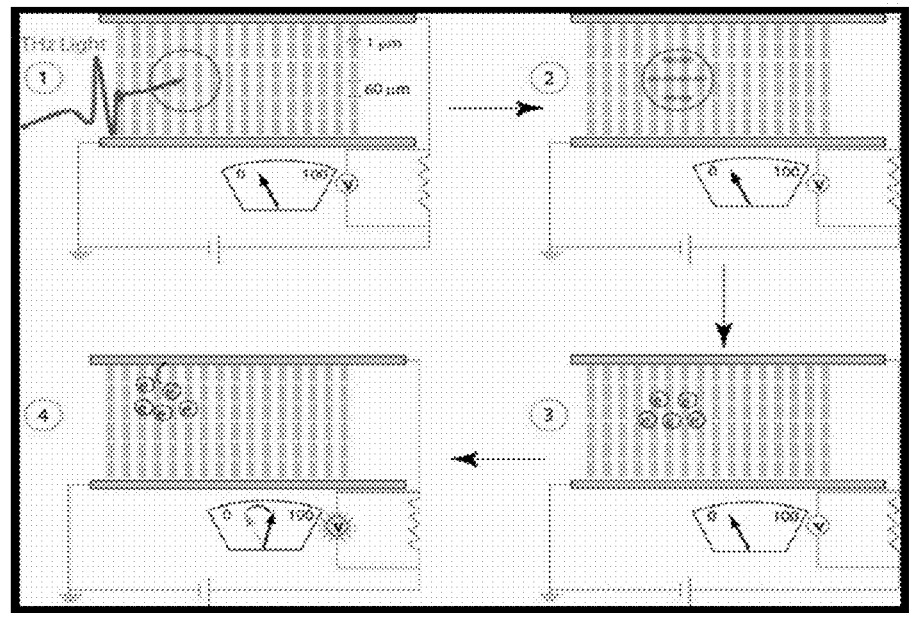
FIG. 14B shows an example use of the resonator structures of FIG. 14A as part of a detector or image sensor, according to principles of the present disclosure.

A non-limiting example operation of the detector element of FIG. 14A is shown in FIG. 14B. In panel (1) the detector element 1400 is exposed to a beam of electromagnetic radiation at a THz frequency. In panel (2) the resonator structures 1402-*i* (i=1, 2, 3 . . . n) interact with the electromagnetic radiation to provide an enhanced local electric field in at the spacings. In panel (3) charge carriers (in this example, they are electrons) are liberated in the substrate 1412 in the spacings by the enhanced electric field, which causes the overall conductivity of the substrate 1412 to increase. In panel (4), the relatively long-lasting change in conductivity (on the order of nanoseconds or longer) can be measured via the electrodes 1404 and 1406. In an example, the change in conductivity can be measured using high bandwidth amplifier electronics.

Figures 15A, 15B:
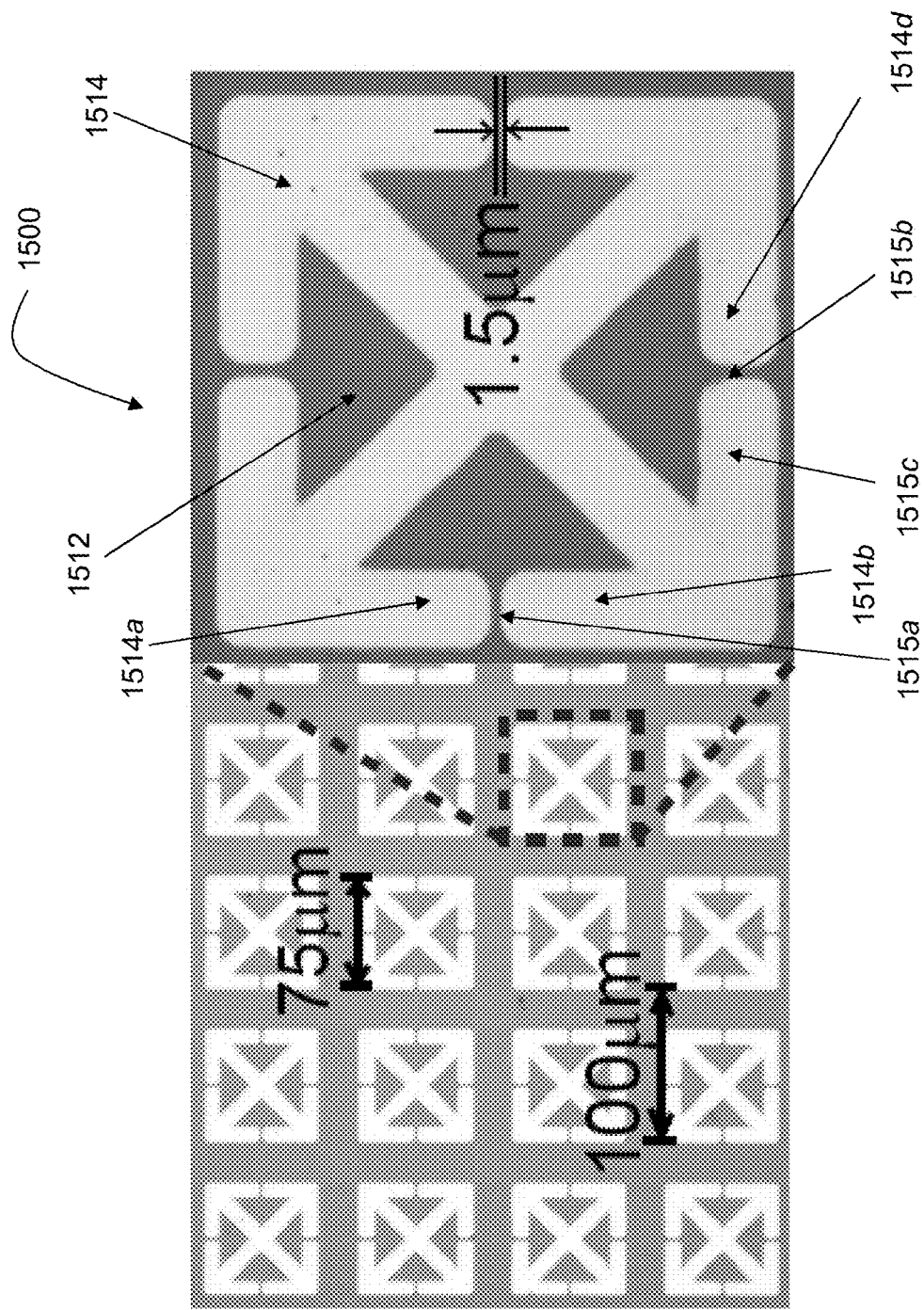
FIG. 15A shows an array of example split-ring resonator structures, according to principles of the present disclosure.
FIG. 15B shows a magnified view of one of the example split-ring resonator structures in the array of FIG. 15A, according to principles of the present disclosure.

Another example detector element 1500 is illustrated in FIGS. 15A and 15B. In FIG. 15B, the detector element 1500 is shown to include a substrate 1512 and a resonator structure 1514 disposed on the surface of substrate 1512. The substrate 1512 can be formed from a dielectric or semiconductor material, as described above. The resonator structure 1514 is formed from conductive structures patterned in a split-ring resonator (SRR) structure. The conductive structures can be formed from a conductive metal, a conductive metal oxide, or other conductive material, as described above. Resonator structure 1514 includes four spacings formed between conductive structures. For example, resonator structure 1514 includes spacing 1515*a* (formed between conductive structures 1514*a* and 1514*b*) and spacing 1515*b* (formed between conductive structures 1514*c* and 1514*d*). In the non-limiting example of FIG. 15B, each of the spacings (including spacings 1515*a* and 1515*b*) has a width of about 1.5 microns.

FIG. 15A shows a non-limiting example of a detector region formed from an array of the detector elements 1500 for FIG. 15B. In the non-limiting example of FIG. 15A, the resonator structures 1514 have a width of about 75 microns; the unit cell of each detector element 1500 has width of about 100 microns.

As described above, in the presence of target electromagnetic radiation (i.e., at a frequency within the detection range), there is a resonant response of the resonator structure. Charge carriers are generated in a region of the substrate near the spacings based on an enhanced electric field induced in the spacings. The change in conductivity based on these induced charge carriers can be measured (i.e., quantified) to indicate the presence of the target electromagnetic radiation. In an example, the conductivity measurement also can be used to quantify a magnitude of the incident electromagnetic radiation.

In an example, the resonator structures 1514 can be configured to target a specific frequency of electromagnetic radiation (or range of frequencies) within the detection range. For example, the length of resonator structures 1514 can be selected based on the frequency (or range of frequencies) of the electromagnetic radiation to be detected. In an example, the resonator structure 1514 can be of a length that is less than a wavelength of the target electromagnetic radiation (i.e., ranging from about 3.0 µm or less to about 3.0 mm or more). In another example, the resonator structure 1514 can be of a length that is greater than or approximately equal to a wavelength of the target electromagnetic radiation such that the target electromagnetic radiation resonates with higher order modes of the resonator structure. The size of the spacings is configured such that the local electric field enhancement in the spacings in the presence of the target electromagnetic radiation results in the resonator structure 1514 resonating with the target electromagnetic radiation. In an example, the spacings (including spacings 1515*a* and 1515*b*) can be around 1.0 microns (µm). In other examples, the spacings (including spacings 1515*a* and 1515*b*) can be less than about, or greater than about 1.0 microns (µm).

In an example operation, the detector element 1500 is exposed to a beam of electromagnetic radiation that may include the target electromagnetic radiation having a frequency (or range of frequencies) within the detection range. In the presence of the target electromagnetic radiation, the local electric field enhancement in the region of the spacings of the resonator structure 1514 results in a change of the photo-induced conductivity of the substrate 1512. The change in conductivity of the substrate 1512 can be measured using electrodes electrically coupled to at least one of the resonator structures, or using readout circuitry associated with the detector element. The measured conductivity in the presence of the target electromagnetic radiation can be compared to the measured conductivity in the absence of the target electromagnetic radiation. A change in the measured conductivity can be indicative of the presence of the target electromagnetic radiation.

The change in the measured photo-induced conductivity response of the substrate 1512 can serve as an indicator of the presence and/or the magnitude of the target electromagnetic radiation in the incident beam. The detector element 1500 of FIG. 2A also can be used to provide an indication of the spatial profile of the target electromagnetic radiation. In an example, a change in the measured photo-induced conductivity of the substrate 1512 above a pre-determined threshold value can serve as an indicator of the presence and/or magnitude of the target electromagnetic radiation, or a spatial extent of the target electromagnetic radiation. The pre-determined threshold value may be determined based on the level of noise of the conductivity measurements of the substrate or based on a sensitivity limit of the instrument or integrated circuit used to probe the change in conductivity of the substrate.

The array of FIG. 15A of the detector elements 1500 of FIG. 15B may include electrodes that are electrically coupled to the substrate 1512 or to the resonator structure(s) 1514 for measuring the change in conductivity due to the charge carriers induced in the substrate by the local electric field enhancement in the spacings (including spacings 1515a and 1515b). In another example, integrated circuitry coupled to substrate 1512 can be used for measuring the change in conductivity due to the charge carriers induced in the substrate by the local electric field enhancement in the spacings (including spacings 1515a and 1515b).

In another example, a resonator structure in the art can be implemented in detector elements and sensor elements, according to principles herein. Non-limiting examples of applicable resonator structures include C-ring SRRs, square SRRs, symmetrical-ring SRRs, omega structure resonators, spiral resonators, multi-spiral resonators, broad-side coupled SRRs, broad-side coupled spiral resonators, open SRRs, and open complementary SRRs.

As described above, in the presence of target electromagnetic radiation (i.e., at a frequency within the detection range), there can be a resonant response of these resonator structures. Charge carriers can generated in a region of the substrate of the resonator structures near a spacing in the structure based on an enhanced electric field induced in this spacing. The change in conductivity of the substrate can be measured using electrodes electrically coupled to at least one of the resonator structures, or using readout circuitry associated with the detector element. The measured conductivity in the presence of the target electromagnetic radiation can be compared to the measured conductivity in the absence of the target electromagnetic radiation. The change in conductivity based on these induced charge carriers can be measured (or otherwise quantified) to indicate the presence of the target electromagnetic radiation, or a property of the target electromagnetic radiation (including magnitude, spatial profile, polarization, etc.), as described above in connection with other examples. These resonator structures can be configured to target a specific frequency of electromagnetic radiation (or range of frequencies) within the detection range by scaling-up or scaling-down the dimensions, as described above in connection with other examples.

Detectors and Image Sensors

Detector elements that include metamaterial structures according to the principles described hereinabove are applicable in CMOS image sensors, CCD image sensors, or any other solid state image sensor technology, including hybrid CCD/CMOS technology. An image sensor that includes a detector element described herein can be implemented in a wide variety of sensing and imaging applications in a wide range of fields. Non-limiting examples of such fields include consumer electronics, commercial electronics, industrial electronics, aerospace electronics, inspection for security purposes, and medical diagnostics. A CMOS image sensor or CCD image sensor herein can be configured either as a front-illuminated sensor or a back-illuminated sensor.

Both the front-illuminated image sensor and the back-illuminated image sensor can be configured as one or more individual sensor elements. Each sensor element includes circuit elements, at least one detector element and a substrate. The circuit elements can include readout circuitry. In an example, the image sensors are formed from an array of the individual sensor elements. The array can be arranged in addressable rows and columns. Each sensor element can be constructed with the circuit elements disposed over, and on the same surface of the substrate as, the at least one detector element.

Figure 16:
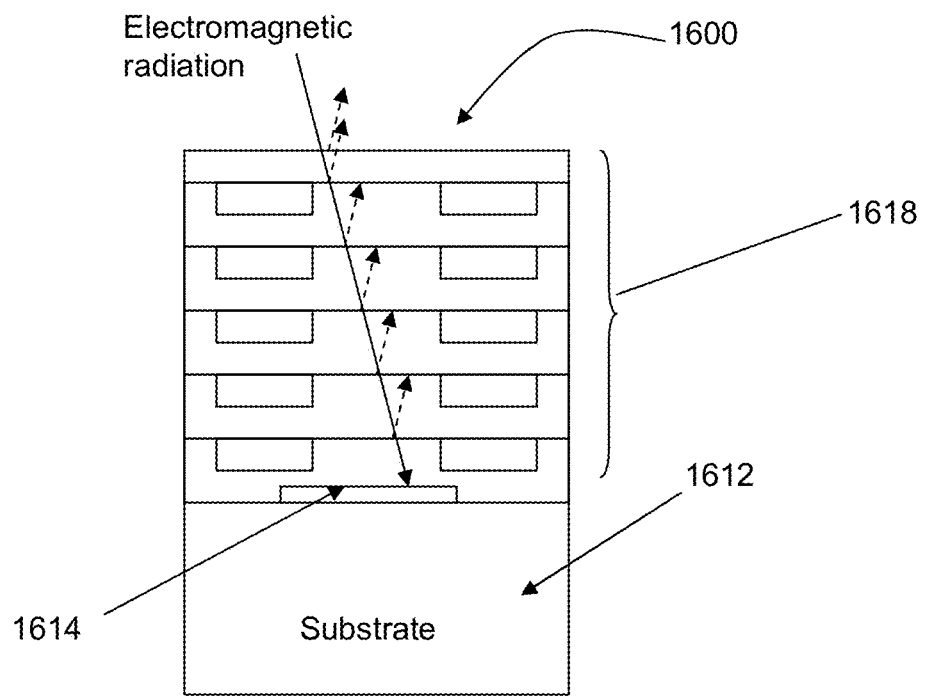
FIG. 16 shows an example front-illumination sensor element, according to principles of the present disclosure.

FIG. 16 shows a sensor element 1600 of an example front-illuminated image sensor. The sensor element 1600 includes a substrate 1612, one or more detector elements 1614 disposed over the substrate 1612, and circuit elements 1618 disposed over the one or more detector elements 1614.

Figure 17A:
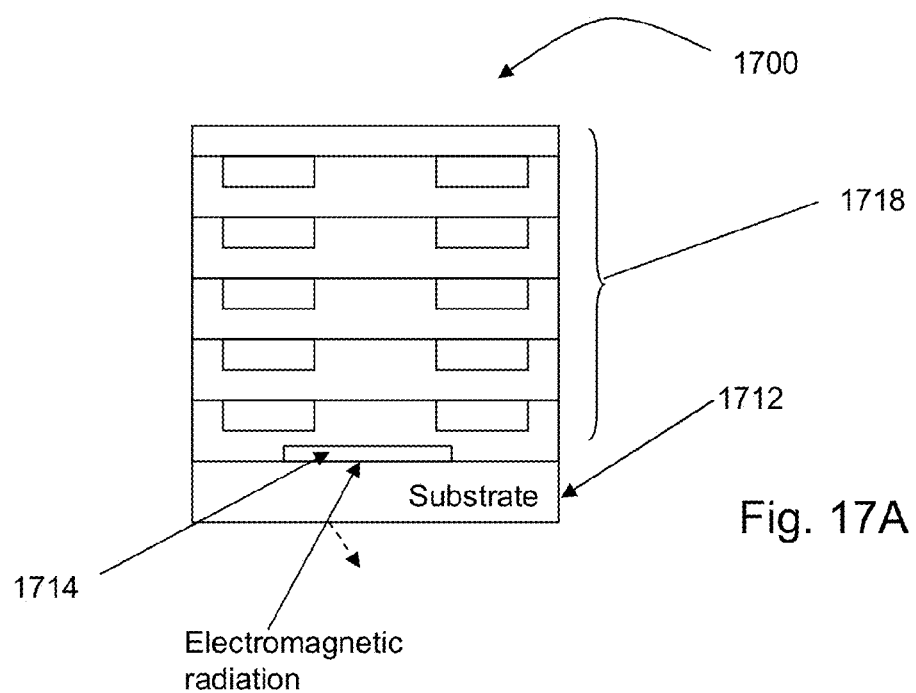
FIGS. 17A-B show example back-illumination sensor elements, according to principles of the present disclosure.
Figure 17B:
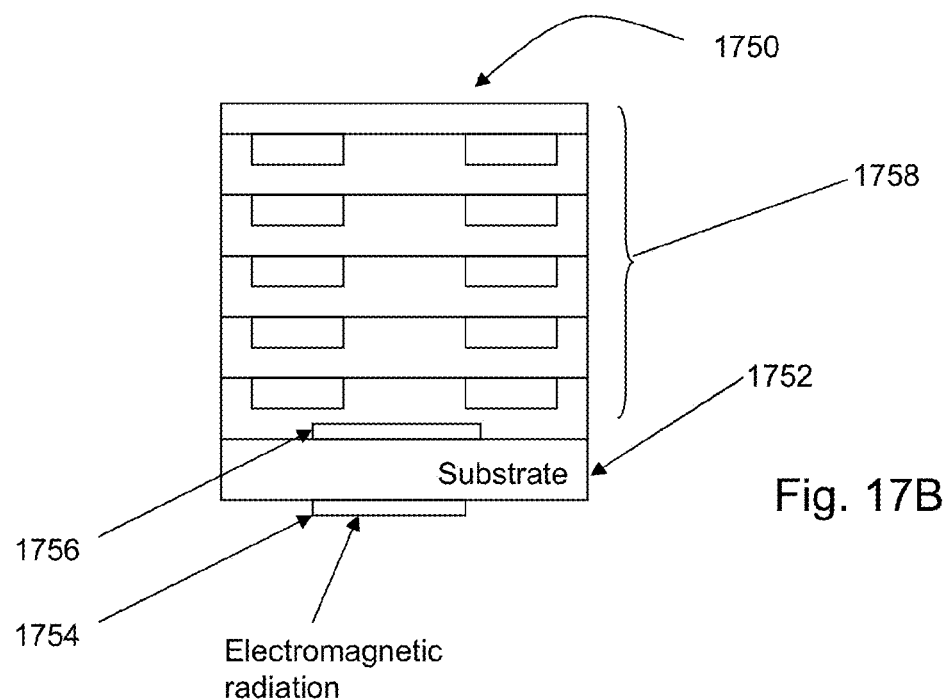

FIG. 17A shows a sensor element 1700 of an example back-illuminated image sensor. The sensor element 1700 also includes a substrate 1712, one or more detector elements 1714 disposed over the substrate 1712, and circuit elements 1718 disposed over the one or more detector elements 1714. FIG. 17B shows a sensor element 1750 of another example back-illuminated image sensor. The sensor element 1750 also includes a substrate 1752 and circuit elements 1758 disposed over the front surface of substrate 1752. The one or more detector elements 1754 are disposed on the opposite surface of the substrate 1752. Sensor element 1750 may include other components 1756 on the front surface of substrate 1752.

In an example, the total thickness of the layers of circuit element 1618, 1718 or 1758 can be about 5 or 6 microns or more.

In an example, the substrate of detector element 1614, detector element 1714 or detector element 1754 can be formed from a different material from the respective substrate 1612, substrate 1712 or substrate 1752. That is, detector element 1614, detector element 1714 or detector element 1754 can be formed from resonator structures disposed on their own dielectric or semiconductor substrate (as described above), which is then disposed on substrate 1612, substrate 1712 or substrate 1752, respectively, during fabrication. In such an example implementation, the sensor element 1600, 1700 or 1750 is configured such that there is little loss of charge carriers from the substrate of detector element 1614, 1714 or 1754 to substrate 1612, 1712 or 1752, respectively. In another example, detector element 1614, detector element 1714 and/or detector element 1754 can be formed from resonator structures disposed on a portion of substrate 1612, substrate 1712 or substrate 1752, respectively. In this example, that portion of substrate 1612, substrate 1712 or substrate 1752 is configured to be dielectric or semiconducting according to the desired properties of the resulting detector element (as described above). As non-limiting examples, resonator structures can be disposed on a portion of a silicon, GaAs, InGaAs, InAs, InP, or InSb sensor substrate, or other applicable sensor substrate, to provide detector element 1614, detector element 1714 or detector element 1754. The resonator structures can be disposed on a coating on such substrates, such as an anti-reflective coating. In any of these examples, the sensor element is configured such that the change in conductivity due to the induced charge carriers can be measured (or otherwise quantified) to indicate the presence of the target electromagnetic radiation, or a property of the target electromagnetic radiation (including magnitude, spatial profile, polarization, etc.), as described herein.

In an example, the circuit elements 1618, 1718 or 1758 of each sensor element includes three or four transistors that can be used to convert the generated charge carriers to a voltage signal to provide the output of the sensor element. For example, the circuit elements 1618, 1718 or 1758 can have a 3-T configuration that includes a reset transistor, a source-follower amplifier, and a sensor element select transistor. In another example, the circuit elements 1618, 1718 or 1758 can have a 4-T configuration that includes a transfer gate, a reset transistor, a source-follower amplifier, and a sensor element select transistor. In other examples, the circuit elements 1618, 1718 or 1758 may include at least one of a reset transistor, a charge transfer switch transistor, a source-follower amplifier, and/or a sensor element select transistor.

As shown in FIG. 16, a front-illuminated image sensor is configured such that it collects light that impinges on the front face of the sensor element, i.e., at the substrate surface that includes the circuit elements 1618 disposed over the one or more detector elements 1614. A back-illuminated image sensor, shown in FIG. 17A-B, is configured to collect electromagnetic radiation that impinges on the back face of the sensor element, i.e., at the opposite substrate surface. By thinning the substrate of the back-illuminated image sensor during the manufacturing process, light can penetrate through to the detector without passing through, or being reflected by, the circuit elements. For an example back-thinned sensor herein, the substrate can be thinned to a few microns in thickness, for example about 10 microns, about 6 microns, about 4 microns, or thinner. In another example, the substrate can be thinned to a tens of microns in thickness, for example about 20 microns, about 40 microns, about 70 microns, or thicker.

A front-illuminated imager sensor can be more cost effective to manufacture than back-illuminated imager sensors. However, a potential performance limitation of front-illuminated imager sensor can be a lower fill factor or lower sensitivity. For example, fill factor can be less than about 30%, which means that fewer than 30% of the light energy received by the sensor element is detected by the one or more detectors in the sensor element. The lower fill factor/lower sensitivity can be due to shadowing caused by the presence of opaque metal bus lines, absorption of light by portions of the circuit elements formed on the front surface in the detector element regions of the front-illuminated image sensor, and/or reflection of light at one or more of the interfaces between the adjacent dielectric layers formed in the CMOS fabrication process. The light transmission loss at the interfaces is proportional to the number of layers and the thickness of the layers. A back-illuminated semiconductor imaging sensor can pose some advantages over a front-illuminated image sensor, including a higher fill factor, potentially better overall efficiency of charge carrier generation and collection, and potentially better suitability for small pixel arrays.

A back-thinned sensor, formed from a back-illuminated imager sensor may exhibit loss of charge carriers near the back surface due to dangling bonds present at the silicon back surface. The dangling bonds could reduce quantum efficiency if the backside of the back-thinned image sensor element is not treated to reduce, if not remove, the dangling bonds. In back-illuminated imager sensors, photon radiation that enters the backside of the imager sensor generates charge carriers at or near the detector elements as described herein. The location of the charge generation about the detector elements depends on the absorption length of the incident photon, which in turn depends on its wavelength. Photons with longer wavelengths (i.e., light closer to the 300 GHz frequency range) penetrate deeper into the detector elements layer as compared to the shorter wavelengths (i.e., light closer to the 10 THz frequency range). A depletion layer can be included in the substrate to increase the efficiency of collection of the charge carriers. The depletion layer can be positioned such that charge carriers generated near the back side of the image sensor are collected efficiently. This also avoids horizontal drift of carriers into adjacent sensor elements, which may smear an image.

A back-thinned sensor, formed from a back-illuminated imager sensor may exhibit loss of charge carriers near the back surface due to dangling bonds present at the silicon back surface.

FIGS. 18A-D illustrates a schematic of absorption in a semiconductor device. For a conventional semiconductor-based optoelectronic device, incident electromagnetic radiation may travel a certain distance into the detector material before being absorbed, which then creates an electron-hole pair. As shown in FIG. 18A, longer wavelength electromagnetic radiation 1802 can penetrate farther into a material than shorter wavelength electromagnetic radiation 1804. For a device that includes a P-N junction (a depletion region) in the substrate, electron-hole generation should occurs in the depletion region in order for the charges to be properly separated. For a device having a thicker substrate (shown in FIG. 18B), electron-hole pairs generated by the longer wavelength electromagnetic radiation near the depletion region 1808 in the substrate can be collected for detection; electron-hole pairs generated with shorter wavelength electromagnetic radiation away from the depletion region recombine before they can be collected.

The substrate of a back-illuminated device is thinned such that shorter wavelength photons, which generate electron-hole pairs near the surface, can be detected since the thinned material results in electron-hole pair generation in the depletion region of the device. As shown in FIG. 18C, a back-thinned device can be optimized for collection of electron-hole pairs from shorter wavelength light. Such a device can be more sensitive to shorter wavelength electromagnetic radiation, since the electron-hole pairs generated by absorption of shorter wavelength electromagnetic radiation are in the depletion region of the device. Since the device is illuminated on the backside, there are no electrodes or circuitry that can block the one or more detector elements, so the electromagnetic radiation is more efficiently absorbed.

FIG. 18D shows a sensor element 1810 that is comprised of metamaterial structures according to the principles herein. This example implementation can provide a back-thinned, back-illuminated sensor device that is sensitive to much longer wavelengths of electromagnetic radiation since the concentration of the enhanced electric field in the spacings liberates electrons near the surface of the substrate. Since the back-illuminated device is thin and the depletion region is near the surface, electron-hole pairs can be collected efficiently. A measure of the change in conductivity based on the generated electron-hole pairs can be sued to provide an indication of the presence of the target electromagnetic radiation, or otherwise quantify a property of the target electromagnetic radiation (including magnitude, spatial profile, polarization, etc.). In a non-limiting example, these sensor elements can be included in an image sensor, such as but not limited to a camera.

In an example, an image sensor herein is fabricate in at least a two-step process. The detector elements can be fabricated by deposition of the conductive structures described herein on a dielectric or semiconductor substrate according to at least one configuration described herein. The circuit elements can be formed separately according to any applicable integrated circuitry fabrication process. The circuit elements can be formed using any conductive material, including copper, tantalum, tin, gold, tungsten, titanium, tungsten, titanium nitride, titanium tungsten, nickel, cobalt, chromium, silver, aluminum, or any combination of two or more of these conductive materials.

An image sensor herein, whether formed as a front-illuminated image sensor or the back-illuminated image sensor, can be configured as an array of individual sensor elements, each of which includes a substrate, at least one detector element, and circuit elements.

Figure 19:
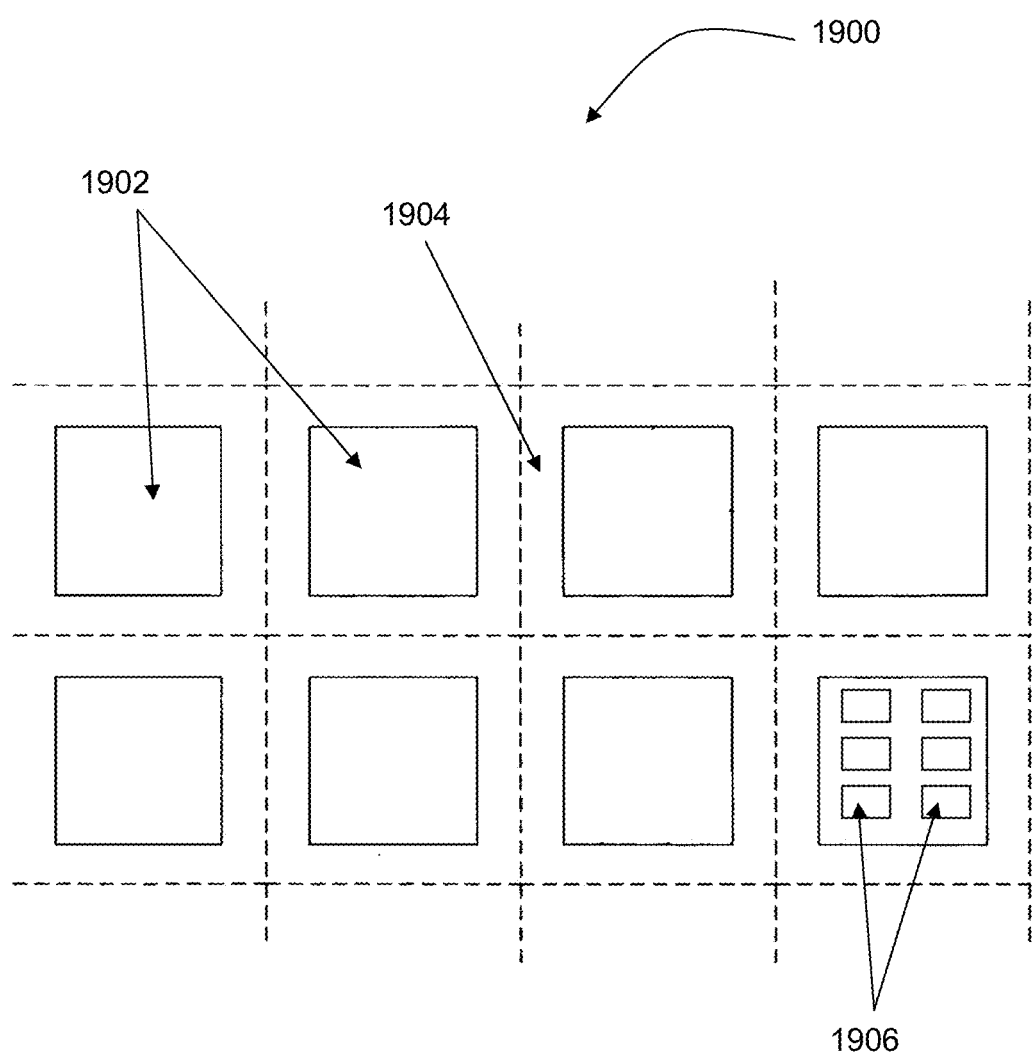
FIG. 19 shows example arrays of sensor elements formed as pixels, according to principles of the present disclosure.

An image sensor herein can include one or more arrays of sensor elements. For example, as shown in FIG. 19, an image sensor can be formed from one or more sensor regions 1900, each sensor region including an array of sensor elements 1902. Each sensor element 1902 can include one or more detector elements, or a plurality of detector elements. FIG. 19 shows a non-limiting example of an arrangement of detector elements 1906 that are included in a sensor element. The image sensor may also include regions 1904 that do not include sensor elements. In an example implementation, sensor elements 1902 can be formed as pixels of an image sensor.

Figure 20:
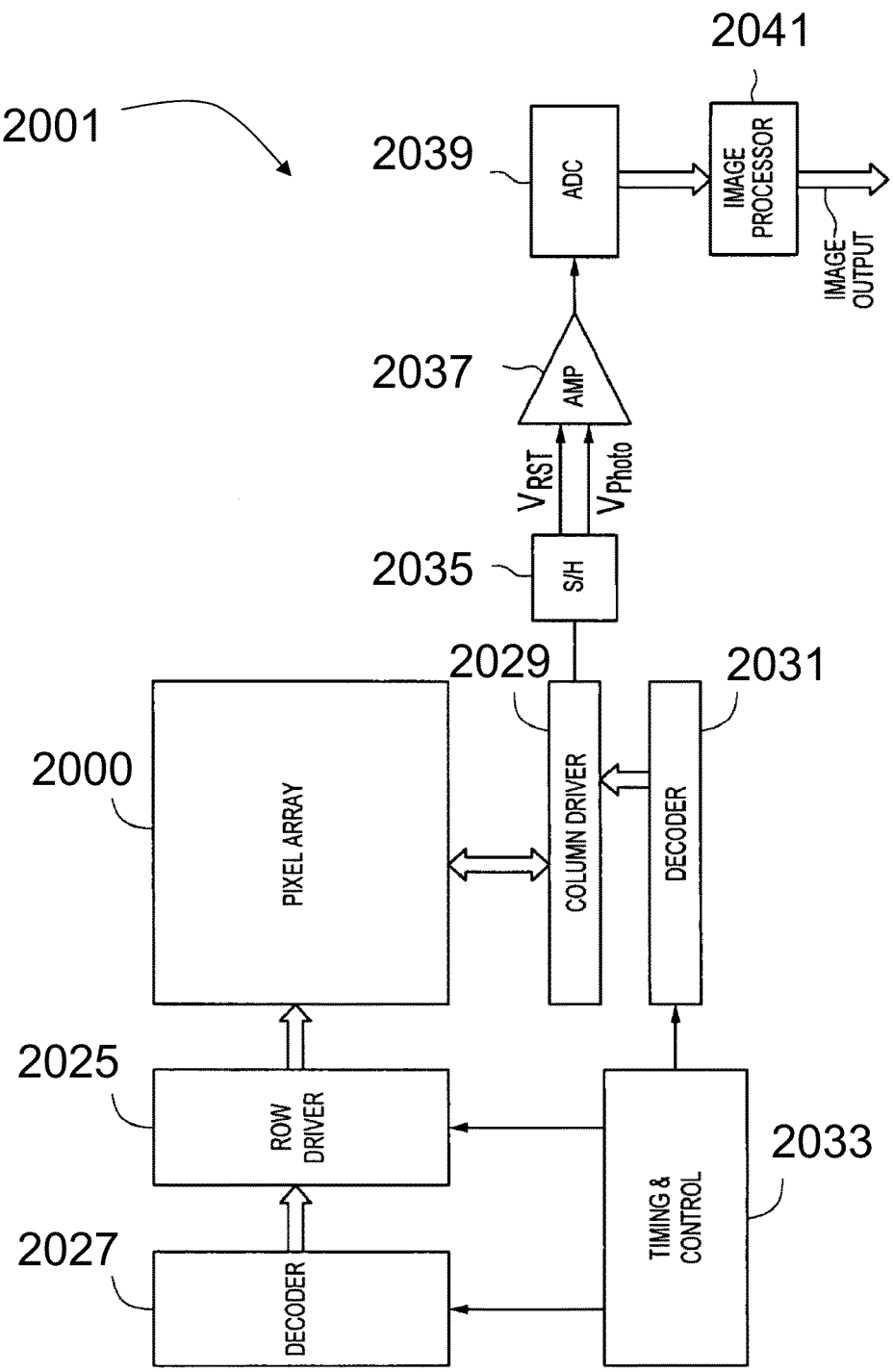
FIG. 20 shows a block diagram of an example CMOS image sensor that includes a pixel array, according to principles of the present disclosure.

FIG. 20 is a block diagram showing the components of a non-limiting example of an image sensor. The image sensor is a complementary metal-oxide-semiconductor (CMOS) image sensor 2001 that includes a pixel array 2000. The pixel array 2000 can be formed from an array of any of the image sensors described herein. In an example, the pixel array 2000 is formed with pixel cells arranged in a predetermined number of columns and rows, where a pixel cell includes a sensor element according to any of the examples herein. The pixel array 2000 can be used to capture incident radiation from an optical image and convert the captured radiation to electrical signals, such as analog signals.

The electrical signals obtained and generated by the pixel cells in the pixel array 2000 can be read out, row by row, to provide image data of the captured optical image. For example, pixel cells in a row of the pixel array 2000 are all selected for read-out at the same time by a row select line, and each pixel cell in a selected column of the row provides a signal representative of received light to a column output line. That is, each column also has a select line, and the pixel cells of each column are selectively read out onto output lines in response to the column select lines. The row select lines in the pixel array 2000 are selectively activated by a row driver 2025 in response to a row address decoder 2027. The column select lines are selectively activated by a column driver 2029 in response to a column address decoder 2031.

The image sensor 2001 can also include a timing and controlling circuit 2033 that generates one or more read-out control signals to control the operation of the various components in the image sensor 2001. For example, the timing and controlling circuit 2033 can control the address decoders 2027 and 2031 in any of various conventional ways to select the appropriate row and column lines for pixel signal read-out.

The electrical signals output from the column output lines typically include a pixel reset signal ($V_{RST}$) and a pixel image signal ($V_{Photo}$) for each image pixel cell in a CMOS image sensor. In an example of an image pixel array 2000 containing four-transistor CMOS image pixel cell, the pixel reset signal ($V_{RST}$) can be obtained from a floating diffusion region when it is reset by a reset signal RST applied to a corresponding reset transistor, while the pixel image signal ($V_{Photo}$) is obtained from the floating diffusion region when photo-generated charge is transferred to the floating diffusion region. Both the $V_{RST}$ and $V_{Photo}$ signals can be read into a sample and hold circuit (S/H) 2035. Although the image sensor 2001 illustrated is a CMOS image sensor, other types of solid state image sensors, pixel arrays, and readout circuitries may also be used.

Figure 21:
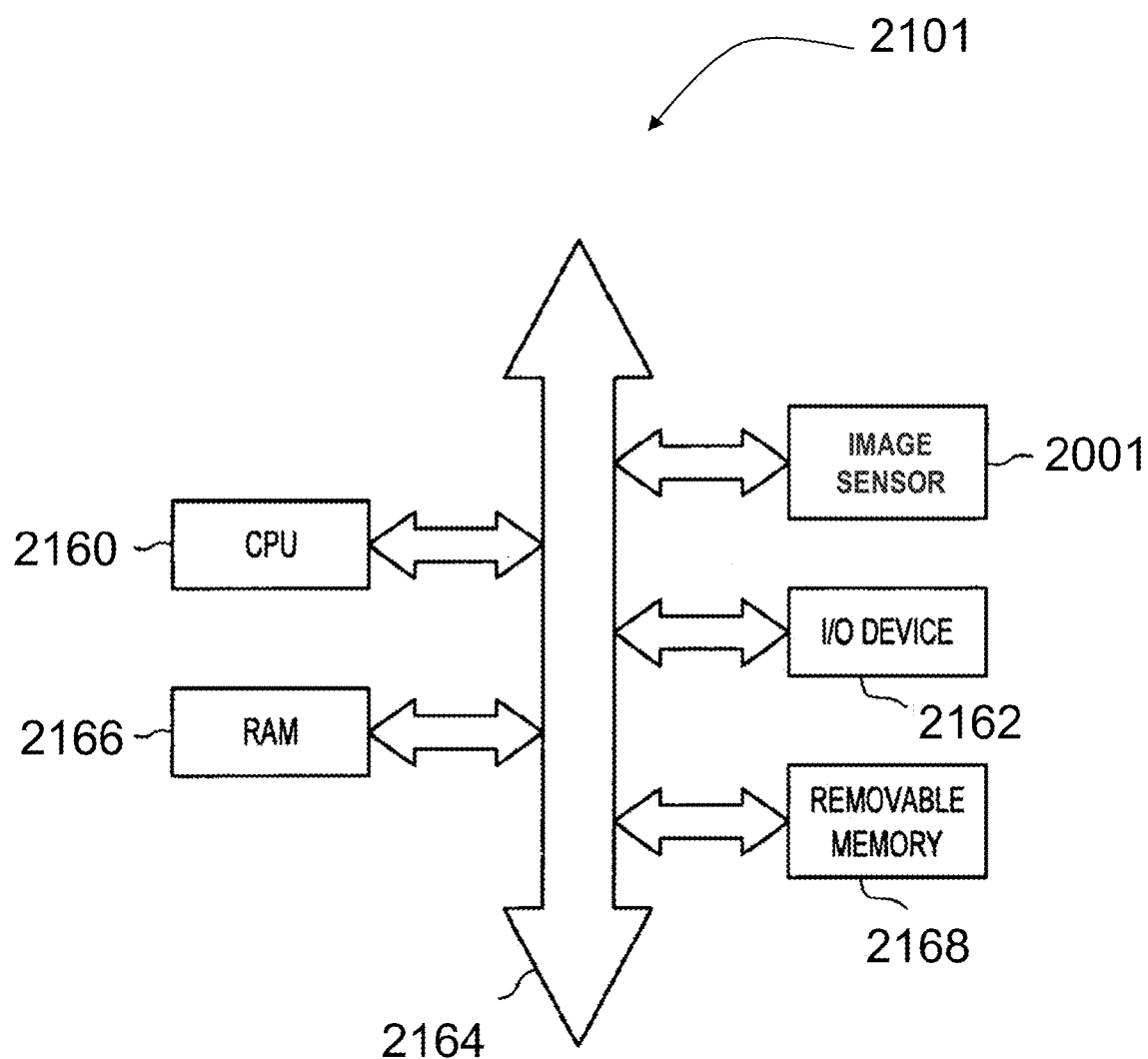
FIG. 21 shows an example processing system that includes an image sensor, according to principles of the present disclosure.

FIG. 21 illustrates an example processing system 2101 that includes an image sensor 2001. The image sensor 2001 may be combined with a processor, such as a CPU, digital signal processor, or microprocessor, with or without memory storage, on a single integrated circuit or on a different chip than the processor. In the example shown in FIG. 21, the processing system 2101 includes a central processing unit (CPU) 2160, such as a microprocessor, that communicates with an input/output (I/O) device 2162 over a bus 2164. The processing system 2101 also can include random access memory (RAM) 2166 and/or removable memory 2168, such as but not limited to flash memory, which can communicate with CPU 2160 over the bus 2164.

The processing system 2101 can be any of various systems having digital circuits that could include the image sensor 2001. As a non-limiting example, processing system 2101 could include a computer system. In the example shown in FIG. 21, the processing system 2101 can be included in a camera 2101. Incident electromagnetic radiation (e.g., that enters through the camera) impinges on and resonates with one or more detector elements of the pixel array 2000 (see FIG. 20). The generated charge carriers can be detected according to any example described herein.

While the example of FIGS. 20 and 21 are described with reference to a CMOS image sensor, the detector elements and sensor elements according to principles herein can be implemented in other solid state image sensor technology, including charge-coupled device (CCD) technology or hybrid CCD/CMOS technology. In an example, the image sensors herein are CCD image sensors.

CCD image sensor devices can differ from CMOS sensor devices in where the timing and controlling circuitry as located relative to the sensor elements and the detector elements. As described above, a CMOS image sensor includes an active pixel array with timing and controlling circuitry coupled with some or all of the sensor elements. The CMOS image sensor device can include other circuitry for converting measured change in conductivity (as described above) to digital information. Also, a CMOS image sensor device can be cheaper to manufacture, can be implemented with fewer components, use less power, and/or provide faster read-out than a CCD image sensor device.

In an example CCD image sensor, the timing and controlling circuitry may not be located on the same substrate as the sensor elements or the detector elements but rather can be located elsewhere in the imaging sensor device. The measures of the changes in conductivity (as described above) can be sampled one pixel at a time as they are read-out from the pixel array. The CMOS image sensor device can include other circuitry for converting measured change in conductivity (as described above) to digital information. A CCD image sensor can give essentially the same quality performance as a CMOS image sensor device and is a more mature technology.

In another example, the detector elements and sensor elements according to principles herein can be implemented in hybrid CCD/CMOS technology. Such hybrid CCD/CMOS technology is expected to exhibit the benefits of both CCD image sensors and CMOS image sensors. A hybrid CCD/CMOS image sensor can be formed from CMOS readout integrated circuitry (ROIC) that is registered with and bump bonded to CCD image sensor substrates. In this example, the CCD image sensors and ROIC are fabricated separately and later combined. That is, the sensor elements can be fabricated by bonding circuit elements above the detector elements or the sensor elements to provide the hybrid CCD/CMOS image sensor configuration. In an example, the bonding can be facilitated using metallic interconnects that couple each of a number of circuit elements to each of a corresponding number of detector elements or sensor elements. Non-limiting examples of bonding agent include an oxide of silicon, such as spin-on glass, and polymers, such as parylene, polyimides, benzocyclobutene, photo-resists, and polymethylsiloxane. In another example, the hybrid CCD/CMOS technology can be formed using CMOS fabrication techniques. That is, the CMOS fabrication techniques are utilized to fabricate CCD-like image sensors, with sensor element and circuitry configurations having the finer dimensions achievable with CMOS technology.

Other Applications Including Detector Elements and Sensor Elements

The sensor elements and detector elements that include metamaterial structures according to the principles described hereinabove are applicable in various other applications.

In an example, a device or system that includes at least one sensor element or detector element according to principles described herein can be implemented as an active component or as a passive component. In an example, the detector elements according to principles herein are implemented as a passive component of a device or a system. That is, in resonating with the target electromagnetic radiation, the detector elements exhibit a change in conductivity, i.e., a voltage or current. In another example, the detector elements according to principles herein can be used in a system that includes an active component, such as but not limited to a transistor or tunnel diode. For example, the system can be configured so that the charge carriers generated at or near the spacing in the resonator structure can be injected or otherwise coupled to the active component. The injected or coupled charge carriers can be detected or otherwise quantified based on its effects in changing an operation parameter of the active component. The change in operation parameter of the active component can be used to provide an indication of the presence of the target electromagnetic radiation, or otherwise quantify a property of the target electromagnetic radiation (including magnitude, spatial profile, polarization, etc.) For example, a metamaterial structure according to the principles herein can be implemented in ultra-fast THz or GHz transistors.

In another example, a device or system that includes at least one sensor element or detector element according to principles described herein can be implemented as an emitter. of electromagnetic radiation in the gigahertz or terahertz frequency range. Such an emitter may operate similarly to an Auston switch or other photo-conductive antenna. In an example operation of such a device or system, electromagnetic radiation is emitted from accelerated carriers in a semiconductor substrate, such as but not limited to silicon (Si), gallium arsenide (GaAs) or indium gallium arsenide (InGaAs). Charge carriers (electrons and holes) can be generated at the surface of the semiconductor by femtosecond laser pulses with photon energies above the bandgap energy of the semiconductor substrate. An external bias could be applied to electrodes coupled to the metamaterial structures to separate the charge carriers at the spacings. The higher mobility electrons can be accelerated to contribute to the electromagnetic emission (e.g., at terahertz frequencies) in a forward and backward direction away from the plane of metamaterials.

In another example, a device or system that includes at least one sensor element or detector element according to principles described herein can be implemented in detectors that are tuned to detect specific compounds or spectroscopic signatures. For example, a device or system that includes at least one sensor element or detector element according to principles described herein can be implemented to provide information about the composition of a potentially hazardous compound. Non-limiting examples of such compounds include explosives, chemical agents, or biological agents. An example a device or system including at least one sensor element or detector element according to principles described herein can be implemented to detect specific spectroscopic signatures of biological molecules of interest, including biological agents or pathogens. In non-limiting examples, such spectroscopic signatures can be due to physical processes, including atomic and molecular transitions and dynamics of the biological molecules. In a non-limiting example, the device or system that includes at least one sensor element or detector element according to principles described herein can be to scan shipping containers, storage containers, trucking compartments, etc, that are made of non-conductive materials or sufficiently low conductivity materials.

Other non-limiting example applications of an apparatus, detector, image sensor, or other device or system described herein include in security, military, and industrial applications, academic research, and laser science. Imaging using a system or apparatus described herein can been incorporated into security applications and industrial process control. The systems and apparatus described herein can be implemented in spectroscopic applications and military uses as well. Additional possible applications of the systems and apparatus described herein include ultrafast electro-optic switching driven by an electromagnetic field in the gigahertz and/or terahertz frequency ranges.

In another non-limiting example, an apparatus, detector, image sensor, device or system described herein can be made low-cost and/or disposable.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single computer or distributed among multiple computers.

In this respect, various aspects of the invention may be embodied at least in part as a computer readable storage medium (or multiple computer readable storage media) (e.g., a computer memory, one or more floppy disks, compact disks, optical disks, magnetic tapes, flash memories, circuit configurations in Field Programmable Gate Arrays or other semiconductor devices, or other tangible computer storage medium or non-transitory medium) encoded with one or more programs that, when executed on one or more computers or other processors, perform methods that implement the various embodiments of the technology discussed above. The computer readable medium or media can be transportable, such that the program or programs stored thereon can be loaded onto one or more different computers or other processors to implement various aspects of the present technology as discussed above.

The terms "program" or "software" are used herein in a generic sense to refer to any type of computer code or set of computer-executable instructions that can be employed to program a computer or other processor to implement various aspects of the present technology as discussed above. Additionally, it should be appreciated that according to one aspect of this embodiment, one or more computer programs that when executed perform methods of the present technology need not reside on a single computer or processor, but may be distributed in a modular fashion amongst a number of different computers or processors to implement various aspects of the present technology.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding,"

"composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An apparatus for detecting target electromagnetic radiation within a target frequency range, the apparatus comprising: a substrate comprising a dielectric material or a semiconductor material; and one or more resonator structures disposed on the substrate, each of the resonator structures comprising at least two conductive structures separated by a spacing; wherein the apparatus is configured such that charge carriers are generated in a region of the substrate near the spacing based on an enhanced electric field induced in the spacing by a resonant response of one or more of the resonator structures to a presence of the target electromagnetic radiation; wherein the apparatus is configured to measure a conductivity based on the generated charge carriers; wherein the measure of the conductivity provides an indication of a magnitude, a polarization, or a spatial profile of the target electromagnetic radiation; and wherein the target frequency range is from about 100 GHz to about 100 THz.

2. The apparatus of claim 1, wherein each of the one or more resonator structures comprises a first conductive structure and a second conductive structure separated by the spacing, and wherein a portion of the first conductive structure and a portion of the second conductive structure near the spacing are parallel to each other.

3. The apparatus of claim 1, wherein each of the one or more resonator structures is formed as a split-ring resonator structure, and wherein each split-ring resonator structure includes at least two spacings formed between corresponding pairs of the at least two conductive structures.

4. The apparatus of claim 1, wherein the one or more resonator structures are arranged in an alternating interdigitated arrangement such that a portion of a first resonator structure of the one or more resonator structures is disposed within a spacing of, and not in physical contact with, a second resonator structure of the one or more resonator structures; and
wherein the portion of the first resonator structure is oriented in a direction parallel to a side of the second resonator structure neighboring the spacing.

5. The apparatus of claim 1, wherein the one or more resonator structures are configured such that the apparatus detects target electromagnetic radiation of different polarizations.

6. The apparatus of claim 1, wherein the one or more resonator structures each comprises a first conductive structure and a second conductive structure disposed on the substrate;
wherein a surface of the substrate comprising the first conductive structure and a second conductive structure lies in an y-z plane;
wherein the first conductive structure and the second conductive structure are aligned in a longitudinal antenna arrangement along a z-direction of the substrate; and
wherein the spacing separates an end of the first conductive structure from an end of the second conductive structure in the z-direction.

7. The apparatus of claim 1, wherein a width of the spacing can be about 1.0 microns, about 1.5 microns, about 2.0 microns, or about 2.5 microns.

8. The apparatus of claim 1, wherein the resonator structure has a lateral dimension ranging from about 3.0 µm to about 3.0 mm.

9. The apparatus of claim 1, wherein the conductive structure comprises a metal or a conductive metal oxide.

10. The apparatus of claim 1, wherein the conductive structure comprises gold, platinum, copper, tantalum, tin, tungsten, titanium, tungsten, cobalt, chromium, silver, nickel or aluminum, or any combination thereof.

11. The apparatus of claim 1, wherein the substrate comprises a dielectric material, and wherein the dielectric material comprises silicon, germanium, or a transition metal.

12. The apparatus of claim 1, wherein the substrate comprises a semiconductor material, and wherein the semiconductor material comprises silicon, germanium, or a III-V semiconductor.

13. The apparatus of claim 1, wherein the measure of the conductivity provides an indication of the presence of the target electromagnetic radiation if the measure of the conductivity exceeds a pre-determined threshold value.

14. The apparatus of claim 1, wherein the measure of the conductivity provides an indication of a magnitude, a polarization, or a spatial profile of the target electromagnetic radiation.

15. An image sensor comprising a plurality of apparatus for detecting target electromagnetic radiation within a target frequency range, each apparatus of the plurality of apparatus comprising:
a substrate comprising a dielectric material or a semiconductor material; and
one or more resonator structures disposed on the substrate, each of the resonator structures comprising at least two conductive structures separated by a spacing;
wherein each apparatus is configured such that charge carriers are generated in a region of the substrate near the spacing based on an enhanced electric field induced in the spacing by a resonant response of one or more of the resonator structures to a presence of the target electromagnetic radiation;
wherein each apparatus is configured to measure a conductivity based on the generated charge carriers;
wherein the measure of the conductivity provides an indication of the presence of the target electromagnetic radiation;
wherein the conductive structures are disposed on a first surface of the substrate;
wherein the substrate comprises a charge separation region;
wherein each apparatus is illuminated by the target electromagnetic radiation at a second surface of the substrate opposite to the first surface;
wherein the charge carriers generated are electron-hole pairs; and
wherein a thickness of the substrate is configured such that the electron-hole pairs formed in the charge separation region when the image sensor is illuminated by the target electromagnetic radiation are measured to provide the indication of the presence of the target electromagnetic radiation.

16. An array comprising a plurality of sensor elements for detecting target electromagnetic radiation within a target frequency range, each sensor element comprising:
a substrate comprising a dielectric material or a semiconductor material; and
one or more resonator structures disposed on the substrate, each of the resonator structures comprising at least two conductive structures separated by a spacing;

wherein the refractive index of the substrate of at least one of the sensor elements of the array differs from the refractive index of the substrate of other sensor elements of the array;

wherein the apparatus is configured such that charge carriers are generated in a region of the substrate near the spacing based on an enhanced electric field induced in the spacing by a resonant response of one or more of the resonator structures to a presence of the target electromagnetic radiation;

wherein the apparatus is configured to measure a conductivity based on the generated charge carriers; and wherein the measure of the conductivity provides an indication of the presence of the target electromagnetic radiation.

17. The array of claim 16, wherein each of the one or more resonator structures has at least one dimension that is less than a wavelength of the target electromagnetic radiation.

18. The array of claim 16, wherein each of the one or more resonator structures has at least one dimension that is greater than or approximately equal to a wavelength of the target electromagnetic radiation.

19. An array comprising a plurality of sensor elements for detecting target electromagnetic radiation within a target frequency range, each sensor element comprising:

a substrate comprising a dielectric material or a semiconductor material; and one or more resonator structures disposed on the substrate, each of the resonator structures comprising at least two conductive structures separated by a spacing;

wherein dimensions of the one or more resonator structures of at least one of the sensor elements of the array differs from the dimensions of the one or more resonator structures of other sensor elements of the array;

wherein the apparatus is configured such that charge carriers are generated in a region of the substrate near the spacing based on an enhanced electric field induced in the spacing by a resonant response of one or more of the resonator structures to a presence of the target electromagnetic radiation;

wherein the apparatus is configured to measure a conductivity based on the generated charge carriers; and wherein the measure of the conductivity provides an indication of the presence of the target electromagnetic radiation.

20. The array of claim 19, wherein each of the one or more resonator structures has at least one dimension that is less than a wavelength of the target electromagnetic radiation.

21. The array of claim 19, wherein each of the one or more resonator structures has at least one dimension that is greater than or approximately equal to a wavelength of the target electromagnetic radiation.

* * * * *

UNITED STATES PATENT AND TRADEMARK OFFICE
CERTIFICATE OF CORRECTION

PATENT NO. : 9,000,376 B2  
APPLICATION NO. : 13/933557  
DATED : April 7, 2015  
INVENTOR(S) : Harold Y. Hwang et al.

Page 1 of 1

It is certified that error appears in the above-identified patent and that said Letters Patent is hereby corrected as shown below:

In the Specification

In Column 1, Lines 16-19: please replace

"This invention was made with government support under contract no. N00014-09-I-1103 awarded by the Office of Naval Research (ONR). The government has certain rights in the invention."

with

--This invention was made with government support under Grant No. N00014-09-1-1103 awarded by Office of Naval Research and under Grant No. DE-SC0002384 awarded by the U.S. Department of Energy. The government has certain rights in the invention.--

Signed and Sealed this
Fourteenth Day of July, 2015

Michelle K. Lee
*Director of the United States Patent and Trademark Office*